United States Patent [19]
Michel et al.

[11] Patent Number: 5,032,472
[45] Date of Patent: Jul. 16, 1991

[54] FILMS OF CATENATED PHOSPHORUS MATERIALS, THEIR PREPARATION AND USE, AND SEMICONDUCTOR AND OTHER DEVICES EMPLOYING THEM

[75] Inventors: Christian G. Michel, Ossining; Rozalie Schachter, New York, both of N.Y.; Mark A. Kuck, Upper Montclair, N.J.; John A. Baumann, Dobbs Ferry, N.Y.; Paul M. Raccah, Chicago, Ill.

[73] Assignee: Stauffer Chemical Company, Westport, Conn.

[21] Appl. No.: 322,688

[22] Filed: Mar. 13, 1989

Related U.S. Application Data

[60] Division of Ser. No. 680,367, Dec. 11, 1984, Pat. No. 4,818,636, and a continuation-in-part of Ser. No. 886,587, Jul. 16, 1986, Pat. No. 4,746,500, Ser. No. 796,429, Nov. 8, 1985, Pat. No. 4,732,659, Ser. No. 736,750, May 21, 1985, Pat. No. 4,696,828, Ser. No. 695,255, Jan. 28, 1985, Pat. No. 4,678,266, Ser. No. 695,268, Jan. 28, 1985, abandoned, Ser. No. 619,053, Jun. 11, 1984, Pat. No. 4,558,340, Ser. No. 581,101, Feb. 17, 1984, Pat. No. 4,613,485, Ser. No. 581,102, Feb. 17, 1984, Ser. No. 581,103, Feb. 17, 1984, abandoned, Ser. No. 581,104, Feb. 17, 1984, abandoned, Ser. No. 581,105, Feb. 17, 1984, Pat. No. 4,618,345, Ser. No. 581,115, Feb. 17, 1984, abandoned, Ser. No. 581,139, Feb. 17, 1984, Pat. No. 4,649,024, Ser. No. 581,140, Feb. 17, 1984, abandoned, Ser. No. 581,171, Feb. 17, 1984, abandoned, Ser. No. 509,157, Jun. 29, 1983, abandoned, Ser. No. 509,158, Jun. 29, 1983, Pat. No. 4,591,408, Ser. No. 509,159, Jun. 29, 1983, Pat. No. 4,596,721, Ser. No. 509,175, Jun. 29, 1983, Pat. No. 4,509,066, and Ser. No. 509,210, Jun. 29, 1983, Pat. No. 4,567,503, said Ser. No. 680,367, is a division of Ser. No. 442,208, Nov. 16, 1982, Pat. No. 4,508,931, which is a continuation-in-part of Ser. No. 335,706, Dec. 30, 1981, abandoned, and Ser. No. 419,537, Sep. 17, 1982, Pat. No. 4,620,968, which is a continuation-in-part of Ser. No. 335,706, said Ser. No. 886,587, is a division of Ser. No. 581,101, said Ser. No. 796,429, is a division of Ser. No. 619,053, and a continuation-in-part of Ser. No. 509,175, and Ser. No. 442,208, said Ser. No. 736,750.

[51] Int. Cl.⁵ ............................................. B32B 9/04
[52] U.S. Cl. .................................... 428/704; 428/432; 428/469; 428/472.3; 427/78; 427/109
[58] Field of Search ............ 428/704, 432, 469, 472.3

[56] References Cited

U.S. PATENT DOCUMENTS

| | | | |
|---|---|---|---|
| 4,509,066 | 4/1985 | Schachter et al. | 428/432 |
| 4,567,503 | 1/1986 | Olezo et al. | 357/54 |
| 4,596,721 | 6/1986 | Brock et al. | 427/82 |
| 4,618,345 | 10/1986 | Tuck et al. | 23/293 R |
| 4,649,024 | 3/1987 | Brock et al. | 427/82 |
| 4,696,828 | 9/1987 | Schachter et al. | 427/38 |

*Primary Examiner*—George F. Lesmes
*Assistant Examiner*—Jill M. Gray
*Attorney, Agent, or Firm*—F. Eugene Davis, IV

[57] ABSTRACT

High phosphorus polyphosphides, namely $MP_x$, where M is an alkali metal (Li, Na, K, Rb, and Cs) or metals mimicking the bonding behavior of an alkali metal, and $x = 7$ to 15 or very much greater than 15 (new forms of phosphorus) are useful semiconductors in their crystalline, polycrystalline and amorphous forms (boules and films). $MP_{15}$ appears to have the best properties and $KP_{15}$ is the easier to synthesize. P may include other pnictides as well as other trivalent atomic species. Resistance lowering may be accomplished by doping with Ni, Fe, Cr, and other metals having occupied d or f outer electronic levels; or by incorporation of As and other pnictides. Top contacts forming junction devices doped with Ni and employing Ni as a back contact comprise Cu, Al, Mg, Ni, Au, Ag, and Ti. Photovoltaic, photoresistive, and photoluminescent devices are also disclosed. All semiconductor applications appear feasible.

These semiconductors belong to the class of polymer forming, trivalent atomic species forming homatomic, covalent bonds having a coordination number slightly less than 3. The predominant local order appears to be all parallel pentagonal tubes in all forms, including amorphous, except for the monoclinic and twisted fiber allotropes of phosphorus.

(Abstract continued on next page.)

Large crystal monoclinic phosphorus (a birefringent material) in two habits, a twisted fiber phosphorus allotrope and a star shaped fibrous high phosphorus material are also disclosed.

Single and multiple source vapor transport, condensed phase, melt quench, flash evaporation, chemical vapor deposition, and molecular flow deposition may be employed in synthesizing these materials. Vapor transport may be employed to purify phosphorus.

21 Claims, 26 Drawing Sheets

O = PHOSPHORUS

□ = POTASIUM

O = PHOSPHORUS
□ = POTASIUM

90x

100x

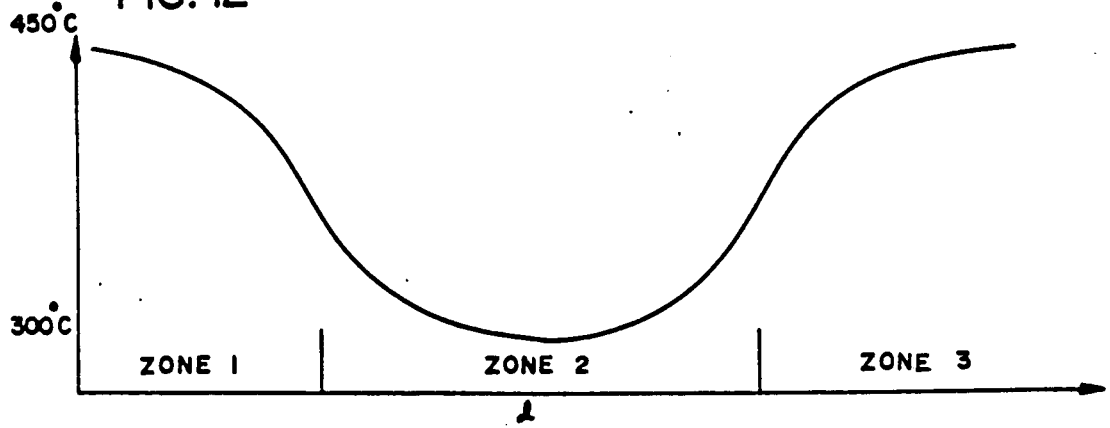
FIG. 13
| | 1 | 2 | 3 | 4 | 5 | 6 | 7 |
|---|---|---|---|---|---|---|---|
| P/K | | 9.3 | 14.2 | 14.1 | 14.0 | 4.3 | 3.8 |
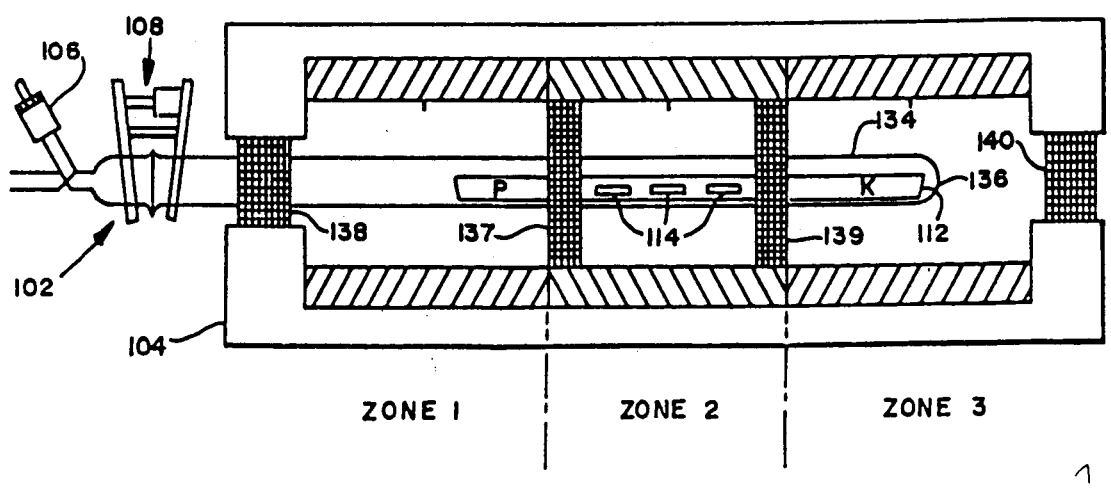

ZONE 1 | ZONE 2 | ZONE 3
P | SUBSTRATES | K

| ZONE 1 | ZONE 2 | ZONE 3 |
| 500° C | 355° C | 700° C |

100x

1000x

5000x

360x

360x

FIG. 23   720x    FIG. 24   360x
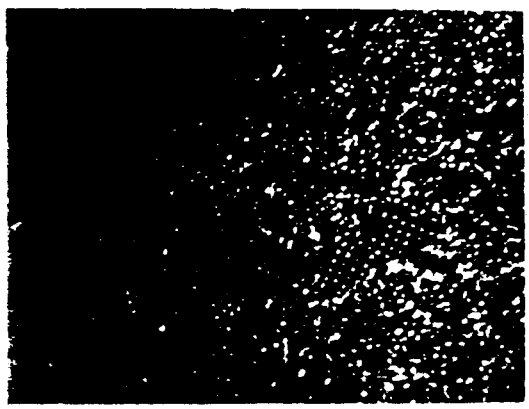
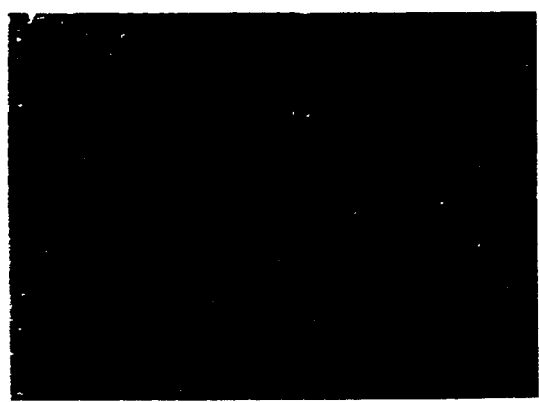
FIG. 25   2000x

200x

1000x

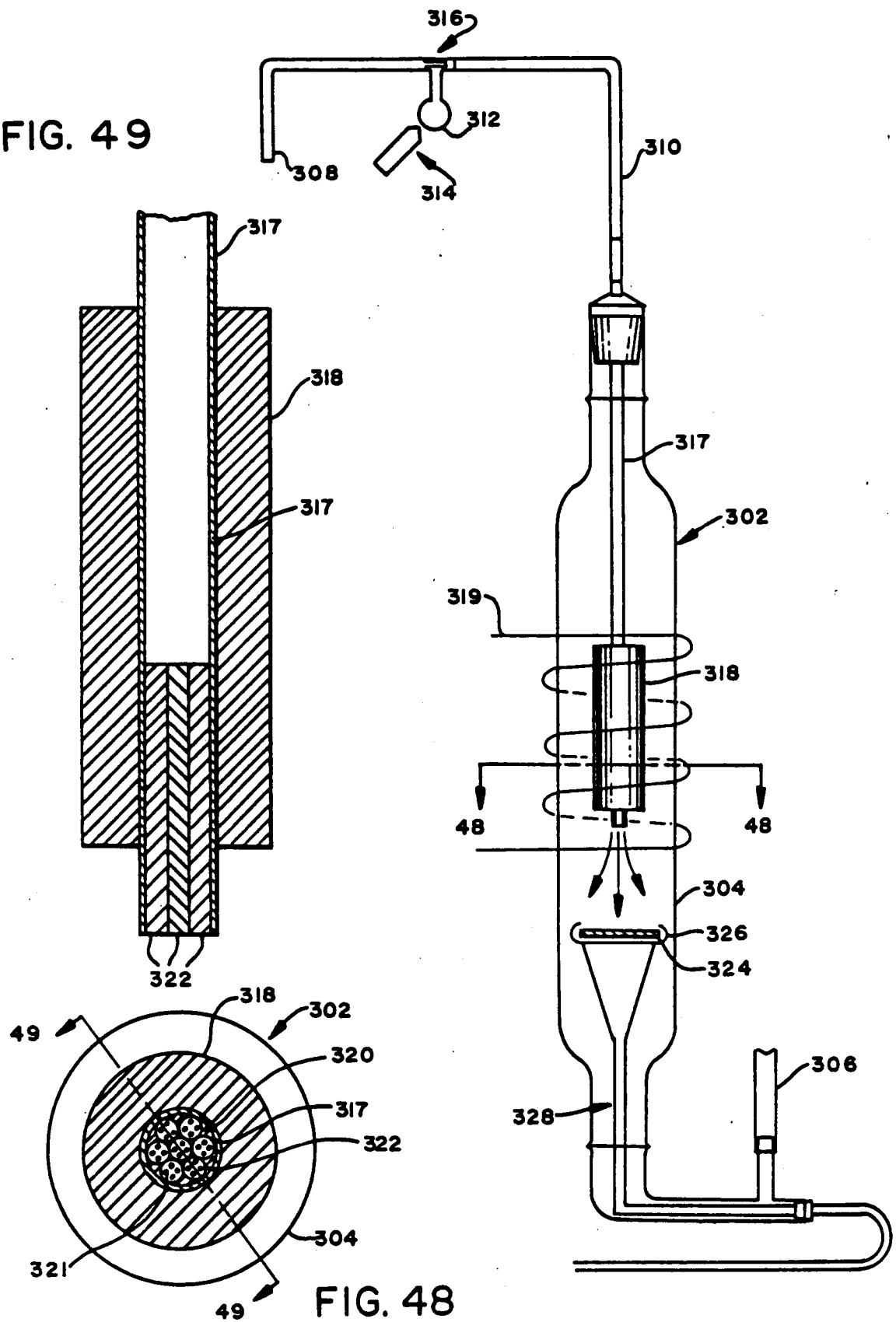

FILMS OF CATENATED PHOSPHORUS MATERIALS, THEIR PREPARATION AND USE, AND SEMICONDUCTOR AND OTHER DEVICES EMPLOYING THEM

RELATED APPLICATIONS

This application is a divisional application of our divisional application Ser. No. 06/680,367, filed Dec. 11, 1984 now U.S. Pat. No. 4,818,636, which was a divisional application of our co-pending U.S. patent application entitled CATENATED PHOSPHORUS MATERIALS, THEIR PREPARATION AND USES, AND SEMICONDUCTOR AND OTHER DEVICES EMPLOYING THEM, Ser. No. 442,208, filed Nov. 16, 1982, now U.S. Pat. No. 4,508,931, Issued Apr. 2, 1985, which was a Continuation-in-Part of our co-pending applications entitled CATENATED SEMICONDUCTOR MATERIALS OF PHOSPHORUS, METHODS AND APPARATUS FOR PREPARING AND DEVICES USING THEM, Ser. No. 335,706, filed Dec. 30, 1981, now abandoned; and MONOCLINIC PHOSPHORUS FORMED FROM VAPOR IN THE PRESENCE OF AN ALKALI METAL, Ser. No. 419,537, filed Sept. 17, 1982, now U.S. Pat. No. 4,620,968, Issued Nov. 4, 1986 which was a Continuation-in-Part of Ser. No. 335,706. These applications are incorporated herein by reference.

This application is also related to and is a Continuation-in-Part of the following co-pending applications, assigned to the same assignee as this application. These applications are incorporated herein by reference. VACUUM EVAPORATED FILMS OF CATENATED PHOSPHORUS MATERIAL, Ser. No. 509,159, filed June 29, 1983, now U.S. Pat. No. 4,596,721, Issued June 24, 1986; GRAPHITE INTERCALATED ALKALI METAL VAPOR SOURCES, Ser. No. 409,157, filed June 29, 1983, now abandoned; SPUTTERED SEMICONDUCTING FILMS OF CATENATED PHOSPHORUS MATERIAL AND DEVICES FORMED THEREFROM, Ser. No. 409,175, filed June 29, 1983, now U.S. Pat. No. 4,509,066, Issued Apr. 2, 1985; MIS DEVICES EMPLOYING ELEMENTAL PNICTIDE OR POLYPHOSPHIDE INSULATING LAYERS, Ser. No. 509,210, filed June 29, 1983, now U.S. Pat. No. 4,567,503, Issued Jan. 28, 1986; LIQUID PHASE GROWTH OF CRYSTALLINE POLYPHOSPHIDE, Ser. No. 509,158, filed June 29, 1983, now U.S. Pat. No. 4,591,408, Issued May 27, 1986; THERMAL CRACKERS FOR FORMING PNICTIDE FILMS IN HIGH VACUUM PROCESSES, Ser. No. 481,139, filed Feb. 17, 1984, now U.S. Pat. No. 4,649,024, Issued Mar. 10, 1987, which was a Continuation-in-Part of Ser. No. 509,159, filed June 29, 1983, now U.S. Pat. No. 4,596,721, Issued June 24, 1986; PASSIVATION AND INSULATION OF III-V DEVICES WITH PNICTIDES, PARTICULARLY AMORPHOUS PNICTIDES HAVING A LAYER-LIKE STRUCTURE, Ser. No. 581,115, filed Feb. 17, 1984, abandoned in favor of Ser. No. 896,293, filed Aug. 13, 1986; PASSIVATION OF InP BY PLASMA DEPOSITED PHOSPHORUS AND EFFECTS OF SURFACE TREATMENT THEREON, Ser. No. 736,750, filed May 21, 1985, now U.S. Pat. No. 4,696,828, Issued Sept. 29, 1987, (which was a Continuation-In-Part application of Ser. No. 581,115, filed Feb. 17, 1984, now abandoned); THIN FILM FIELD EFFECT TRANSISTORS UTILIZING A POLYPNICTIDE SEMICONDUCTOR, Ser. No. 619,053, filed June 11, 1984, now U.S. Pat. No. 4,558,340, Issued Dec. 10, 1985; THIN FILM FIELD EFFECT TRANSISTORS UTILIZING A POLYPNICTIDE SEMICONDUCTOR, Ser. No. 796,429, filed Nov. 8, 1985, now U.S. Pat. No. 4,732,659, Issued Mar. 22, 1988, (which was a Division of Ser. No. 619,053, filed June 11, 1984, now U.S. Pat. No. 4,558,340, Issued Dec. 10, 1985, Continuation-in-Part of Ser. No. 509,175, filed June 29, 1983, now U.S. Pat. No. 4,509,006, Issued Apr. 2, 1985, and a Continuation-in-Part of Ser. No. 442,208, filed Nov. 16, 1982, now U.S. Pat. No. 4,508,931, Issued Apr. 2, 1985); PNICTIDE BARRIERS IN QUANTUM WELL DEVICES, Ser. No. 581,140, filed Feb. 17, 1984, now abandoned; PHOSPHORUS AND HIGH PHOSPHORUS POLYPHOSPHIDE BARRIERS IN QUANTUM WELL DEVICES, Ser. No. 695,268, filed Jan. 28, 1985, now abandoned; USE OF PNICTIDE FILMS FOR WAVE-GUIDING IN OPTO-ELECTRONIC DEVICES, Ser. No. 581,171, filed Feb. 17, 1984, now abandoned; USE OF PNICTIDE FILMS FOR WAVE-GUIDING IN OPTO-ELECTRONIC DEVICES, Ser. No. 695,255, filed Jan. 28, 1985, now U.S. Pat. No. 4,678,266, Issued July 7, 1987, (which was a Continuation-In-Part application of Ser. No. 581,171, filed Feb. 17, 1984, now abandoned); VACUUM DEPOSITION PROCESSES EMPLOYING A CONTINUOUS PNICTIDE DELIVERY SYSTEM, PARTICULARLY SPUTTERING, Ser. No. 581,103, filed Feb. 17, 1984, abandoned in favor of Ser. No. 834,135, filed Feb. 24, 1986, now U.S. Pat. No. 4,761,300, Issued Aug. 2, 1988; CONTINUOUS PNICTIDE SOURCE AND DELIVERY SYSTEM FOR FILM DEPOSITION, PARTICULARLY BY CHEMICAL VAPOR DEPOSITION, Ser. No. 581,102, filed Feb. 17, 1984; METHOD OF PREPARING HIGH PURITY WHITE PHOSPHORUS, Ser. No. 581,105, filed Feb. 17, 1984, now U.S. Pat. No. 4,618,345, Issued Oct. 21, 1986; PNICTIDE TRAP FOR VACUUM SYSTEMS, Ser. No. 581,101, filed Feb. 17, 1984, now U.S. Pat. No. 4,613,485, Issued Sept. 23, 1986; PNICTIDE TRAP FOR VACUUM SYSTEMS, Ser. No. 886,567, filed July 16, 1986, U.S. Pat. No. 4,746,500, Issued May 24, 1988, (which was a Divisional application of Ser. No. 581,101, filed Feb. 17, 1984, now U.S. Pat. No. 4,613,485); HIGH VACUUM DEPOSITION PROCESSES EMPLOYING A CONTINUOUS PNICTIDE DELIVERY SYSTEM, Ser. No. 581,104, filed Feb. 17, 1984, abandoned in favor of Ser. No. 845,475, filed Mar. 27, 1986, now abandoned.

The materials may be employed as protective coatings, optical coatings, fire retardants, fillers and reinforcing fillers for plastics and glasses, antireflection coatings for infrared optics, infrared transmitting windows, and optical rotators.

TECHNICAL FIELD

This invention relates to films of catenated phosphorus materials, their preparation and use, and to semiconductor and other devices employing them. These materials include high phosphorus polyphosphides (i.e., phosphides where the polymeric nature is maintained), alkali metal polyphosphides, monoclinic phosphorus and new forms of phosphorus. Vapor transport is employed in making the crystalline, polycrystalline and amorphous phosphorus and polyphosphide materials in bulk, thick and thin films. Flash evaporation and chemical vapor deposition are used to make thin films. A condensed phase technique is utilized in producing crystalline and polycrystalline polyphosphides. Diffusion doping is employed to raise the conductivity of these materials. Rectifying junctions are formed on the materials by appropriate metal contacts. The film materials may be used as optical coatings. Powdered crystals and amorphous materials may be used as fire retardant fillers. The crystalline materials, especially the fiberous forms, may be employed as the high tensile components of reinforced plastics.

BACKGROUND ART

During the past several decades, the use of semiconductors has become ever increasingly widespread and important. Silicon based semiconductors, for example, have generally been successful in providing a variety of useful devices, such as p-n junction rectifiers (diodes), transistors, silicon control rectifiers (SCR's), photovoltaic cells, light sensitive diodes, and the like. However, due to the high cost of producing crystalline silicon and the ever-increasing demand for semiconductors over a broadening range of applications, there has been a need to widen correspondingly the scope of available useful semiconductor materials.

Useful semiconductors of the present invention, have an energy band gap in the range of about 1 to 3 eV (more specifically 1.4 to 2.2 eV); a photoconductive ratio greater than 5, (more specifically between 100 and 10,000); a conductivity between about $10^{-5}$ and $10^{-12}$ (ohm-cm)$^{-1}$ (more specifically conductivity in the range of $10^{-8}$ to $10^{-9}$ (ohm-cm)); and chemical and physical stability under ambient operating conditions. Accordingly, while many materials may be semiconducting in the sense they are not pure metals or pure insulators, only those semiconducting materials which meet these criteria may be considered to be useful semiconductors in the context of this invention.

Given the present need to develop alternative nonpetroleum based energy sources, the potential commercial utility of a semiconductor increases dramatically when the semiconductor also exhibits an effective photovoltaic characteristic, that is, the ability to economically and efficiently convert solar energy into electrical potential.

From an economic standpoint, amorphous semiconductors, particularly in the form of thin films, are more desirable than single crystalline forms due to potential lower cost of production. Amorphous semiconductors also have better electrical qualities than polycrystalline forms of the same material as used in many semiconductor devices.

The semiconductor industry has continued its search for useful new semiconductor materials beyond crystalline silicon, and the like.

In the non-silicon crystalline area, single crystals of semiconducting compounds, including GaAs, GaP, and InP, are in commercial use.

Many other semiconductor materials have been utilized for specialized purposes. For example, CdS and selenium are utilized as the photoconductor in many xerographic machines.

In this application semiconductor device means a device including a semiconductor material whether the device employs electrical contacts, that is, is an electronic device, or whether it is a non-electronic device, such as the photoconductors employed in xerography, phosphorescent materials, the phosphorus in a cathode ray tube, or the like.

Although some of the known forms of phosphorus have been stated to have semiconducting properties, many are unstable, highly oxidizable and reactive, and no known form of phosphorus has been successfully employed as a useful semiconductor.

The group 3-5 materials such as gallium phosphide and indium phosphide are tetrahedrally bonded and thus, as will be pointed out below, are clearly distinguished from the compounds disclosed herein. Furthermore, their semiconducting properties are not dominated by phosphorus-to-phosphorus bonding, i.e. the primary conduction paths are not the phosphorus-to-phosphorus bonds.

Others have disclosed hydrogenated phosphorus having a structure similar to black phosphorus and having semiconducting properties.

Considerable work on high phosphorus polyphosphides has been done by a group headed by H. G. von Schnering. The various reports from this group indicate that the highest phosphorus containing polyphosphide compound they have produced is crystalline $MP_{15}$ (M=group 1a metal). These polyphosphides are produced by heating a mixture of metal and phosphorus in a sealed ampule. Von Schnering reports that based on their structure polyphosphides are classified as valence compounds in a classical sense, and that this means that these compounds are, or should be, insulators or semiconductors, i.e not metals.

Monoclinic phosphorus, also called Hittorf's phosphorus, is prepared according to the prior art from white phosphorus and lead as follows: 1 g of white phosphorus and 30 g of lead are heated slowly to a melt in a sealed tube to 630° C. and held for a short time at that temperature. The solution is then cooled at the rate of 10° per day for 11 days to 520° C., and cooled rapidly to room temperature thereafter. It is next electrolyzed in a solution of 2 kg of lead acetate in 8 liters of 6% acetic acid, and the phosphorus is collected in a watch glass placed under the anode. Nearly square tabular crystals, about $0.2 \times 0.2 \times 0.05$ mm, are obtained in this way.

The structure of this prior art monoclinic phosphorus has been determined by Thurn and Krebs. The crystals comprise two layers of pentagonal tubes of phosphorus with all of the tubes parallel, and then another pair of layers of all pentagonal tube phosphorus, the tubes in the second pair of layers all being parallel, but the tubes in the second pair of layers being perpendicular to the tubes in the first pair of layers. The space group of the crystals has been determined, as well as the bond angles and bond distances. See the summary of the prior art in the section "Phosphorus" from "The Structure of the Elements" by Jerry Donahue, published in 1974.

The electronic properties of Hittorf's phosphorus crystals have not been reported. Because of their small size the electrical properties cannot be readily determined.

The preparation of high purity electronic grade phosphorus according to the prior art is very complex and time consuming, thus electronic grade phosphorus is very expensive.

The prior art also exhibits a need for stable phosphorus compounds for use as fire retardants. Crystalline forms have additional utility as reinforcing additives in plastics, glasses and other materials.

DISCLOSURE OF THE INVENTION

We have discovered a family of alkali metal polyphosphide materials possessing useful semiconductor, optical, and mechanical properties.

Useful Semiconductor Properties

By "polyphosphide" we mean a material dominated by multiple phosphorus-to-phosphorus bonds. By "useful semiconductor" we mean not only that the conductivity is intermediate between insulators and metals, but also the demonstration of a host of useful properties:

Stability
Resilient material structure
Bandgap in a useful range (typically 1 to 2.5 eV)
High inherent resistivity, but with ability to be doped
Good photoconductivity
Efficient luminescence
Ability to form a rectifying junction
Ability to be formed at relatively low temperatures (for semiconductors) by processes amenable to scale-up
Ability to be formed as large area amorphous thin films
Ability to be formed as ductile polymeric fibers The polyphosphides are a unique family of materials possessing all of these features.

Preservation of Utility in Multiple Forms

It is equally significant that the useful properties remain essentially constant over a wide range of chemical compositions and physical forms (crystalline and amorphous).

To our knowledge, polyphosphides are the only useful semiconductors in which desirable single crystal-like properties are preserved in the amorphous form. This is of major technological significance because the amorphous form is at the least more amendable, and often essential, for large scale applications, such as photovoltaic cells, large area displays, and electrostatic copiers.

But up to now, the problem with amorphous semiconductors is that they do not form readily as a stable single phase material. And even when they are forced to, the amorphous form loses some very desirable features of its crystalline counterpart.

The dominant known semiconductor (silicon) has a tetrahedral coordination in its crystalline form. Any attempt to make it amorphous (to make amorphous Si) is known to be accompanied by a breaking of the tetrahedral bonds, leaving "dangling bonds" that destroy useful semiconducting properties. Pure amorphous Si is useless: unstable and crumbly. Attempts to satisfy the dangling bonds with Hydrogen or Fluorine have been only partially successful.

Central Role of Structure

We believe that the preservation of useful properties among the multiple forms of the polyphosphides are a direct result of the structure of the materials which, in turn, is made possible by the unique properties of phosphorus, particularly its ability to form polymers dominated by 3 phosphorus to phosphorus covalent bonds at the vast majority of phosphorus sites.

In the crystalline form, the polyphosphides of the type $MP_{15}$ (with M=Li, Na, K, Rb, Cs) have a structure formed by a phosphorus skeleton consisting of parallel tubes with pentagonal cross section. These phosphorus tubes are linked by P-M-P bridges shown in FIGS. 4, 5 and 6. The building block for this $MP_{15}$ atomic framework can be viewed as $P_8$ (formed by 2 $P_4$ rigid units) and $MP_7$ (formed by the association of $MP_3$ and $P_4$ rigid units).

Using the building blocks or clusters described above, Kosyakov in a review article (Russian Chemical Review, 48(2), 1979) showed theoretically that these polyphosphide compounds could be treated as polymeric materials using their basic building blocks as monomers. Hence, in principle it is possible to construct a large number of atomic frameworks having the same phosphorus skeletons.

In our work, we have synthesized by various techniques described later, $MP_{15}$ crystals and also compositions of the type $[MP_7]_a [P_8]_b$ with b much greater than a. These novel phosphorus rich compounds originally observed as "fibers", "whiskers", or "ribbons" are referred to in this investigation as $MP_x$ with x much greater than 15. These low metal content materials are prepared by vapor transport as thick films (greater than 10 microns) of polycrystalline fibers and large boules (greater than 1 cm$^3$) of amorphous character. The polycrystalline fibers exhibit the same morphology as $KP_{15}$ whiskers.

The structural framework of the first $MP_x$ (x much greater than 15) crystalline materials we discovered is dominated by a phosphorus skeleton similar to the phosphorus framework of the $MP_{15}$ compounds.

We have found that the useful electrical and optical properties of these crystalline materials $MP_{15}$ and $MP_x$ (x much greater than 15) are similar. The properties of these materials are therefore dominated by the multiple P—P covalent bonds of the phosphorus skeletons with a coordination number somewhat less than 3. To our surprise we have also discovered that the useful electro-optical properties of these materials were essentially preserved for $MP_{15}$ and $MP_x$ (x much greater than 15) crystalline materials and their amorphous counterparts.

Unlike previously known materials, this is a one dimension rigid structure and is resilient in the following sense. The polyphosphide crystal symmetry is very low (triclinic). We believe that in the transition from the crystal to the amorphous form, the low symmetry material is capable of accommodating in a gradual way the increased structural disorder that characterizes the amorphous state. There is no ripping apart of strong tetrahedral bonds (coordination number of 4) as in silicon because the phosphorus, with a much lower coordination number than silicon, can accept much greater structural disorder without the creation of dangling bonds. The polyphosphides are polymeric in nature. The result is a polymeric amorphous structure with no apparent X-ray diffraction peaks, one with longer-range local order than is achievable with conventional amorphous semiconductors. We believe that this gradual onset, in the structural sense, of amorphicity is the reason for the preservation of the desirable crystal properties in the amorphous polyphosphides.

Distinguishable from Known, Useful Semiconductors

The composition and structure of the family of polyphosphides clearly distinguishes them from all known, useful semiconductors:

| Group 4a | (Crystal Si, amorphous Si:H, etc.) |
|---|---|
| 3a-5a (III-V) | (GaAs, GaP, InP, etc.) |
| 2b-6a (II-VI) | (CdS, CdTe, HgCdTe, etc.) |

| -continued | |
|---|---|
| Chalcogenides | (As$_2$Se$_3$) |
| 1b-3a-6a | (CuInSe$_2$) |

Distinguishable from Known Forms of Phosphorus

The alkali polyphosphides (MP$_x$, M=Li, Na, K, Rb, Cs; where x=15 and much greater than 15) are phosphorus rich. In cases of "high x" material they are almost all phosphorus. Nonetheless, their structure (parallel pentagonal tubes) and their properties (stability, bandgap, conductivity, photoconductivity) clearly distinguish them from all known phosphorus materials (black, white/yellow, red, and violet/ Hittorf). The structural relationships among these various forms are discussed below.

Our work has done much to clarify this aspect of phosphorus itself. The nomenclature in this area has been somewhat confusing. The following summarizes our current usage.

1. Amorphous P or Red P

Amorphous red phosphorus is a generic term for all non-crystalline forms of red phosphorus, usually prepared by thermal treatment of white phosphorus.

2. Violet P

This microcrystalline form of red phosphorus is prepared from charges of pure P, either white or amorphous red, by extended thermal treatment.

3. Hittorf's P

Crystalline form of red phosphorus structurally identical to Violet P. Hittorf's P is prepared in the presence of a large excess of lead. Despite this, the terms "Hittorf's P" and "Violet P" have often been used interchangeably. The crystal structure consists of double layers of parallel pentagonal tubes, with adjacent double layers perpendicular to each other in a monoclinic cell. Hittorf's P crystals are somewhat larger (approximately 100 microns) than violet P microcrystals.

4. Large Crystal Monoclinic Phosphorus

Even larger crystals (several mm), essentially isostructural with the above two, are described herein. These novel crystals are prepared by Vapor Transport (VT) treatments of alkali-phosphorus charges. The inclusion of the alkali is apparently essential for formation of the large crystals. Analysis confirms the presence of alkali (500 to 2000 ppm) in these large crystals of phosphorus.

5. Twisted Fiber Phosphorus

A crystalline form of phosphorus described herein prepared by VT treatments of amorphous P charges. Believed to be nearly-isostructural with polycrystalline MP$_x$ "ribbons".

ROLE OF THE METAL: WHY PHOSPHORUS IS NOT GOOD ENOUGH

The many allotropic forms of elemental P are evidence for the variety and complexity of the bonds and structures that are accessible with phosphorus. We lack a detailed, comprehensive model of exactly how the alkali metal works, but have developed a large and body of data showing that the metal stabilizes phosphorus so that a single unique structure may be selected from the ensemble of potentially available structures.

Without at least some alkali metal, the following undesired phenomena occur:

A. The phosphorus is unstable (e.g., White P).
B. To the extent that a known single phase is accessible to the P, it can only do so at high temperatures and of a size limited to microcrystals (e.g., Violet P), or
C. At high pressures (e.g., black P).
D. Without an alkali metal in the charge, the MP$_x$ type of structure is not formed by vapor transport. Rather, the twisted phosphorus fiber form we have discovered is obtained. This crystalline phase is metastable and the structure is not well defined as shown by our X-ray, Raman and photoluminescence data.

The presence of alkali metal in vapor transport favors the all-parallel untwisted phase. It also, as discovered by us, favors large crystals of monoclinic P to form at a different temperature.

The dominant role of structure, not composition, as the determinant of properties is made clear by noting that KP$_x$ (x much greater than 15) has properties (bandgap, photoluminescence, Raman spectra) that are essentially those of KP$_{15}$, but are somewhat different from those of monoclinic P.

It is clear that even a little alkali metal can serve to select a stable phase. But will non-alkalis work? Krebs reported non-alkali polyphosphides, with tubular structures consisting of 2b-4a-P$_{14}$ (2b=Zn, Cd, Hg and 4a=Sn, Pb). Why do these form?

A speculative hypothesis is that these materials form in the tubular structure because the Group 4a element is amphoteric and can occupy a P site in lieu of P.

One can compute an effective electron affinity of the P$_{15}$ framework based on the ionization energies of the alkali metals, all of which are less than or equal to 5.1 eV. One can, in turn, calculate effective ionization potentials for other possible compositions such as the 2b-4a-P$_{14}$ compounds. All of Krebs' materials noted above have "effective ionization" less than or equal to 4.8 eV.

USEFUL PROPERTIES

Our major initial discovery was that the KP$_{15}$ whiskers (single crystal) were stable semiconductors, with an energy bandgap corresponding to red light (1.8 eV) and exhibiting efficient photoconductivity and photoluminescence. These are the hallmarks of a semiconductor with potential applications in electronics and optics. Whiskers of the other alkali MP$_{15}$ materials also have these properties (M=Li, Na, Rb, Cs).

To realize their potential, the materials had to be prepared in a size and form suitable for fabricating devices and for testing. We recognized that the crystal habit, however, is not conducive to growth of large, single crystals that are free of crystallographic "twinning". Large, twin-free single crystals are the basis of nearly all semiconductor device technology today. Polycrystalline materials are less desirable because even if the individual grains are large, the presence of grain boundaries serves to destroy some desirable properties due to the physical and chemical discontinuities that are associated with such boundaries. Hence, our attention turned to the amorphous forms we had discovered.

Useful amorphous semiconductors, whether used as a junction device such as a photovoltaic cell, or as a coating such as in an electrostatic copier, have been generally made as thin films for extrinsic reasons (cost, manufacturing ease, and application need) and intrinsic reasons (material problems in the bulk amorphous state).

We have discovered that $KP_{15}$ can be made as a stable amorphous thin film (by Vapor Transport). (This cannot be done with silicon: amorphous Si is not stable, while single crystal Si is.)

Stable, bulk, and thin film amorphous $KP_x$ (x much greater than 15) can also be made by vapor transport.

There is evidence that these polyphosphides are unusual in yet another way. The useful properties of these materials $MP_{15}$ and $MP_x$ (x much greater than 15) are similar in their crystalline forms and their amorphous counterparts as shown in Tables XVI and XVII below.

Applications utilizing amorphous thin film $KP_{15}$ requiring no junctions can be readily envisioned (e.g., electrostatic copying). In fact, the high inherent resistivity (approximately $10^8$ to $10^9$ ohm-cm) is an advantage for such junctionless system applications.

Electronic and opto-electronic devices all require that some junction be formed in or with the material. This requires lowering the resistivity of the material by doping.

We have discovered that Ni diffused into $KP_{15}$ serves the purpose of reducing the resistivity of the material by several orders of magnitude. Surface analysis has demonstrated that Ni diffusion from the solid state ($KP_{15}$ deposited onto a layer of Ni) follows a normal diffusion pattern during the growth process of the film.

Device configurations with Ni as a back contact and diffuser; and other metals, such as Cu, Al, Mg, Ni, Au, Ag and Ti as top contacts, lead to junction formation. Junction Current-Voltage (I-V) characteristics have been measured with these top contacts. Junction Capacitance- Voltage (CV) characteristics have been measured with Al and Au top contacts. The data indicates double junction formation with a high resistance layer near the top contact.

The high resistance layer is an undoped portion of the $KP_{15}$ film which results from the present doping procedure.

A small photovoltaic effect (micro amp current under a short curcuit condition) has been observed.

SYNTHESIS OF POLYPHOSPHIDES

Below are described the methods we have discovered that will produce polyphosphides of varying composition and morphology.

A. Condensed Phase (CP) Synthesis

This refers to the process of isothermal heat-up, soak (heating at set temperature), and cool down of starting charge carried out in a container of minimum volume. There is no vapor transport. Crystalline and bulk polycrystalline $MP_{15}$ are produced.

B. Single Source Vapor Transport Synthesis (1S-VT)

A starting reactant charge is located in one area of an evacuated tube which is heated to a temperature, Tc, which is greater than Td, where Td represents the temperature(s) of other area(s) of the tube where materials deposit from the vapor. Crystalline $MP_{15}$; crystalline, polycrystalline (bulk, and thin films) and amorphous bulk high x, $MP_x$; monoclinic phosphorus; star shaped fiber; and twisted fiber phosphorus are produced.

C. Two Source Vapor Transport Synthesis (2S-VT)

Source reactant charges loaded in an evacuated chamber are separated physically by distance with a deposition zone between them. The two sources are heated to temperatures greater than the deposition zone (in order to get amorphous material, at least; see below). The deposition zone need not be the coldest one in the system, but a colder area should not be able to trap more than one component. 2S-VT was the first method used to make thin film amorphous $KP_{15}$. Polycrystalline and amorphous thin films of $MP_{15}$ and poly- crystalline thin films and bulk amorphous high x, $MP_x$ are produced.

D. Melt Quench

A charge is heated in a sealed evacuated tube (isothermally, if possible) to temperatures greater than the "melting point" as determined by endotherms observed in DTA experiments, and held there for some period of time. The tube is then removed from the furnace and rapidly cooled. $CsP_7$ glass has been produced.

E. Flash Evaporation

A charge in powder form is fed in small amounts, under a slight Argon flow, into an RF-heated susceptor, which is maintained at temperatures greater than about 800° C. Inside the susceptor, the material is put through a tortuous path where it is, in theory, forced to contact hot surfaces. This is intended to rapidly and completely vaporize the charge such that the composition of the resultant vapor stream is the same as that of powder being injected. The vapor stream is directed into an evacuated chamber where it strikes cooler surfaces, resulting in condensed-product materials. Amorphous films have been produced.

F. Chemical Vapor Deposition (CVD)

In general, this refers to production of material by mixing two (or more) vaporized components which must undergo some chemical reaction to give products. As practiced by us, K and $P_4$ are independently metered into furnaces where they are rapidly vaporized and carried downstream by the Argon flow to a cooler reaction chamber where the combined streams yield condensed product materials.

The significance of CVD lies in that of these methods, it is the most amenable to scale-up and to doping in situ, i.e., simultaneous synthesis and doping of material. Amorphous thin films of $KP_{15}$ have been produced.

G. Molecular Flow Deposition (MFD)

This is a multi-source vapor transport technique that draws on 2S-VT and Molecular Beam Epitaxy (MBE). Independently heated sources are used and the vaporized species are allowed to reach the substrate (also independently heated) at a controlled rate not achievable with 2S-VT. The deposition takes place in an evacuated chamber with in situ monitoring of the deposition (also not available with 2S-VT). The chamber may be sealed or continuously evacuated to control pressure.

$KP_{15}$ Materials

A large variety of polyphosphide materials of different physical forms and compositions were initially prepared during our investigations.

However, for potential useful semiconductor applications, the emphasis of our work has changed from the preparation of single crystal materials to that of amorphous materials—either in bulk or large area thin films.

Among all the $MP_{15}$ materials $KP_{15}$ is a unique crystalline higher polyphosphide (x the same as or greater than 7) compound which exists for the K-P system. (In contrast, the other alkali metals can form compounds with x=7 or x=11, such as $CsP_7$, $NaP_7$, $RbP_{11}$, etc.). $KP_{11}$ and $KP_7$ do not form as compounds. For this reason, the K-P system is easier to control than the other alkali-metal-P systems, where multiple compounds can form.

In addition, from the results of our experimental work, it is apparent that whenever K+P are vaporized, by whatever means, and brought in the proper ratio ([P]/[K] the same as or greater than 15) to a zone whose temperature is in the proper window, amorphous $KP_{15}$ will form. By this window we mean the temperature must be low enough to prevent crystallization of $KP_{15}$ and high enough that $KP_x$, where x is much greater than 15, is not deposited.

Based on this tenet, all synthesis methods can be seen to operate on the same general principle. Each method simply used different means to achieve control of source vaporization or control of deposition. The two source systems (2S-VT, CVD and MFD) are particularly useful as the important variables can be independently controlled.

Based on the above considerations, $KP_{15}$ amorphous in thin films has been selected by us as our leading composition for the development of useful semiconductor materials.

SUMMARY

In a general inquiry into the nature of polyphosphides, potassium polyphosphide whiskers of about 1 cm in length were produced by single source vapor transport. In investigating the properties of this material it was determined by x-ray diffraction of a single crystal that the crystals were $KP_{15}$. It was also discovered that these crystals were semiconductors. When measuring an emission at 4° K. under argon laser illumination, photoluminescence was observed having an energy of 1.8 eV, thus indicating that the material possibly had a band gap within this energy range.

Later, in order to determine the conductivity of these whiskers, leads were attached with silver paint. In order to see if the leads were actually attached to a very small crystal, it was placed under a microscope while the conductivity was measured. Surprisingly the conductivity changed dramatically when the crystal was moved in the microscope, changing the illumination. A photoconductivity ratio of 100 was measured with the unilluminated conductivity of the whisker being about $10^{-8}$ $(ohm-cm)^{-1}$. To establish whether the whiskers had a band gap, measurements were then made of the wavelength dependence of the photoconductivity, the wavelength dependence of the optical absorption and the temperature dependence of the conductivity of the whisker. These measurements, together with the photoluminescence measurement at 4° K., established that the whiskers had a band gap of approximately 1.8 eV. Thus it was establised that $KP_{15}$ crystalline whiskers were potentially useful semiconductors.

An amorphous film was formed on the inside of the quartz tube during the vapor transport production of the $KP_{15}$ whiskers. This amorphous film was also found to have a band gap on the order of 1.8 eV and a photoconductivity ratio on the order of about 100. Like the whiskers, the amorphous film had an electrical conductivity of approximately $10^{-8}$ $ohm-cm)^{-1}$. Thus it was established that it also was a potentially useful semiconductor.

The problem then presented to the inventors was whether $KP_{15}$ could be produced as large crystals, such as silicon, used in semiconductor production; whether polycrystalline or amorphous films of $KP_{15}$ could be reproducibly made and utilized for semiconductor production; and the full characterization of the materials produced by the vapor transport experiment and any analogous materials which might have the same useful properties.

After many vapor transport experiments the inventors were astonished to find that the polycrystalline and amorphous materials that were produced by vapor transport where a single source of a mixture of potassium and phosphorus is heated and material condensed at the other end of a closed tube, were not $KP_{15}$ but when measured by wet analysis were $KP_x$ where x seemed to range from about 200 to about 10,000.

The inventors have since made the amazing discovery that the affinity of phosphorus for potassium, or any alkali metal for that matter, in single source vapor transport causes initial deposition of $MP_{15}$ as the most stable polyphosphide. If there is an excess of phosphorus, then a new form of phosphorus will be deposited. ($MP_x$ where x is much greater than 15) This new form of phosphorus has the same electronic qualities as $KP_{15}$ and is a useful semiconductor.

During the course of their investigations the inventors, in an effort to form thin films of polycrystalline and amorphous $KP_{15}$ and other alkali metal analogs which could not be formed by single source vapor transport, conceived of a two source (separated source) vapor transport method in which the alkali metal and the phosphorus are spaced apart and separately heated. By controlling the temperature of a separate intermediate deposition zone, thin films of $MP_{15}$ where M is an alkali metal, have been made in polycrystalline and amorphous forms. This technique has also led to the production of thin films of polycrystalline and thick films of amorphous phosphorus material of the new form, and other materials presumably polymer-like having the formula $MP_x$, where M is an alkali metal and x is much greater than 15.

We have also used Flash Evaporation, Chemical Vapor Deposition, and propose to use Molecular Flow Deposition methods for synthesizing these materials.

We use $MP_x$ as the formula for all polyphosphides. As will be pointed out below, for useful semiconductors, x may range from 7 to infinity. Known alkali polyphosphides have the formula $MP_7$, $MP_{11}$, and $MP_{15}$. We have discovered that presumably polymer forms exist having the formula $MP_x$ where x is much greater than 15.

Also during these investigations single source vapor transport has been improved over the prior art by controlling the deposition temperature to be constant over a large area, so that large area thick films and boules of polycrystalline and amorphous $MP_x$ where x is much greater than 15 have been formed.

Large quantities of crystalline and polycrystalline $MP_{15}$, where M is an alkali metal, have been made by heating together isothermally stoichiometric proportions of an alkali metal and phosphorus. This condensed phase method produces excellent $MP_x$ where x ranges from 7 to 15 for use in single source vapor transport.

The condensed phase method itself is facilitated by the prior mixing and grinding together an alkali metal and phosphorus in a ball mill which is preferably heated to a temperature in the neighborhood of 100° C. This ball milling surprisingly produces relatively stable powders.

All of the parallel tube polyphosphides have a band gap of approximately 1.8 eV, photoconductivity ratios much greater than 5, (measured ratios having a range from 100 to 10,000), and low conductivity in the order of $10^{-8}$ to $10^{-9}$ (ohm-cm)$^{-1}$.

Since we have discovered that the amorphous forms of these materials, i.e. alkali polyphosphides $MP_x$ where x is greater than 6 formed in the presence of an alkali metal have substantially the same semiconductive properties, we conclude that the local order of the amorphous materials is the same all parallel pentagonal tubes substantially throughout their extent.

In all the polyphosphides, the 3 phosphorus-to-phosphorus (homatomic) covalent bonds at the majority of phosphorus sites dominate any other bonds present to provide the conduction paths and they all have semiconductor properties.

The covalent bonds of the phosphorus atoms all of which are used in the catenation providing the dominant conduction paths and the parallel local order in these materials provide the good semiconducting properties. The phosphorus atoms are trivalent and the catenations form spirals or tubes having channel-like cross sections. The alkali metal atoms, when present, join the catenations together. Atomic species other than phosphorus, particularly trivalent species capable of forming 3 covalent homatomic bonds, should also form semiconductors.

Thus we have invented new forms of phosphorus and methods of making the same, solid films of amorphous and polycrystalline $MP_x$ and methods and apparatus for making the same, methods and apparatus for making metal polyphosphides by multiple temperature single source techniques, methods and apparatus for making high phosphorus polyphosphides by multiple separated source techniques, methods and apparatus for making $MP_{15}$ by condensed phase techniques in polycrystalline forms, semiconductor devices comprising polyphosphide groups of seven or more phosphorus atoms covalently bonded together in pentagonal tubes having a band gap greater than 1 eV and photoconductivity ratios of 100 to 10,000, semiconductor devices comprising $MP_x$ where M is an alkali metal and x is greater than 6, and materials having a band gap greater than 1 eV and photoconductivity ratios of 100 to 10,000, semiconductor devices formed of a high proportion of catenated covalently bonded trivalent atoms preferably phosphorus where the catenated atoms are joined together in multiple covalent bonds the local order of which comprises layers of catenated atoms which are parallel in each layer and the layers are parallel to each other, the catenations preferably being pentagonal tubes, semiconductor devices comprising an alkali metal and said catenated structures wherein the number of consecutive covalent catenated bonds is sufficiently greater than the number of non-catenated bonds to render such material semiconducting, semiconductor devices formed of compounds comprising at least two catenated units, each unit having a skeleton of at least 7 covalently bonded catenated atoms preferably phosphorus and having alkali metal atoms conductively bridging the skeleton of one unit to another, junction devices, methods of forming such semiconductor devices, methods of doping such semiconductor devices, methods of conducting electrical current and generating electrical potential utilizing such devices.

We have therefore discovered a whole class of materials to be useful semiconductors, some members of the class having been first produced or properly characterized by us, and others of which have been produced in the prior art with their useful semiconductor properties being unknown until our discoveries and inventions.

All of these materials have a band gap within the range of 1 to 3 eV, preferably within the range of 1.4 to 2.2 eV and most preferably about 1.8 eV. Their photoconductivity ratios are greater than 5 and actually range between 100 and 10,000. Their conductivities are within the range of $10^{-5}$–$10^{-12}$(ohm-cm)$^{-1}$, being in the order of $10^{-8}$(ohm-cm)$^{-1}$.

Those skilled in the art will readily understand that the alkali metal component M of polyphosphide or any appropriate trivalent "ide" capable of forming homatomic covalent bonds, and having the formula $MY_x$ may comprise any number of alkali metals, (or combination of metals mimicking the bonding behavior of an alkali metal) in any proportion, without changing the basic pentagonal tubular structure and thus without significantly affecting the electronic semiconductor properties of the material.

We have further discovered and invented methods of doping the materials of the invention utilizing doping with iron, chromium and nickel, to increase the conductivity. Junctions have been prepared using Al, Au, Cu, Mg, Ni, Ag, Ti, wet silver paint, and point pressure contacts.

The incorporation of arsenic into the polyphosphides (all parallel tubes) has also been demonstrated to increase conductivity.

These doping methods are also part of our invention and discovery.

The semiconductor materials and devices of the present invention have a wide variety of uses. These include photoconductors such as in photocopying equipment; light emitting diodes; transistors, diodes and integrated circuits; photovoltaic applications; metal oxide semiconductors; light detection applications; phosphors subjected to photon or electron excitation; and any other appropriate semiconductor application.

In the course of our work we have also produced for the first time large crystals of monoclinic phosphorus. These crystals are obtained from vapor transport technique using $MP_{15}$ charge or mixture of M and P (M/P) in varying ratios. Surprisingly, these large crystals of monoclinic phosphorus contain a significant amount of alkali metals (500 to 2000 ppm have been observed). Under the same conditions, these crystals cannot be grown without the presence of alkali metals in the charge.

Two different crystal habits have been observed for these large crystals of phosphorus.

One crystal habit was identified as truncated pyramidal shape crystals as shown in FIG. 39. These cyrstals are hard to cleave. The other form is a platelet-like crystal and is cleavable as shown in FIG. 40.

The largest crystals we have produced in the habit shown in FIG. 39 are $4 \times 3$ mm $\times 2$ mm high. The largest crystals we have produced in the habit shown in FIG. 40 are 4 mm square and 2 mm thick.

The crystals are metallic looking on reflection and deep red in transmission. Chemical analysis indicates that they contain anywhere from 500 to 2000 parts per million of alkali metal. Their powder X-ray diffraction patterns, Raman spectra and differential thermal analysis are all consistent with the prior art Hittorf's phosphorus.

Photoluminescence of crystals grown in the presence of Cesium in FIG. 41 and crystals grown in the presence of Rubidium in FIG. 42 show peaks at 4019 and 3981 cm$^{-1}$, which indicate a band gap of about 2.1 eV at room temperature for this monoclinic phosphorus.

The crystals may be utilized as a source of phosphorus; as optical rotators in the red and infra-red portion of the spectrum (they are birefringent); as substrates for the growth of 3-5 materials such an Indium Phosphide and Gallium Phosphide. They may be utilized in luminescent displays or as lasers.

We have grown from the same charge and deposited at a slightly lower temperature the star shaped fibrous crystals shown in FIGS. 44 and 45.

We have also grown by vapor transport a crystal allotrope of phosphorus, the twisted fiber of phosphorus shown in FIG. 46.

The polyphosphides may be used as fire retardants and strengthening fillers in plastics, glasses and other materials. The twisted tube and star shaped fibers should be of particular value in strengthening composite materials because of their ability to mechanically interlock with the surrounding material. The platelets should be of particular value in thin sheet material where glass flakes are now employed.

The film materials of the invention may be utilized as coatings for their chemical stability, fire retardant and optical properties.

OBJECTS OF THE INVENTION

It is therefore an object of the invention to provide a new class of useful semiconductor materials.

Other objects of the invention are to provide new methods and apparatus for making polyphosphides.

Still other objects of the invention are to provide new forms of stable high phosphorus materials and methods and apparatus for making the same.

Further objects of the invention are to provide new forms of phosphorus and methods and apparatus for making the same.

Still other objects of the invention are to provide dopants and methods of doping such materials.

Yet other objects of the invention are to provide semiconductor devices employing the above.

Another object of the invention to provide large crystals of monoclinic phosphorus.

Still another object of the invention is to provide high purity phosphorus.

Still another object of the invention is to provide new semiconductor materials.

Still another object of the invention is to provide a birefringent material for use in the red and infra-red portion of the spectrum.

Yet still another object of the invention is to provide methods for making materials of the above character.

A further object of the invention is to provide such methods which are more convenient than the prior art and less expensive.

Other objects of the invention are to provide coating materials, fillers, reinforcing materials and fire retardants.

Other objects of the invention will in part be obvious and will in part appear hereinafter.

The invention accordingly comprises one or more inventive steps and the relation of such steps with respect to each of the others which will be exemplified in the methods and processes hereinafter described, compositions of matter possessing the characteristics, properties and the relationship of constituents and components which will be exemplified in the compositions hereinafter described, articles of manufacture possessing the features, properties, and the relation of elements which will be exemplified in the articles hereinafter described and apparatus comprising the features of construction and arrangement of parts which will be exemplified in the apparatus hereinafter described. The scope of the invention is indicated in the claims.

BRIEF DESCRIPTION OF THE DRAWINGS

For a fuller understanding of the nature and objects of the invention, reference should be had to the following detailed description, taken in connection with the accompanying drawings, in which:

FIG. 11 is a diagrammatic view of an experimental reaction tube for two source vapor transport according to the invention;

FIG. 12 is a plot of temperature versus length for the reaction tube of FIG. 11;

FIG. 13 is a diagram of the P to K ratio of the reaction products in the reaction tube of FIG. 11;

FIG. 14 is a schematic diagram of apparatus for a two source vapor transport according to the invention;

FIG. 23 is an photomicrograph of the same surface as shown in FIG. 22;

FIG. 24 is an photomicrograph of an etched surface perpendicular to the surface shown in FIGS. 22 and 23;

FIG. 25 is an SEM photomicrograph of the upper surface of an amorphous thin film of $KP_{15}$ synthesized by two source vapor transport according to the invention;

FIG. 47 is a side diagrammatic view of flash evaporation apparatus according to the invention;

FIG. 48 is a cross sectional view taken along the line 48-48 of FIG. 47;

FIG. 49 is a cross sectional view taken along the line 49—49 of FIG. 48; and,

The same reference numbers refer to the same elements throughout the several views of the drawings.

BEST MODE FOR CARRYING OUT THE INVENTION

Figure 4:
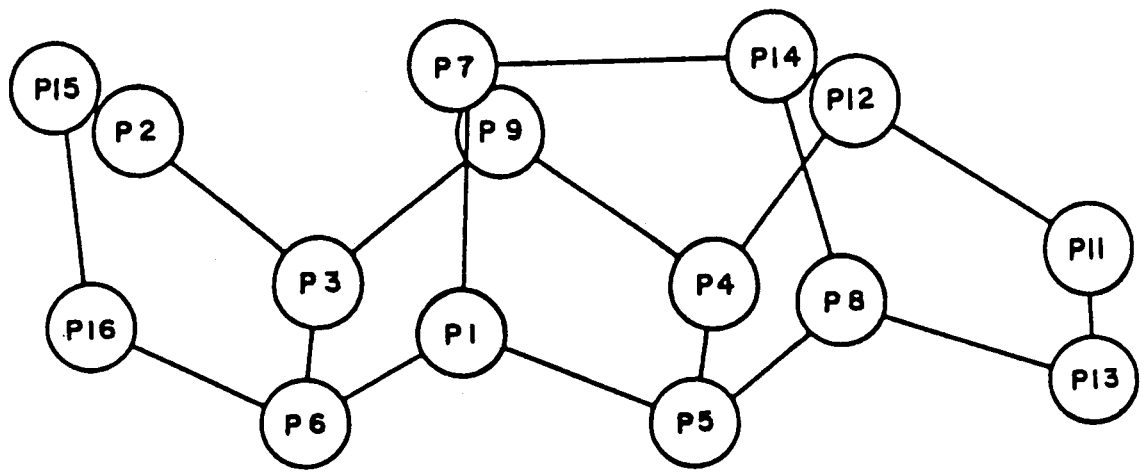
FIG. 4 is a computer diagram from X-ray diffraction data of phosphorus atoms in $MP_{15}$ where M is an alkali metal.
Figure 6:
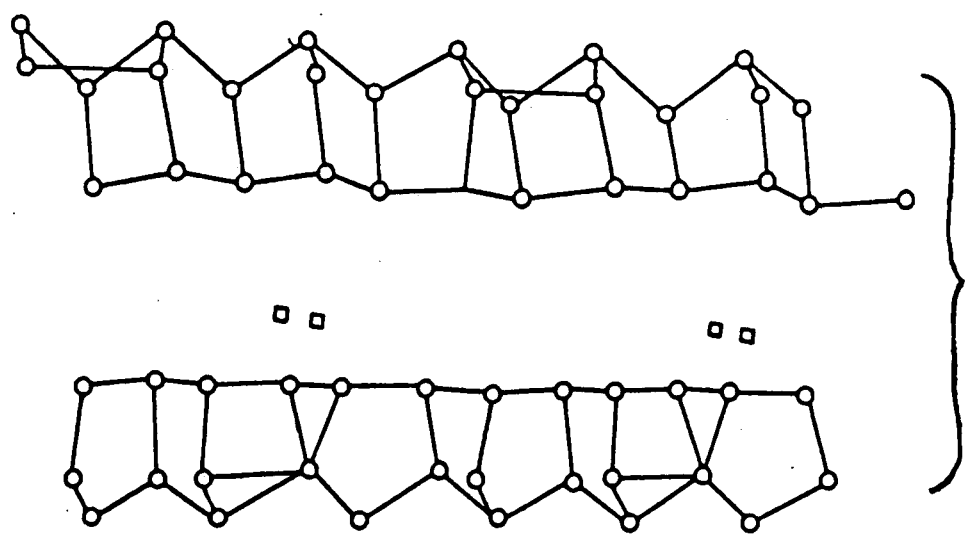
FIG. 6 is a computer diagram from X-ray diffraction data in longitudinal section of $KP_{15}$.
Figure 5:
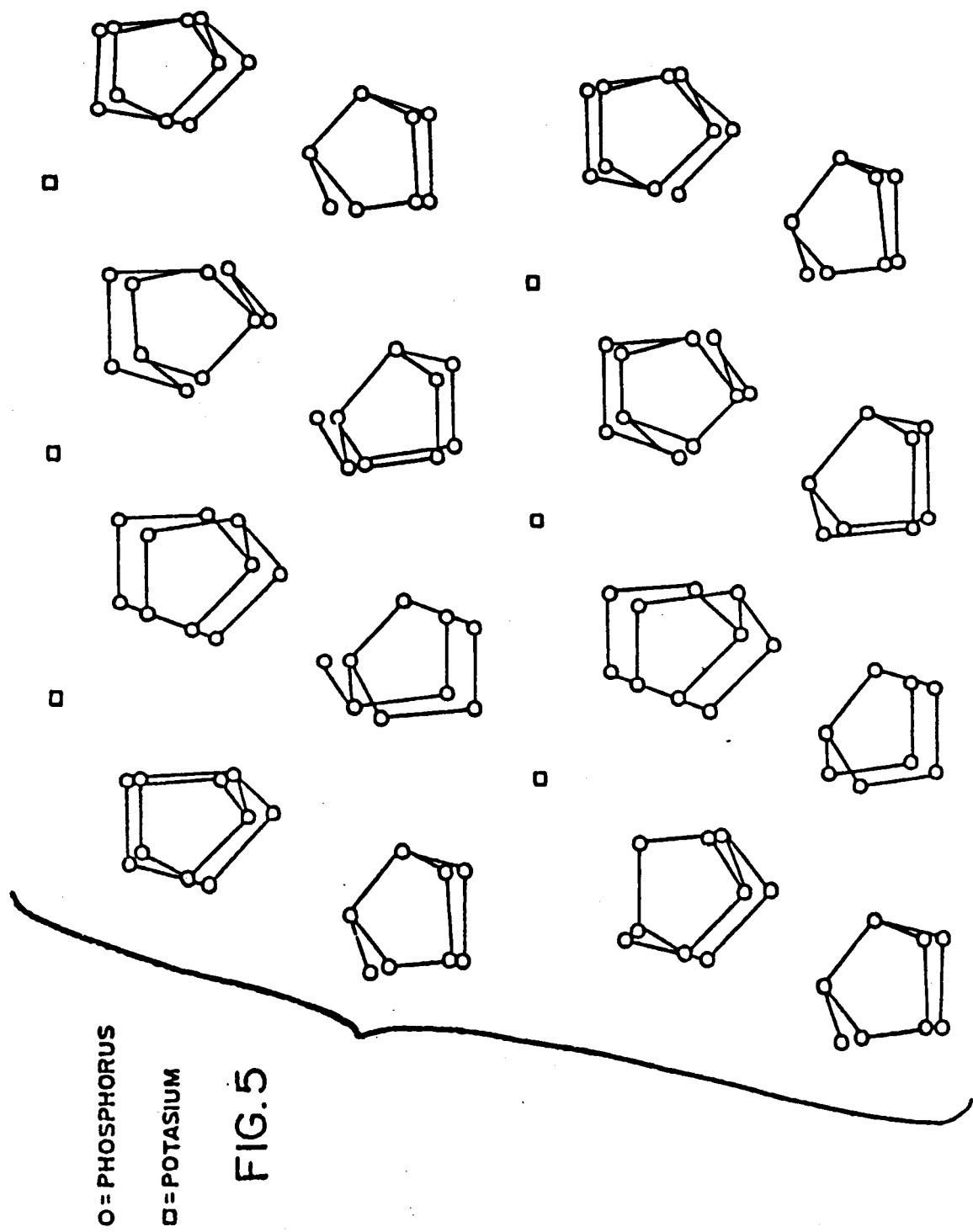
FIG. 5 is a computer diagram from X-ray diffraction data of a cross section of $KP_{15}$ showing how the covalent bonding of the phosphorus atoms of FIG. 4 forms a pentagonal tubular structure.

The high phosphorus materials of the invention exemplified by the high phosphorus polyphosphides $MP_{15}$ where M is an alkali metal, and the new forms of phosphorus formed, are all believed to have similar local order, whether crystalline, polycrystalline or amorphous. We beleive that in both crystalline and amorphous $MP_{15}$, this local order takes the form of elongated phosphorus tubes having pentagonal cross sections as shown in FIGS. 4, 5 and 6. All of the pentagonal tubes are generally parallel on the local scale and in $MP_{15}$ double layers of the pentagonal phosphorus tubes are connected to each other by interstitial alkali metal atoms. In the new forms of phosphorus of our invention, many, if hot most of the alkali metal atoms are missing. However, it appears that one new form of phosphorus formed in the presence of very small amounts of alkali metal atoms grows from vapor deposition in the same form as $MP_{15}$. One experiment to be discussed below indicates that at least one form of this is by growth of the new form of phosphorus on a layer of $MP_{15}$. The MP may act as a template causing the phosphorus to organize in the same structure. All of the materials having these all parallel pentagonal phosphorus tubes have been found by us to have a band gap between 1.4 and 2.2 eV and most on the order of 1.8 eV. Photoconductivity ratios range from 100 to 10,000. Thus it is indicated that all high phosphorus alkali metal polyphosphides from $MP_7$ through $MP_{15}$ and more complex forms and mixed polymers of $MP_{15}$ and the new form of phosphorus discovered by us ($MP_x$ where x is much greater than 15), which all have the all parallel pentagonal tube structure, if stable, will be useful semiconductor materials, barring the inclusion of elements that would act as traps, cause the formation of grain boundaries, or the like.

In all of these materials having the all parallel pentagonal tubular structure, our investigations indicate that the multiple continuous covalent phosphorus-to-phosphorus bonds of the tubes being substantially greater in number than the number of other bonds will provide primary electrical conduction paths for electrons and holes and thus provide good semiconductor properties. It is further our opinion that the presence of alkali metals in the charge, even when resulting in trace amounts in the new forms of phosphorus we have discovered, promote growth of the materials in forms that maintain the same structural and electronic properties as $KP_{15}$ or as monoclinic phosphorus, depending on deposition conditions.

The family of semiconductor members to which the subject invention is directed comprises high phosphorus polyphosphides having the formula $MP_x$ wherein M is a Group 1a alkali metal, and x is the atomic ratio of phosphorus-to-metal atoms, x being at least 7. Metallic elements of Group 1a most suitable are Li, Na, K, Rb, and Cs. Although francium presumably is suitable, it is rare, has not been involved in any known synthesis of $MP_x$ and is radioactive. High phosphorus polyphosphides where M includes Li, Na, K, Rb or Cs have been formed and tested by the inventors.

The polyphosphide compounds of this invention as presently defined must contain an alkali metal. Some of the new forms of phosphorus must be formed in the presence of minor amounts if not unmeasurable amounts of alkali metal. However, other metals may be present in minor amounts as, for example, dopants or impurities.

$KP_{15}$ and, as we later learned, a new form of phosphorus was first synthesized as follows.

Figure 1:
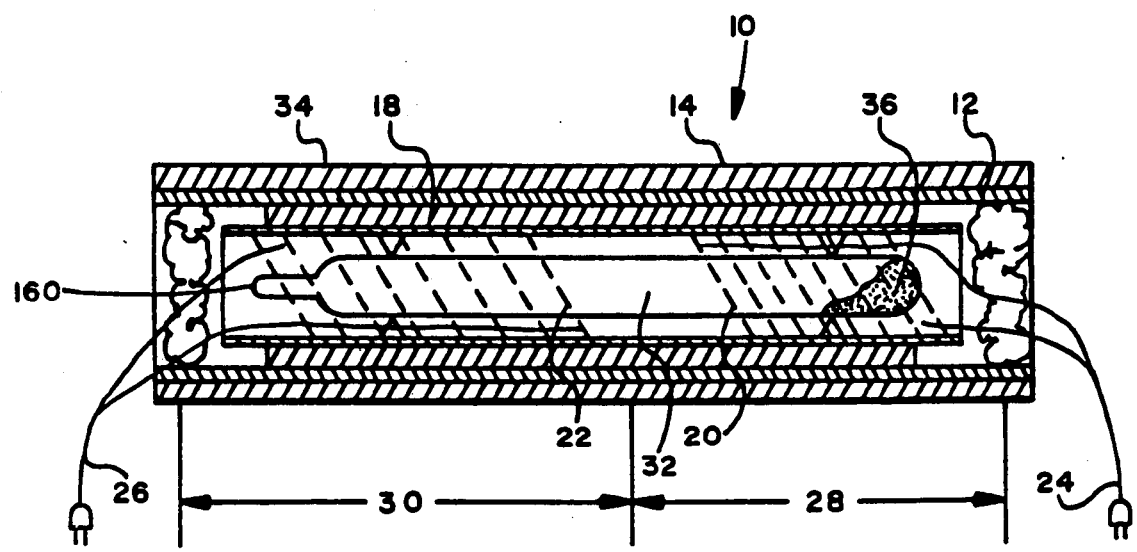
FIG. 1 is a diagrammatic view partly in cross section of single source vapor transport apparatus according to the invention.

Referring to FIG. 1, a two temperature zone furnace 10 comprises an outer sleeve 12 preferably constructed of iron. Outer sleeve 12 is wrapped in a thermally insulative coating 14 which can comprise an asbestos cloth. The furnace was constructed in the laboratory shop of the inventors.

We used a P/K mole ratio of about twelve (12) as reactants 36 in furnace 10. As one illustrative example, 5.5 g of red phosphorus and 0.6 g of potassium were transferred under nitrogen to quartz tube 32. Prior to transfer, the phosphorus was washed repeatedly with acetone, and air dried. However, this washing is considered optional, as is the solvent selected.

After being charged with reactants 36, tube 32 was evacuated to, for example, $10^{-4}$ Torr, sealed, and then placed in furnace 10. Tube 32 was mounted at a slight incline in the furnace. Power supplied to conductors 24 and 26 was adjusted to establish a temperature gradient of, for example, 650° C. to 300° C. from heat zone 28 to heat zone 30. With the above described inclination of furnace 10, reactants 36 were assured of being located in the hotter temperature heat zone 28.

After maintaining furnace 10 at these conditions for a sufficient period of time, for example approximately 42 hours, power to conductors 24 and 26 was terminated and tube 32 was allowed to cool. Upon reaching ambient temperature, tube 32 was cut open under a nitrogen atmosphere and the contents of tube 32 were removed. The contents were washed with $CS_2$ to remove pyrophoric materials, leaving approximately 2.0 g of stable product. This resulted in a yield of approximately 33 percent.

Figure 2:
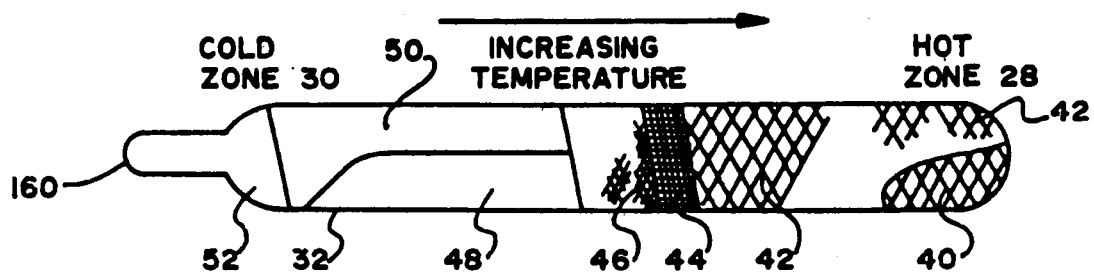
FIG. 2 is a diagrammatic view of a portion of the vapor transport apparatus of FIG. 1.

Using this form of synthesis, various phases of resultant product occur at well defined positions within tube 32 as illustrated in FIG. 2. A dark gray-black residue 40 coupled with a yellow-brown film 42 is typically produced at the extreme end of hot zone 30, where reactants 36 are initially located. Moving in a direction of decreasing temperature along tube 32, there is next found black to purple film deposits 42 which are a polycrystalline material. Next to film deposits 42 is an abrupt dark ring of massed crystallites 44 and immediately adjacent crystallites 44 is a clear zone wherein whiskers 46 are grown. A highly reflective coating or film deposit 48 is found on the lower portion of tube 32 in the beginning of cold zone 28. Above film deposit 48 a deep red film deposit 50 occasionally occurs depending on the temperature maintained in the zone. The deposits 48 and 50 can be polycrystalline, amorphous or a mixture of polycrystalline and amorphous material depending on the reactants and temperature. At the extreme end of cold zone 28 is a mass or film deposit 52 which is amorphous material.

Figure 3:
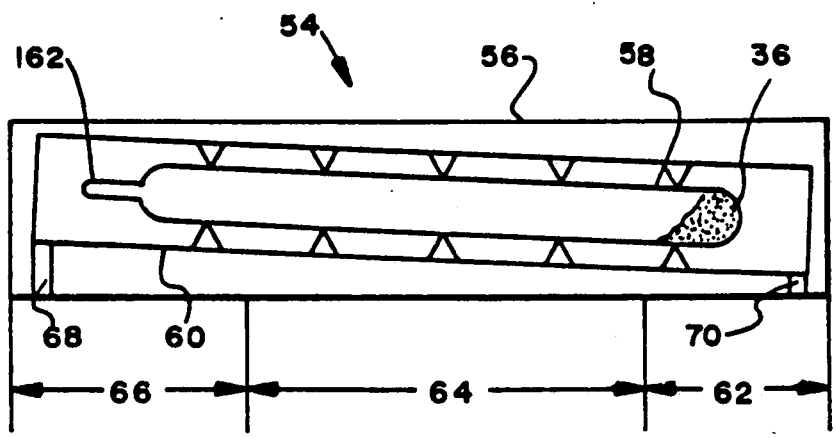
FIG. 3 is a diagrammatic view of another single source vapor transport apparatus according to the invention.

Since there is a continuous temperature gradient from the hot zone to the cold zone of the reaction tube shown in FIGS. 1 and 2, the nature of the materials deposited actually varies continuously from high quality crystalline whiskers to polycrystalline to amorphous. In order to manipulate the reaction and attempt to deposit large areas of uniform layers of material a three zone furnace was constructed and is illustrated in FIG. 3. As herein embodied, the three zone furnace 54 is essentially identical to furnace 10 illustrated in FIG. 1, in that furnace 54 comprises an outer iron sleeve 56, a tube 60, and a reaction tube 58. For purposes of simplicity, asbestos wrappings of outer sleeve 56 and tube 58 have been omitted from FIG. 3. Furnace 54 is primarily distinguishable from furnace 10 in that tube 58 is much longer in comparison to tube 32, and is preferably on the order of 48 cm in length. In addition, furnace 54 has associated with it three distinct heat zones, 62, 64 and 66 which are individually controllable to create a more definitive heat gradient along tube 60. Tube 60 may be supported by asbestos blocks 68 and 70 in a manner so as to provide for an inclination of tube 60 and reaction tube 58 toward heat zone 62, in order to keep reactants 36 in proper position.

Very good quality preparation of $KP_{15}$ whiskers were obtained using temperature set points of 550, 475, and 400 degrees centigrade in heat zones 62, 64 and 66 respectively. It was also found that bulky deposits generated in furnace 10, when loaded into inner sleeve 60 of furnace 54 and reheated in the above-identified temperature gradient, would sublime to form film deposits like those of films 48–52 illustrated in FIG. 2, but only when a high zone temperature of at least 400°–475° C. was used.

Unit cell structural information on $KP_{15}$ crystals produced in accordance with the method described above was obtained by single crystal X-ray diffraction data, and collected with an automated diffractometer. A fibrous single crystal of 100 microns diameter was selected and mounted on a glass fiber. The structure was determined by direct methods using a total of 2,544 independent reflections. All the atoms were located by an electron map and differential Fourier synthesis.

Figure 7:
FIGS. 7 and 8 are photomicrographs of $KP_{15}$ crystal whiskers.
Figure 8:
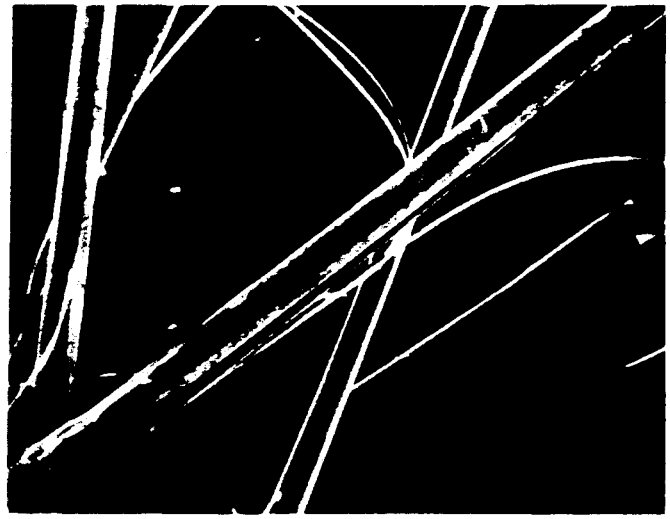

Typical needle-like crystals were examined by high magnification and scanning electronic microscopy (SEM). The resultant SEM photographs of the cross section of the needles show that the needles are apparently composed of dense fibrils rather than hollow tubes. Marked twinning of the whisker crystals is also discernible on the microphotographs of $KP_{15}$ whiskers in FIGS. 7 and 8. The diameter of the primary fibrils of the whisker-type crystals is estimated to be approximately 0.1–0.2 microns. Larger fibrils seem to have a fine structure consisting of parallel lamellae of approximately 500 angstroms thickness.

From the initial crystal data refinement study, the stoichiometry of the studied potassium phosphide compound appears to be $KP_{15}$.

The phosphorus atomic framework of the compound is formed of identical unit tubes with a pentagonal cross section. The tubes are unidimensional along the needle axis direction. The phosphorus tubes are parallel to one another. In the simplest description, double layers of separated phosphorus tubes are connected by a layer of potassium atoms. As judged by the inter atomic distances, the K atoms are at least partially ionically bonded to P atoms. A cross sectional view of a whisker is presented in FIG. 5.

More specifically, each potassium site is associated with a rigid unit of 15 consecutive phosphorus atoms having a structure as illustrated in FIG. 4. In this rigid unit all the phosphorus atoms but one are bound to three other phosphorus atoms. The other phosphorus atoms are chained, with the missing bonds linked to a potassium atom as shown in FIG. 5. Thus, the potassium atom appears to link tubular phosphorus units through a missing P—P bridge. In the investigated structure, potassium has phosphorus atoms as nearest neighbors at distances of 3.6 A, 2.99 A and 2.76 A, respectively. The P—P distances vary from 2.13 A to 2.58 A. The bond angles at the phosphorus chains vary between 87° to 113° and average 102°.

Arsenic forms a layered structure having an average bonding angle of 98° and this is not known to be a useful semiconductor. Black phosphorus has a similar structure and an average bonding angle of 96°. Trivalent atoms which can form their three bonds within the range of 87° to 113° with the average above 98° may form the same catenated structure as $MP_x$. If the bonds are covalent the material can be expected to have the same electronic properties as $MP_x$.

Table I gives the crystal lattice parameters and atomic positions we found for crystalline $KP_{15}$.

TABLE I

Crystal Lattice Parameters For $KP_{15}$

Triclinic system
Unit cell parameters

| | | |
|---|---|---|
| a = | 9.087 A° | (±0.15) A° |
| b = | 11.912 A° | (±0.10) A° |
| c = | 7.172 A° | (±0.15) A° |
| α = | 101.4 | (±0.1)° |
| β = | 107.9 | (±0.2)° |
| Γ = | 89.3 | (±0.1)° |

The unit cell is primitive with one molecule per unit cell and a volume of 723.3 Cubic Angstroms Space group $P_1$ The highest attainable symmetry in the above structural configuration is a centrosymmetric $P_1$ space group with the stoichiometry given by $KP_{15}$.

Figure 9:
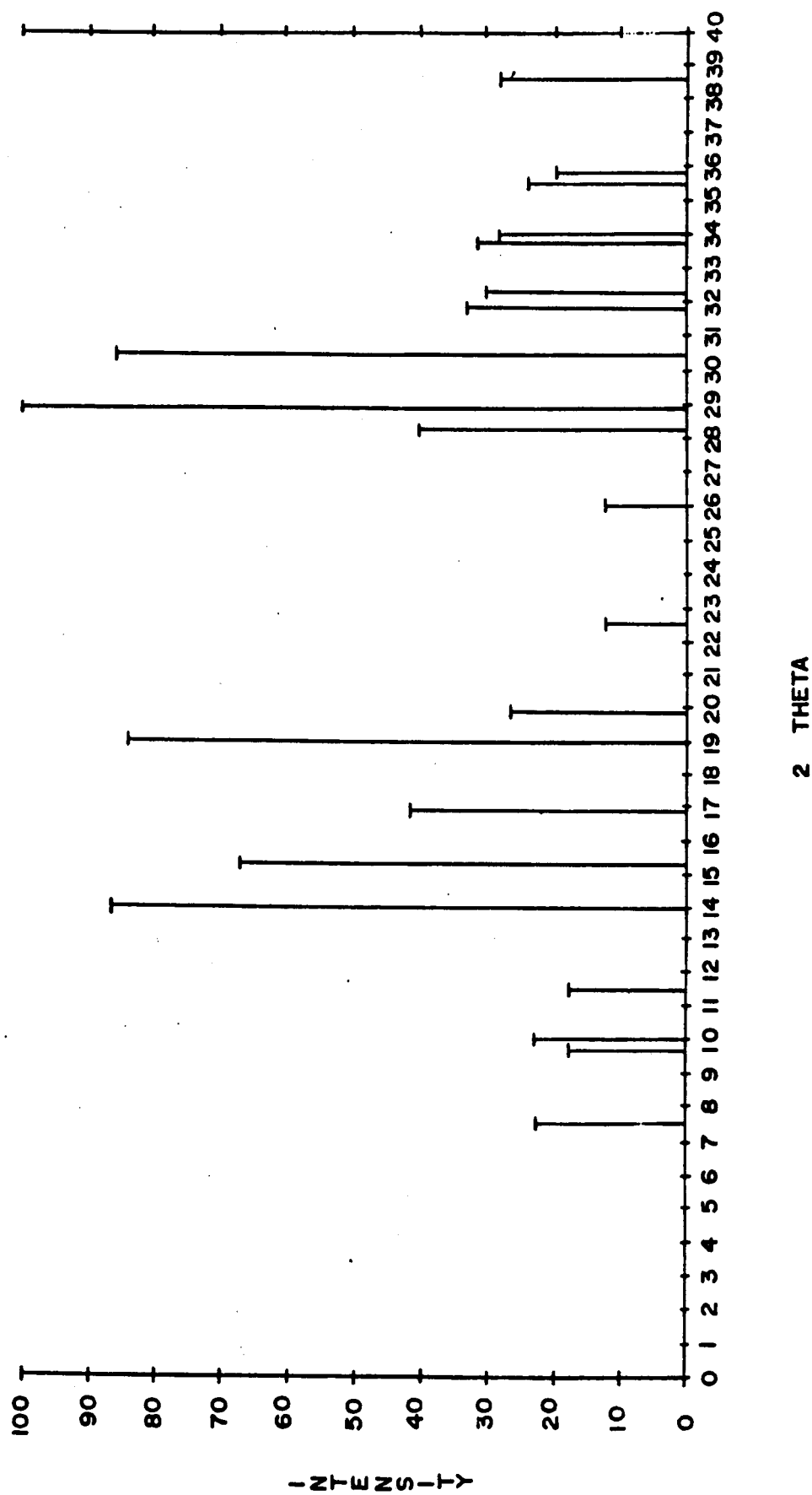
FIG. 9 is a powder X-ray diffraction fingerprint of crystalline $KP_{15}$.

The corresponding X-ray powder diffraction data for $KP_{15}$ polycrystalline material with copper illumination is shown in FIG. 9. This shows the d spacing with the corresponding X-ray intensities.

Similar X-ray powder diffraction data have been observed for whiskers and polycrystalline $MP_{15}$ materials with

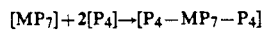

M = Li, Na, K, Rb and Cs.

In all these isostructural compounds, the structural framework can be viewed as formed of parallel pentagonal phosphorus tubes. These tubes are linked by a P-M-P bridge.

The rigid units for this type of structure are $P_4$ and $MP_3$. The building block for the atomic framework can be viewed as $[P_4-MP_3]$ or $[MP_7]$.

Therefore:

$$[MP_7] + 2[P_4] \rightarrow [P_4-MP_7-P_4]$$

which represents the basic structure $MP_{15}$.

Of course, one of the building blocks in such compounds may be present in much larger quantities than the other. In the case of $MP_x$, for example, there may exist building blocks of $[MP_7]$ and $[P_8]$, which are present in a ratio of a to b, respectively. In such a case $MP_x$ could be expressed in the form $[MP_7]_a[P_8]_b$, wherein mathematically $x = (7a + 8b)/(a)$.

It is also possible for a compound to have b much greater than a and have the same basic structural framework.

This type of polymer like tubular structure will result in "fibers" or whiskers of the type $MP_x$ with x much greater than 15.

Figure 10:
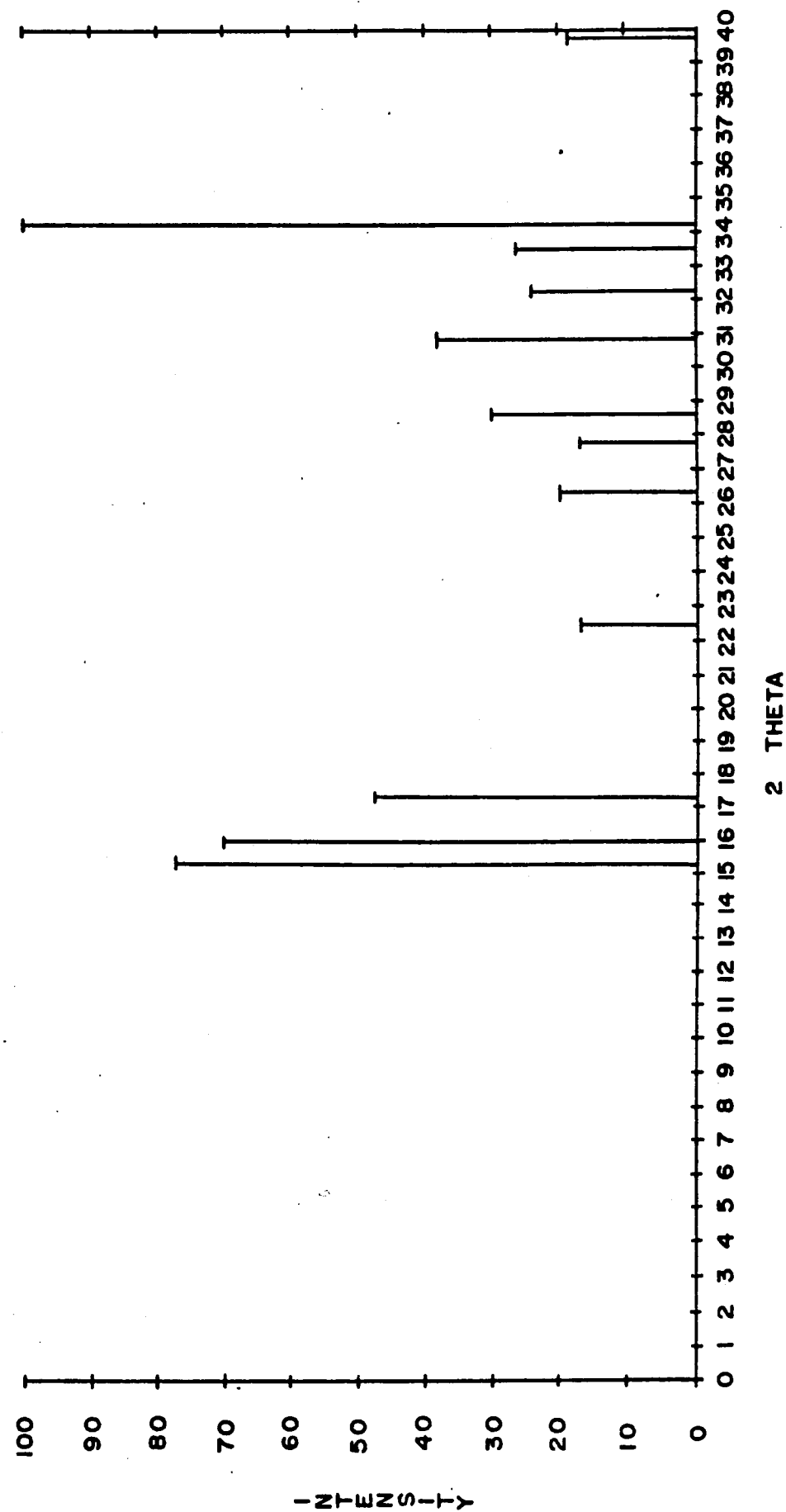
FIG. 10 is a powder X-ray diffraction fingerprint of crystalline $KP_x$ where x is much greater than 15.

Whiskers and polycrystalline "fibers" of the type $MP_x$ with x greater than 1000 (M = Li, Na, K, Rb, Cs) have been observed to crystallize at low temperature (about 400° C.) using the vapor transport technique. The X-ray powder diffraction data of these materials are substantially the same. Data for $KP_x$ where x is much greater than 15 under copper illumination is shown in FIG. 10.

We can compare the structure described above to other structures based on pentagonal cross section phosphorus tubes. The $KP_{15}$ compound is isostructural to $LiP_{15}$, $NaP_{15}$, $RbP_{15}$, $CsP_{15}$. The other alkali metals appear to play the same role as K.

From structural data we concluded that numerous compounds can be formed which will be based on pentagonal cross section tubular building blocks. We also found that in phosphorus materials, at least partially, the phosphorus atoms can be replaced by other pnictides, such as As, Bi or Sb. Substitution under 50 atom percent is possible, without adversely affecting the basic structure of the high phosphorus polyphosphides.

Table II shown the various $MP_x$ compounds synthesized that we have found the same structure as crystalline $KP_{15}$ as shown by XRD powder diffraction fingerprint analysis.

TABLE II

| | |
|---|---|
| Rigid units | $MP_3$ and $P_4$ |
| Building blocks | $[P_4-MP_3]$ or $[MP_7]$ and $[P_8]$ |
| Basic structure | $[P_4-MP_7-P_4]$ or $[MP_{15}]$ |
| M: | Li, Na, K, Rb, Cs |

Compounds Isostructural With Crystalline $KP_{15}$ $$M_xM'_{1-x}P'_yP_{15-y}$$

with: $0 \leq x \leq 1$
$y < 7.5$
M and M' from Group 1a
P' from Group 5a (As, Bi, Sb)

Initially the inventors found, as previously stated, that the crystalline whiskers produced in the apparatus of FIGS. 1, 2 and 3 were $MP_{15}$. However, analysis of the polycrystalline and amorphous materials, although indicating that these materials had the same semiconducting properties as the $MP_{15}$ whiskers, had widely variable stoichiometric proportions from $MP_{200}$ to $MP_{10,000}$, and suprisingly no manipulation of the temperatures in the three zone furnace illustrated in FIG. 3 would produce amorphous forms of $MP_{15}$. It was therefore necessary to greatly refine the methods of producing these materials and to invent a new two source vapor transport apparatus in order to successfully produce polycrystalline and amorphous $MP_{15}$ materials. The very high x materials which are now thought to be a new form of phosphorus, have also been prepared by this method by initially depositing $MP_{15}$ and thereafter cutting off the source of alkali metal so that only phosphorus vapor is present for deposition of phosphorus. Additionally, condensed phase process has been extensively investigated in which molar charges of $MP_x$ materials where x varies from 7 to 15 has been investigated. In this method the stoichiometric mixtures are heated isothermally to reaction and then cooled. We have produced a wide variety of $MP_x$ materials in this manner which are crystalline or polycrystalline powders.

There follows a detailed description of the methods we have employed to synthesize high phosphorus materials and how we have measured the electro-optical characteristics and demonstrated that they are useful semiconductors.

Preparation of Stable High Phosphorus Materials by the Vapor Transport Technique from a Single Source Introduction The technique of applying sufficient energy to a system to create vapor species which yield products on condensation or deposition, at appropriate temperatures is called "vapor transport". For the following discussion, where the source materials are held in close contact and heated together at about the same temperature, the further description as a "single source" technique is applicable.

The methodology described by Von Schnering was essentially a single-source vapor transport technique, although the charge sometimes consisted of separate ampoules of metal and phosphorus heated to nearly the same temperatures. However, the flow of vapor species to the deposition zones was effectively the same as when the metal and the phosphorus are first mixed together. More specifically, in single source vapor transport the vapor species are first brought together at a high temperature and then are deposited at a lower temperature.

The following indicates our development of the technique as it has been applied to the preparation of alkali metal polyphosphides and the departure from von Schnering's method, which results in improved, more selective preparation of: crystalline metal polyphosphides of the type $KP_{15}$; low alkali-metal content polyphosphides, polycrystalline material, of the type $KP_x$, where x is much greater than 15; and a new form of amorphous phosphorus, in which the alkalimetal content can be less than 50 ppm. (parts per million)

The inventions we have made fall into several categories: type of charge, charge ratio, tube length and geometry, and temperature gradient profile. The following examples illustrate the temperature dependent product deposition relationships we have discovered and our improved temperature controlling methods that result in the selective preparation of desired products.

General Methods

An alkali metal and red phosphorus are sealed in quartz tubes, at reduced pressures (about $10^{-4}$ Torr). Atom ratios of the two elements range from $P/M=5/1$ to 30/1, with 15 to 1 as the most common charge. The elements are generally ball-milled together, prior to loading in the quartz tubes. The millings are carried out with stainless steel balls and mills and last for at least 40 hours. The mills are usually heated to 100° C. for the duration of the milling, to assist in the dispersion of the metal in the red phosphorus powder.

The milling achieves an intimate contact of the two elements in as homogeneous a manner as possible. The products of the milling are generally fine powders which are easily manipulated in a dry box and may be stored with little noticeable deterioration. The powders show remarkable stability when exposed to air and moisture, compared to the stability of their constituents, especially the alkali metals. For instance, direct addition of water to the powders only results in combustion of materials in random cases and on a small scale.

Preparation of $MP_{15}$ single crystals, polycrystalline and amorphous materials A mixture of the elements (alkali metal and red phosphorus) is sealed at reduced pressure (less than $10^{-4}$ Torr) in a quartz tube 58 (FIG. 3), about 50 cm long by 2.5 cm in diameter. Tube 58 is supported inside the heating chamber of a Lindberg Model 24357 3-zone furnace in one of two ways. One method employs a second quartz tube 60 as a support piece, which is, in turn, held in the chamber, away from the heating elements, by asbestos blocks 68 and 70, such that the coupled tubes rest at an incline, insuring the reactants remain in the hottest zone. The other method (FIG. 14) is to use supports built of woven tape 136 wrapped about the reaction tube in an expanding spiral, an inch wide, and filling the circular cross section of the heating chamber. This woven tape may be made of a variety of materials: Asbestos, Fiberfrax (from Carborundum Company), or woven-glass. The latter is preferred primarily on safety and performance criteria. The implications of using the two different methods are described below.

The reactants are driven to products by applying energy to the system via the resistance elements of the furnace. If a sufficiently high temperature is applied to the reactants, while other portions of the tube are held at appropriate lower temperatures, products will deposit, or condense, from vapor species. The temperature differential which drives this so-called "vapor-transport" synthesis, is achieved in a 3-zone furnace by selecting different setpoint temperatures for the individually controlled heating elements.

METHOD 1. See FIG. 3. The 50 cm tube, containing the reactants is held by the second quartz tube in the 61 cm long heating chamber. Application of a thermal gradient by manipulation of the 3 set-points results in a generally linearly-falling gradient. That is, the slope of the gradient, $\Delta T/d$, where T is temperature and d is distance along the chamber, is approximately constant between the centers of the two outside heating elements. This linear gradient, applied over the long dimensions of the tube, functions to cleanly separate the variety of product materials formed in the reaction. The products occur in a characteristic pattern of decreasing temperature of deposition: dark purple to black polycrystalline films; a ring of massed crystallites; "single" crystals or whiskers; red films of small-grain, polycrystalline morphology; and, at coldest temperatures, dark grey amorphous material.

A series of experiments have shown that the amorphous material will not form in these sealed tubes if the coldest temperature is greater than about 375° C. Similarly, the occurrence of the red polycrystalline material could be greatly reduced by keeping the lowest temperatures at or above 450° C.

We have also found that polycrystalline $MP_{15}$ will not form in single source apparatus. The polycrystalline and amorphous materials formed are all high x materials where x is much greater than 15.

METHOD 2. The woven tape holders serve not only to orient the reaction tube but also as effective barriers to heat-transfer between the three heating zones. These barriers give rise to steeper drops between the zones, but a flatter gradient within the center zone. The result is a step-like temperature profile, which can be manipulated to selectively produce products by providing appropriate ranges of deposition temperatures.

A. Determination of Product Deposition Temperatures

In von Schnering's announcement of the preparation of single crystals (whiskers) of $KP_{15}$, he described the preparation from the elements as entailing the heating of the elements--potassium and red phosphorus--in a "temperature gradient" of "600/200° C.", in a 20 cm or so quartz tube. He further states the crystals form at "300° to 320° C.". The furnaces used were apparently single element furnaces in which the gradient arises via heat loss from one end of the tubes sticking out of the furnace.

In the first improvement on this procedure, a three-zone furnace as shown in FIG. 3, with independently controlled heating elements, and a 61 cm long heating chamber (Lindberg Model 54357 3-zone furnace) was employed, to achieve and control the applied gradient. By supporting the reaction tube, which was now extended to approximately 52 cm long, in a second, open quartz tube, which was, in turn, supported by asbestos blocks, a generally linear temperature gradient, $\Delta T/d$, was approximately constant between the centers of the two outside heating elements. The power to these elements was controlled by a Lindberg Model 59744-A Control Console, which uses three, independent SCR-proportional band controllers to maintain the temperatures selected on manually set thumb-wheels.

The linearly-falling gradient, applied over the long dimensions of the reaction tube, served to cleanly separate the variety of product materials formed in the reaction. The products occur in a characteristic pattern of decreasing temperature of deposition: dark purple to black polycrystalline films; a ring of massed crystallites; single crystals or "whiskers"; red films of small-grain, polycrystalline morphology, and, at the coldest temperatures, dark grey, amorphous materials.

EXAMPLE I

A Lindberg Model 54357 3-zone furnace as shown in FIG. 3 comprising heating elements embedded in a refractory material in separate cylindrical sections of 15.3 cm, 30.6 cm and 15.3 cm lengths, for a total heating chamber length of 61 cm was used for this example. The diameter of the chamber is 8 cm. Controlling thermocouples (not shown) are located at about 7.0, 30.5, and 53.5 cm along the 61 cm length.

The ends of the heating chamber were plugged with glass wool to minimize heat loss from the furnace. A 60 cm long by 4.5 cm diameter quartz tube was held at a slight angle, by asbestos blocks, in the heating chamber.

The quartz reaction tube was round bottomed, 49 cm long by 2.5 cm in diameter, and reduced to a narrow addition tube 10 cm long by 1.0 cm wide. Under a dry nitrogen atmosphere, 6.51 g of red phosphorus and 0.62 g of potassium were transferred into the tube. The atom to atom ratio of phosphorus to metal was 13.3 to 1. The phosphorus was reagent grade (J. T. Baker) The tube was evacuated to $10^{-4}$ Torr and sealed by fusing the addition tube several cm's from the wider part of the tube such that the total length was 51.5 cm. The sealed tube was placed in the 3-zone furnace as described above and the set point temperatures of the three zones brought to 650° C., 450° C., and 300° C. over a period of 5 hours, and held there for another 164 hours. The power was shut off and the oven allowed to cool to ambient temperatures at the inherent cooling rate of the furnace. The tube was cut open under a dry nitrogen atmosphere in a glove bag. The products consisted of crystalline, polycrystalline, and amorphous forms.

In Table III, the different processing parameters used for several other runs are listed, along with the types of products observed in each run. Prior to being cut open, the tubes from the first three runs were inspected as to the positions along the tubes of several products: the dark ring of massed crystallites, and the start of red polycrystalline films. The whiskers were always observed between these two points. These positions were later correlated to the temperatures along the gradients created by the noted set points. These data are recorded in Table IV.

TABLE III

| Ref. No.* | P/M Charge Ratio (a) | M grams | P grams | Press. Torr. (b) | $T_1$ °C. | $T_2$ °C. | $T_3$ °C. | Time Hours VT/Total (c) | Tube Length cm | Products (d) | Remarks |
|---|---|---|---|---|---|---|---|---|---|---|---|
| 1 | 13.3 | 0.21 (K) | 6.51 | $1 \times 10^{-4}$ | 650 | 450 | 300 | 164/172 | 51.5 | S.C.,P.C.,a | Example I |
| 2 | 12.5 | 0.67 (K) | 6.56 | $1 \times 10^{-3}$ | 600 | 465 | 350 | 138/147 | 52.0 | S.C.,P.C.,a | |
| 3 | 15.1 | 0.67 (K) | 8.02 | $5 \times 10^{-4}$ | 550 | 475 | 400 | 236/245 | 52.0 approx | S.C.,P.C. | Tube failed |
| 4 | 15.0 | 0.29 (Na) | 5.86 | $7 \times 10^{-5}$ | 600 | 450 | 375 | 72 | | S.C.,P.C.,a | |
| 5 | 30.0 | 0.15 (Na) 0.55 (Rb) | 6.00 | $1 \times 10^{-5}$ | 600 | 460 | 350 | 100.5 | | S.C.,P.C.,a | |

(a) Atom to atom
(b) Pressure at seal off, in Torr
(c) Where one time is shown, it is the time at the noted gradient. Where two times are shown the second is the total residence time in the furnace
(d) S.C. = single crystal (or whisker, as often referred to)
  P.C. = Polycrystalline material, normally thick films (greater than 10 microns)
  a = Amorphous material
*The same reference numbers are used to refer to the same runs throughout the tables

TABLE IV

Position of High x Products as a Function of Set Temperatures in 3-Zone Furnace

| Ref. No. | Profile | $T_1$ | $T_2$ | $T_3$ | Time | Ring | Temp. | Films | Temp. | Deposit Length cm | Zone Temp. Range T |
|---|---|---|---|---|---|---|---|---|---|---|---|
| 1 | (1) | 650 | 450 | 300 | 7 days | 26.0 cm | 475° C. | 30.0 cm | 435° C. | 4 cm | 40° C. |
| 2 | (2) | 600 | 465 | 350 | 5 days | 26.5 cm | 485° C. | 33.0 cm | 450° C. | 6.5 cm | 35° C. |
| 3 | (3) | 550 | 475 | 400 | 10 days | 23.5 cm | 505° C. | 36.5 cm | 460° C. | 13.0 cm | 45° C. |
| 3 | (4) | 610 | 485 | 400 | 3 days | 26.0 cm | 510° C. | 34.5 cm | 455° C. | 13.5 cm | 55° C. |
| 3 | (5) | 615 | 485 | 400 | 3 days | 28.5 cm | 495° C. | 42.0 cm | 450° C. | 13.5 cm | 45° C. |

Profiles 1, 2 and 3 were all used independently on separate samples to produce products.
Profiles 4, and 5 are reheating profiles used on the reaction run Ref. No. 3 originally using profile 3.
Whiskers were found growing in all samples in the space between the ring and the deposited films.
Temperature readings are estimated accurate to ±5° C.
Position readings are estimated accurate to ±0 cm.

The information from these two tables was used to establish the relationship of temperature and product-type. The single crystals of $KP_{15}$ appear to form over a temperature range of about 40°±10° C., the center of which varies from run to run, but which lies around 465°–475° C. Similarly, the onset of deposition of red, polycrystalline materials appears to be about 450°±10° C. Finally amorphous material deposited even when the lowest temperature was around 350° C. When this was raised to 400° C., no amorphous material was observed. (Although the run in which this temperature was used eventually ended in a failure of the reaction tube, before products could actually be harvested, this temperature-product relationship for the amorphous material was confirmed in later runs using more advanced techniques). Assuming a mid-range value, an upper limit for deposition of amorphous material was taken as about 375° C. The pressures in the heated tubes were not measured.

B. Temperature Gradients Which Favor Growth of Single Crystals (Whiskers)

Using the knowledge of the deposition temperature-product morphology relationships of Tables III and IV, improvements in the synthetic technique were sought which would allow greater selectivity of product type. Methods were sought for manipulating the temperature profiles in the furnaces which would result in larger areas of the tube surface being within the appropriate temperature ranges for given products. Several available materials with low thermal conductivities, and in easily manipulatable forms were checked for use as barriers to heat transfer in the furnaces. Woven tapes of asbestos proved a suitable product for both supporting the reaction tubes and creating complex gradients, consisting of areas of fairly flat, or isothermal, temperatures, separated by areas (across the barriers) of steep drops or gradients. These so-called "step-like" profiles were applied in all the subsequent examples where specific products were being sought in maximum yields.

Another improvement which helped gain more reproducible temperature profiles from run to run was to use a more solid, ceramic type of material to fill the gaps in the heating chamber walls. In early runs, these were plugged with glass wool, which helped stem loss of heat, but not very efficiently. The large cylindrical gaps are present in the chamber walls because the furnaces are actually designed to hold a process tube along its length, for flow-through applications, rather than for enclosed systems, as are being run in these methodologies.

The following examples were all aimed at trying to promote growth of single crystals, both larger in size, and in greater yields, both as a percentage of product forms, and in absolute yields. These results were indeed achieved.

EXAMPLE II

A Lindberg Model 54357 3-zone furnace identical in design and size as that of Example I was also used in this example. The elements were likewise driven by the same manually set model 59744-A Control Console. The ends of the heating chamber were plugged with a heat resistant ceramic-like material, to minimize heat loss from the furnace. The reaction tube was supported in the heating chamber by two rings of woven tape of asbestos. One of these was located between 16-19 cm and the other between 42 and 45 cm along the chamber. This put both rings completely inside the center heating section, just beside the junctions of the center elements and those of the two outer sections. The rings were constructed such that the tube was held at a slight angle. The ring served to insulate the heating zones from each other by acting as barriers to heat transfer.

The quartz reaction tube (FIG. 3) was round bottomed, 48 cm long by 2.5 cm in diameter, and reduced to a narrow addition tube 162, 10 cm long by 1.0 cm wide. Under a dry nitrogen atmosphere, 5.47 g of red phosphorus and 0.50 g of potassium were transferred into the tube. The atom to atom ratio of phosphorus to metal was 15.1. The phosphorus was 99.9999% pure. The potassium was 99.95% pure. The tube was evacuated to $10^{-4}$ Torr and sealed by fusing the addition tube several cm's from the wider part of the tube such that the total length was 52 cm. The sealed tube was placed in the 3-zone furnace as described above and the set point temperatures of the three zones brought to 600° C., 475° C. and 450° C. over a period of 4 hours, and held there for another 76 hours. The power was shut off to all three zones at once and the oven allowed to cool to ambient temperatures at the inherent cooling rate of the furnace. The tube was cut open under a dry nitrogen atmosphere in a glove bag. The products consisted of crystalline and polycrystalline forms.

Table V lists the processing parameters for a number of other such runs (data for the above example are from the run with reference number 10).

TABLE V

| Ref. No. | P/K Charge Ratio (a) | Grams K | Grams P | Press. Torr (c) | $T_1$ °C. | $T_2$ °C. | $T_3$ °C. | Time VT/Total (d) | Tube Length cm |
|---|---|---|---|---|---|---|---|---|---|
| 6 | 15.1 | 0.58 | 6.80 | $7 \times 10^{-4}$ | 600 | 485 | 450 | 24/28 | 50 |
| 7 | 4.93 | 1.54 | 6.01 | $1 \times 10^{-3}$ | 600 | 485 | 450 | 96/106 | about 48 |
| 8 | 4.98 | 1.53 | 6.03 | $7 \times 10^{-4}$ | 600 | 475 | 450 | 96/106 | about 49 |
| 9 | 15.1 | $0.50^{(b)}$ | $5.98^{(b)}$ | $1 \times 10^{-4}$ | 600 | 475 | 450 | 144/ | 52.5 |
| 10 | 15.1 | $0.50^{(b)}$ | $5.97^{(b)}$ | $1 \times 10^{-4}$ | 600 | 475 | 450 | 144/ | 52.0 |
| 11 | 30.3 | 0.25 | 6.00 | $5 \times 10^{-4}$ | 600 | 470 | 450 | 72/78 | 51.0 |
| 12 | 29.7 | 0.27 | 6.36 | $1 \times 10^{-5}$ | 600 | 470 | 450 | 72/78 | 51.0 |
| 13 | 14.3 | 0.18 (Rb) | 5.70 | $1 \times 10^{-5}$ | 550 | 475 | 400 | about 144/ | 50.0 |
| 14 | 15 | 0.30 (Na) | 6.12 | $7 \times 10^{-5}$ | 600 | 450 | 375 | 72/ | about 50 |
| 15 | 7 | 0.19 (Li) | 5.87 | $7 \times 10^{-5}$ | 600 | 450 | 450 | 72/184 | about 50 |

(a) atom to atom
(b) high purity materials K, 99.95% P, 99.9999%
(c) pressure at seal-off Torr
(d) time at gradient/total resident time in hours All of these runs resulted in crystalline and polycrystalline forms. The yields of the single crystals were always greater than in Example I. The polycrystalline materials were always in the form of films deposited in the colder ends of the tubes and were usually limited to the last 10 or so cm of the tube, though there was usually some overlap with the single crystals Single crystals from these runs were characterized by X-ray powder diffraction patterns as having the same structure as $KP_{15}$ as determined from XRD data. Wet chemical analysis of the crystals were difficult to obtain with great accuracy, in part because of their stability, which required extreme conditions for digesting the materials for analysis. (See the tables VIII through XI on analytical data below)

The polycrystalline films were also characterized by X-ray powder diffraction methods and wet methods. The films showed varying degrees of crystallinity, and the patterns were similar in several aspects to that of $KP_{15}$, but yet were distinctly different in others. Furthermore, the wet analysis, coupled with flame emission spectroscopy consistently showed the alkali metal content to be in the part per million range (i.e. less than 1000 ppm and often less than 500 ppm), and with P/K ratios ranging from about 200 to 1 to about 5000 to 1.

C. Thermal Gradients Which Favor Growth of Polycrystalline and Amorphous Materials Following the successful improvements in production of single crystal materials, a similar series of experiments were carried out to manipulate the 3-zone furnace and asbestos rings to find the stepped thermal gradients appropriate to selectively produce the polycrystalline and amorphous materials observed in earlier runs.

These earlier runs suggested the temperatures necessary for obtaining the desired products. What remained to be shown was how to optimize these products. Table VI shows the type of profiles used and the products observed.

amorphous material to be formed in the first run), and the center zone temperatures were lowered to 375° and 350° C., the amorphous materials were not formed in large amounts at all. Instead, large amounts of both single crystals and polycrystalline material were found over a fairly short space of the tube, and at best, only thin films of amorphous materials may have formed in the rest of the tubes. The same phenomenon was observed in the next two runs as well, although there were definitely thin amorphous films in one run. Apparently most vapor species are condensed out in the polycrystalline and single crystal forms and no significant vapor travels to the region which is cold enough to form amorphous forms.

EXAMPLE III

A Lindberg Model 54357 3-zone furnace identical in design and size as that of Example I, was also used in this example. The elements were likewise driven by the same manually set Lindberg Model 59744-A Control Console. The ends of the heating chamber were plugged with heat resistant material to minimize heat loss from the furnace. The reaction tube was supported by two rings of woven asbestos tape. One of the rings was located between 16-19 cm and the other between 42 and 45 cm along the chamber. This puts both rings completely inside the center heating zone, just beside the junctions of the center elements with those of the two outer sections. The rings were constructed such that the tube was held at an angle. The rings also served to insulate the heating zones from each other, by acting as barriers to heat transfer.

The quartz reaction tube was round bottomed, 48 cm long by 2.5 cm in diameter, and reduced to a narrow

TABLE VI

| Ref. No. | P/K Charge Ratio (a) | K grams | P grams | Press. Torr (d) | $T_1$ °C. | $T_2$ °C. | $T_3$ °C. | Time Hours (e) | Tube Length cm | Products Observed (f) W | P | a |
|---|---|---|---|---|---|---|---|---|---|---|---|---|
| 16 | $K/P_{15}$(b) | 0.50(b) | 5.63(b) | $3 \times 10^{-4}$ | 600 | 465 | 350 | 72/96 | 51.0 | X* | X | X |
| 17 | $K/P_5$ | 1.43 | 5.66 | $5 \times 10^{-4}$ | 600 | 425 | 400 | 72/96 | 50.5 | X | X | none |
| 4 | $K/P_5$ | 1.49 | 5.40 | $7 \times 10^{-4}$ | 600 | 375 | 350 | 72 | about 50 | X | X | questionable |
| 18 | $K/P_5$ | 1.52 | 6.00 | $1 \times 10^{-5}$ | 600 | 350 | 350 | 99.5 | 24.0 | X | X | questionable |
| 19 | $K/P_5$ | 1.25 | 4.95 | $5 \times 10^{-4}$ | 600 | 225 | 225 | 50/77 | 37.0 | X | X | small amount thin film |
| 20 | $K/P_{15}$(b) | (6.1-BM)(b),(c) | | $5 \times 10^{-4}$ | 600 | 440 | 325 | 72/124 | 47.0 | X | X | questionable |

(a) atom to atom ratio
(b) pure starting elements
(c) BM - ball milled mixture
(d) pressure at seal off
(f) W - whiskers (single xtal)
   P - polycrystalline films
   a - amorphous material
*Product observed The first run, which is the subject of the Example III just duplicated the temperatures of the ranges used in Example I, the linear falling gradients now changed to a stepped gradient. Not surprisingly, all product types were found, with some variation in quantity, compared to those of section A. When the coldest temperature was raised to 400° C., as in the second run of Table VI, no amorphous material was found, as anticipated. With the 425° C. center-section temperature, however, nearly two-thirds of the tube's interior was covered with polycrystalline films, and only a small number of whiskers were found, meaning the films could be produced almost exclusively.

In the third and fourth runs, though, where the coldest temperatures were held at 350° C. (cold enough for addition tube 10 cm long by 1.0 cm wide. Under a dry nitrogen atmosphere, 5.93 g of red phosphorus and 0.50 g of potassium were transferred into the tube. The atom ratio of phosphorus to metal was 15. The phosphorus was 99.9999% pure. The potassium was 99.95% pure. The tube was evacuated to $3 \times 10^{-4}$ Torr and sealed by fusing the addition tube several cm's from the wider part of the tube such that the total length was 51 cm. The sealed tube was placed in the 3-zone furnace as described above. The temperature gradient was driven to 600° C., 465° C. and 350° C. over a period of hours and held there for 72 hours. The power to the elements was then shut off simultaneously and the furnace allowed to cool to ambient temperatures at the inherent cooling rate of the furnace. The tube was cut open under a dry nitrogen atmosphere in a glove bag. The products consisted of single crystals, polycrystalline films and amorphous material.

D. Production of Cylindrical Boules of Amorphous Polyphosphides

It was evident from the experiments described in section C that to obtain large amounts of amorphous material improvements needed to be made in the processes already being used. It was recognized that in order to get bulk forms of the material, as opposed to thin films, the conditions appropriate for growth had to be confined to a smaller space than previously allowed. This translated into allowing only the extreme end of the tube to be at or below 375° C. or so. This was accomplishable in principle by use of the thermal barriers. However, it was also recognized that if the conditions for formation of other materials, i.e. single crystalline $MP_{15}$ or polycrystalline $MP_x$ (x is much greater than 15), were also available over a large area of the tube, these materials would act as "traps" for vapor species. It was therefore, also necessary to discourage the formation of the other materials. This was accomplished by raising the center zone temperatures to levels which would be too high for formation of polycrystalline or single crystals. The only area then where these materials were favored were through the area of the thermal barrier, where rapid temperature drops occurred.

As shown by the following example, and other experiments summarized in Table VII below, further improvements in the procedure were worked out. The first was the use of Honeywell Model DCP7000 Digital Control Programmers to drive the heating elements. This allowed the pre-programming of the temperature changes such that reproducible treatments could be made from run to run. Both controlled heat-ups and cool-downs could be accomplished, eliminating tube failures, and production of white phosphorus. The latter often occurred when tubes were cooled rapidly and phosphorus vapor condensed as $P_4$. This was often the reason materials appeared reactive. This reactivity could often be removed by soaking the materials in solvents which would dissolve away the white phosphorus. The second improvement was the routine of applying an "inverted gradient" of 300°-490°-500° C. across the tube from the metal/phosphorus source to the deposition zones before vapor transport, which cleared the deposition zones of materials, which might affect nucleation processes.

By far, the most important improvement, however, was redesigning the geometry of the tube. Instead of a long tube of nearly uniform 2.5 cm diameter, the body of the tube was shortened to about 30-32 cm and the 10 mm diameter addition tube 160 (FIG. 2) lengthened and sealed such that about 5-7 cm of this tube remained as available space in the interior of the tube. When this latter section was placed in zone 3, and the vapor transport gradient applied, this section became filled with solid, bulky cylinders of increasing length, as the conditions for growth were improved.

EXAMPLE IV

A Lindberg Model 54357 3-zone furnace, identical in design and size as that of Example I was also used in this example. The elements, however, were driven by a Honeywell Model DCP-7700 Digital Control Programmer which enabled processing to be pre-programmed and carried out in a reproducible fashion.

The ends of the heating chamber were plugged with heat resistant material to minimize heat loss from the furnace. The reaction tube was supported by two rings of asbestos tape. The rings were constructed such that the tube was held at a slight angle. The rings also served to insulate the heating zones from each other.

The quartz reaction tube was round bottomed, 33 cm long by 2.5 cm in diameter, and reduced to a narrow addition tube 162, 20 cm long by 1.0 cm wide. Under a dry nitrogen atmosphere, 7.92 g of a ball milled charge of atom to atom ratio of 15 to 1 was loaded into the tube which was evacuated to $1 \times 10^{-4}$ Torr and sealed by fusing the addition tube 10 cm from the wider part such that the total length was 43 cm long. The sealed tube was placed in the 3-zone furnace using the woven barriers described above.

With the tube between 6 and 49 cm, one thermal barrier at 16-19 cm and the other at about 38-40 cm, the Honeywell Programmer was used to apply an "inverted gradient" of 300°, 490°, 500° C. for 10 hours. After the furnace cooled at the inherent rate of the furnace, the tube was moved to lie between 12 and 55 cm. The thermal barriers were also rearranged to lie at 18.5-21.0 cm and 44.5-47 cm. The programmer then drove the gradient to 600°, 485°, 300° C. for 64 hours. The programmer then took the tube through a controlled cool-down sequence to a 180°, 190°, 200° C. gradient, which was held for 4 hours. The furnace was then allowed to cool to ambient temperatures at the inherent cooling rate of the furnace.

The tube was cut open under a dry nitrogen atmosphere and 4.13 grams of a 2-3 cm long solid homogeneous amorphous boule recovered from the addition tube 160 (FIG. 3).

The results of several other runs are shown in Table VII.

TABLE VII

| Ref. No. | Charge | Wt. grams | Press.* Torr | $T_1$ °C. | $T_2$ °C. | $T_3$ °C. | Time Hours | Tube Length cm | Yield Amorphous[1] |
|---|---|---|---|---|---|---|---|---|---|
| 20 | K/P$_{15}$BM | 6.1 | $5 \times 10^{-4}$ | 600 | 440 | 325 | 72/124 | 47.0 | not determined |
| 21 | K/P$_{15}$BM | 6.05 | $6 \times 10^{-4}$ | 600 | 460 | 300 | 64/78 | 39.0 | 1.5 cm boule |
| 22 | K/P$_{15}$BM | 5.72 | $1 \times 10^{-5}$ | 600 | 475 | 300/200 | 64/78 | 38.0 | 1.5 cm boule |
| 23 | K/P$_{15}$BM | 5.87 | $1 \times 10^{-5}$ | 600 | 485 | 300/200 | 64/78 | 40.0 | 4.0 cm boule |
| 24 | K/P$_{15}$BM | 8.05 | $5 \times 10^{-5}$ | 600 | 485 | 300 | 64 | 47.0 | 58% |
| 25 | K/P$_7$BM | 7.39 | $5 \times 10^{-4}$ | 600 | 485 | 300 | 64 | 44.0 | 36% |
| 26 | K/P$_{15}$BM | 7.92 | $1 \times 10^{-4}$ | 600 | 485 | 300 | 64 | 43.0 | 52% |
| 27 | K/P$_5$BM | 7.83 | $5 \times 10^{-5}$ | 600 | 485 | 300 | 104 | 41.0 | 12% |
| 28 | K/P$_{15}$BM | 8.0 | $1 \times 10^{-4}$ | 600 | 500 | 300 | 104 | 43.5 | 53% |
| 29 | K/P$_{15}$BM[(b)] | 7.95 | $1 \times 10^{-5}$ | 600 | 485 | 300 | 104 | 45.5 | 54% |

TABLE VII-continued

| Ref. No. | Charge | Wt. grams | Press.* Torr | $T_1$ °C. | $T_2$ °C. | $T_3$ °C. | Time Hours | Tube Length cm | Yield Amorphous[1] |
|---|---|---|---|---|---|---|---|---|---|
| 30 | K/P$_{35}$BM | 7.78 | $5 \times 10^{-4}$ | 600 | 500 | 300 | 104 | 35.0 | 66% |
| 31 | KP$_{125}$CP | 5.40 | $5 \times 10^{-4}$ | 600 | 500 | 300 | 104 | 34.5 | 71% |
| 32 | KP$_{15}$CP | 6.96 | $1 \times 10^{-5}$ | 600 | 500 | 300 | 104 | 35.0 | 51% |
| 33 | Rb/P$_{15}$BM | 7.50 | $5 \times 10^{-5}$ | 600 | 500 | 300 | 104 | 45.5 | 43.0% |
| 34 | RbP$_{15}$CP | 7.19 | $1 \times 10^{-5}$ | 600 | 500 | 300 | 104 | 33.5 | 37.1% |
| 35 | Na/P$_{15}$BM | 8.58 | $1 \times 10^{-5}$ | 600 | 500 | 300 | 104 | 34 | 46.7% |
| 36 | NaP$_{15}$CP | 7.45 | $1 \times 10^{-5}$ | 600 | 500 | 300 | 104 | 34.5 | 53.7% |
| 37 | Cs/P$_{15}$BM | 9.73 | $5 \times 10^{-4}$ | 600 | 500 | 300 | 104 | 34.0 | 15.8% |

[1] boule length or % of charge
CP condensed phase product as charge
BM ball milled product as charge
*pressure at seal off The results showed the yields of material to be fairly independent of the charge type—i.e. ball milled, or the pre-reacted condensed phase products. However, there was a distinct dependency of yield on the P/M ratio. The greater the relative amount of metal in the charge, the lower the yield of material. As the amorphous material is essentially phosphorus, this reflects a lower vapor pressure of phosphorus over a metal-phosphorus charge the greater the metal content; hence, a slower rate of growth for identical thermal conditions.

Table VIII contains some analytical results on amorphous boules prepared. It shows potassium content, as determined by wet methods. It also shows trace constitutes shown to be present by Flame Emission Spectroscopy.

TABLE VIII

Trace Constituents of MP$_x$ Amorphous Materials

| Ref. No. | Charge[1] | K by AA[2] in ppm | Consitutents Detected by Emission[3] in ppm at greater than 1 ppm, Values in ppm |
|---|---|---|---|
| 21 | K/P$_{15}$ | 427 | Fe: .4-4    K: 20-200    Si: 6-60 |
| 22 | K/P$_{15}$ | 85 | Al: 4-40    Fe: 6-60 |
|    |           |    | Si: 20-200    K: Less than 30 |
| 23 | K/P$_{15}$ | 20-224 | As: 2-20    Si: 1-10 |
|    |           |    | Did not check for K |
| 24 | K/P$_{15}$ | 40 | Fe: .3-3    Si: 3-30 |
|    |           |    | Did not check for K |
| 25 | K/P$_7$ | 285 | As: 20-200    Si: 4-40 |
|    |         |    | K: 12-120    Na: 3-30 |
| 26 | K/P$_{15}$ | 161 | K: 20-200    Si: 20-200 |

[1] Ball Milled only
[2] Atomic Absorption, on digested sample
[3] Flame emission spectrographic analysis, on undigested sample Tables IX, X and XI are of analytical data obtained by wet methods on product from vapor transport synthesis.

The P/M ratios in the tables are atom ratios unless otherwise noted.

TABLE IX

SINGLE CRYSTALS (WHISKERS) FROM VAPOR TRANSPORT

| Ref. No. | Charge | P/M | Total* |
|---|---|---|---|
| 38 | K/P$_{15}$ | 19.1 | 94.5 |
| 6 | K/P$_{15}$ | 19.1 | 98.8 |
| 10 | K/P$_{15}$ | 19.1 | 99.4 |
| 11 | K/P$_{30}$ | 16.4 | 96.1 |
| 17 | K/P$_5$ | 11.3 | 97.7 |

*Analytical mass balance % M + % P detected

TABLE X

AMORPHOUS MATERIALS FROM VAPOR TRANSPORT

| Ref. No. | Charge | P/M | Total* |
|---|---|---|---|
| 39 | K/P$_{15}$ | 2500 W | 100.3 |
| 16 | K/P$_{15}$ | 1750 W | 99.7 |
| 21 | K/P$_{15}$ | 2300 W | 92.8 |
| 22 | K/P$_{15}$ | 12200 W | 97.0 |
| 25 | K/P$_7$ | 3500 W | 97.9 |
| 26 | K/P$_{15}$ | 6200 W | 97.8 |
| 23 | K/P$_{15}$ | greater than 4500 W | 98.2 |
| 24 | K/P$_{15}$ | 7000 W | 93.3 |
| 24 | K/P$_{15}$ | 25000 W | 99.5 |
| 27 | K/P$_5$ | greater than 84000 E | 99.7 |
| 28 | K/P$_{15}$ | 7800 W | 98.2 |
|    |           | 82500 E |      |
| 29 | K/P$_{15}$ | 25000 E | 94.8 |

W Wet analysis
E Flame emission spectroscopy
*Analytical mass balance % M + % P detected

TABLE XI

ANALYSIS OF VAPOR TRANSPORT PRODUCTS

| Ref. No. | Charge | Residue Total | Residue P/M | HT Films Ring* Total | HT Films Ring* P/M | KP$_x$ Whiskers Total | KP$_x$ Whiskers P/M | Poly/Films Total | Poly/Films P/M | Poly/Films Total | Poly/Films P/M | Amorphous Total | Amorphous P/M | Remarks |
|---|---|---|---|---|---|---|---|---|---|---|---|---|---|---|
| 39 | K/P$_{15}$ |  |  |  |  |  |  |  |  |  |  | 100.3 | 2500 |  |
| 38 | K/P$_{15}$ |  |  |  |  | 94.54 | 19.09 | 98.40 | 1170 |  |  |  |  |  |
| 2 | K/P$_{125}$ |  |  | 95.4 | 10.4 |  |  |  |  |  |  |  |  |  |
| 6 | K/P$_{15}$ |  |  |  |  | 98.76 | 19.10 |  |  |  |  |  |  |  |
| 10 | K/P$_{15}$ |  |  |  |  | 99.40 | 19.07 |  |  |  |  |  |  |  |
| 9 | K/P$_{30}$ | 92.35 | 4.90 | 89.56 | 12.04 | 96.14 | 16.35 | 100.4 | infinity | 95.69 | infinity | 96.88 | infinity |  |
| 17 | K/p$_5$ |  |  | 97.65 | 13.1 | 100.50 | 11.3 | 99.51 | 213 | 99.71 | 358 |  |  |  |
|    |         |  |  |      |      |        |      | 99.81 | 347 | 98.97 | 193 |  |  |  |
| 16 | K/P$_{15}$ |  |  |  |  |  |  | 99.91 | 2300 | 98.20 | 54.5 | 99.71 | 1750 |  |
| 18 | K/P$_5$ |  |  |  |  |  |  | 97.91 | 137.65 |  |  |  |  |  |
| 40 | K/P$_{30}$ |  |  |  |  |  |  | 100.00 | greater than 7000 | 100 | 1800 |  |  |  |
| 19 | K/P$_5$ | 95.00 | 2.88 |  |  |  |  |  |  |  |  |  |  |  |

TABLE XI-continued

ANALYSIS OF VAPOR TRANSPORT PRODUCTS

| Ref. No. | Charge | Residue Total | Residue P/M | HT Films Ring* Total | HT Films Ring* P/M | KP$_x$ Whiskers Total | KP$_x$ Whiskers P/M | Poly/Films Total | Poly/Films P/M | Poly/Films Total | Poly/Films P/M | Amorphous Total | Amorphous P/M | Remarks |
|---|---|---|---|---|---|---|---|---|---|---|---|---|---|---|
| 20 | K/P$_{15}$ | 95.4 | 3.17 | 94.91 | 13.3 | | | 97.9 | 1250 | 98.97 | 6250 | | | |
| 21 | K/P$_{15}$ | 80.0 | 3.67 | | | | | 98.2 | greater than 2500 | 99 | greater than 2500 | 92.8 | 2300 | |
| 22 | K/P$_{15}$ | 89 | 3.23 | 88.7 | 10.92 | | | 95.3 | 2190 | 93.1 | 2900 | 97.0 | 12200 | |
| 25 | K/P$_7$ | 91.2 | 3.17 | | | | | 96.3 | 2000 | | | 97.9 | 3500 | |
| 26 | K/P$_{15}$ | 89.7 | 3.01 | 76.70 | 11.5 | | | 95.1 | 4000 | | | 97.8 | 6200 | |
| 23 | K/P$_{15}$ | 91.8 | 2.80 | | | | | 95.40 | 2200 | | | 98.2 | 4500 | |
| 24 | K/P$_{15}$ | | | | | | | | | 93.3 | 7000 | 99.5 | 25000 | |
| 27 | K/P$_5$ | 96.0 | 3.28 | | | | | 93.2 | greater than 9803$^E$ | | | 99.7 | greater than 84,000 | E |
| 28 | K/P$_{15}$ | 87.7 | 3.42 | | | | | 99.5 | greater than 12500$^E$ | | | 98.2 | greater than 7800 | E is greater than 82500 |
| 29 | K/P$_{15}$ pure | 93.6 | 3.48 | | | | 1250 | 98.3 | 15000 | | | 94.8 | | E is greater than 25000 |
| 41 | Na/P$_{15}$ | | | | | | | 94.13 | greater than 700 | 97.31 | greater than 700 | 98.21 | greater than 700 | Na not detected |
| | | | | | | | | 98.80 | greater than 700 | 97.23 | greater than 700 | | | Na not detected |
| 42 | Na/P$_{15}$ | | | | | | | 98.71 | greater than 700 | 97.12 | greater than 700 | 98.47 | greater than 700 | Na not detected |
| 43 | Na/Rb/P$_{30}$ | | | | | | | 97.6 Na/Rb | 1000 4.3/1 | 97.3 Na/Rb | 1330 3.1/1 | | | |
| 44 | Rb/P$_{14}$ | | | | | | | 99 | 1300 | | | | | |
| 45 | Li/P$_7$ | | | | | | | 96.86 | 1500 | | | | | |

Total = total percent of metal and phosphorus measure
Wet analysis unless noted
E Metal content measured by flame emission spectroscopy in atomic ratio
*High temperature (HT) films and rings, see FIG. 2

Preparation of Metal Polyphosphides by Two Source Techniques

Polyphosphides have been prepared in two fundamentally different types of equipment which are both identified herein as Two Source or separated source techniques because in both types of equipment, the metal and phosphorus are separated and heated independently on either side of a deposition zone. All examples have been carried out on the K-P system.

In the first method, as shown in FIG. 11, the phosphorus and potassium charges are held at opposite ends of a sealed quartz tube 100. The tube is subjected to a temperature profile as shown in FIG. 12 achieved by use of a three zone furnace. The profile takes the independent charges to elevated temperatures, relative to the center zone between the two constituents. In this zone, the vaporized constituents combine to form the deposited product of KP$_{15}$, in the form of films on the reactor walls. (More complete details appear in Example V below).

In the second apparatus, as illustrated in FIG. 14, a substantial section generally indicated at 102 is held outside the three zone furnace 104, at ambient temperature. This section includes a stopcock 106 and ball-joint 108 arrangement used to achieve the low-pressures desired to carryout the reaction. This alternate sealing technique requires lower temperatures for this portion of the set up, but allows for rapid and nondestructive insertion of a glass "boat" which holds the phosphorus and metal sources. The boat 112 (see FIG. 15) also is designed to hold metal on glass substrates 114 (FIG. 14) upon which the films are to be deposited. These film-/substrate configurations serve as initial starting points for device designs, as indicated below.

The section outside the furnace provides a cold trap for vapor species. Specifically phosphorus, which is loaded into the zone closest to the outside section, is deposited in the outside section in large amounts, generally as the highly pyrophoric white form. Because this trap exists, the vapor pressure conditions of the system are quite different from the totally-heated systems described above. It follows that the temperature conditions which successfully yields desired products in the first apparatus, are not appropriate for the second apparatus. The conditions appropriate for the latter were independently determined.

EXAMPLE V

In the 54 cm long by 2.5 cm diameter quartz tube 100, with a 10 cm long by 1.0 cm diameter neck 116, shown in FIG. 11, phosphorus and potassium were loaded, under dry nitrogen conditions, into opposite ends of the tubes, in a atom to atom ratio of 15 to 1. The potassium (99.95% pure) was loaded first by dropping small pieces, totaling 0.28 g in weight, into a cup 118 with the tube oriented vertically. The pieces were then melted and allowed to resolidify in the cup. The phosphorus (99.9999%) was then added to the tube, the 3.33 grams of pieces easily being manipulated around the cup 118. The tube was then sealed by fussion of the neck 116, at $5 \times 10^{-5}$ Torr.

The tube was then arranged in a Lindberg Model 54357-S 3-zone furnace to lie centered amongst the three zones. Unlike the Model 54357, which has zone lengths of 6, 12 and 6 inches (15.2, 30.5, and 15.2 cm), the S model has zones of 8, 8 and 8 inches (20.3, 20.3, and 20.3 cm). Two woven asbestos tapes, spiraled around the tube, held it at the junctions of zones 1 and 2, and zones 2 and 3. Not only did these tapes support the tube, they insulated the center zone from the higher temperatures of the outside zones. A schematic representation of the resultant temperature profile is shown in FIG. 12. A Honeywell Model DCP-7700 Digital Control Programmer was used to drive the three heating zones through an appropriate warm-up period, to the 450°, 300°, 450° gradient, which was held for 72 hours, and then through a 15 hour cool down sequence to ambient temperature.

The materials formed in the tube were analyzed by the following procedure. First, in a dry nitrogen atmosphere, the tube was cut into seven tubular sections, of approximately equal lengths, by use of a silicon carbide saw. Pieces of the films found in the sections (generally 10 microns or greater in thickness), were removed and individually examined by X-ray diffraction techniques. The remainder of each section was subjected to analysis by wet methods.

The P/K ratios of the deposits found for the sections are indicated in FIG. 13. For the center regions, where T was approximately 300° C., the bulk compositions were about 14/1, which falls within the accuracy limits of the methods employed to identify the material as $KP_{15}$. More revealing were the X-ray powder diffraction patterns for the materials found having a P/K of about 14 which clearly showed they matched those of $KP_{15}$, either from single whiskers or bulk polycrystalline material. Furthermore, the patterns clearly showed the presence of both polycrystalline and amorphous materials in about a one to one ratio, as manifested by broadening of the peaks.

EXAMPLE VI

Figure 16:
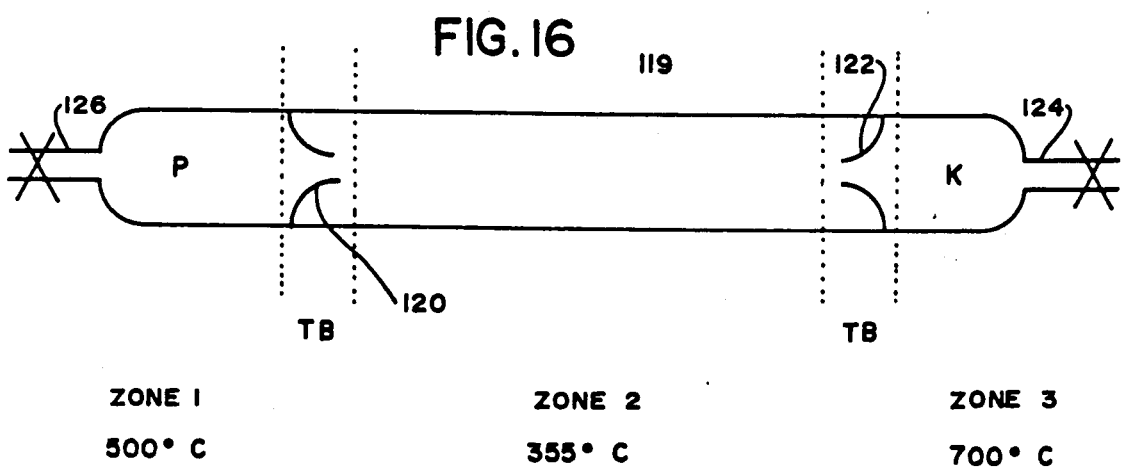
FIG. 16 is a diagrammatic view of another reaction tube for two source vapor transport according to the invention.

The apparatus used in this example was modified relative to that of Example V. The quartz tube 119 was fabricated with "nozzles" 120 and 122 segregating the two end chambers from the center one (see FIG. 16). Under dry nitrogen conditions, melted potassium (0.47 g, 99.95% purity) was added to the outside chamber indicated at K, and allowed to resolidify. The addition tube 124 was then fused shut. Phosphorus (5.58 g, 99.9999% purity) was then added to the other outside chamber indicated at P and the whole apparatus evacuated and sealed at $1 \times 10^{-5}$ Torr, by fusion of the second addition tube 126. The phosphorus to potassium ratio in the system was 15 atoms to 1 atom.

The sealed tube 119 was 41 cm long, and was centered amongst the three consecutive 20.3 cm zones of a Lindberg Model 54357-S 3-zone furnace. Two thermal barriers (TB) of woven asbestos tapes, spiraled around the tube, held it at the junctions of zones 1 and 2, and zones 2 and 3. In addition to holding the tubes, they insulated the center zone from the higher temperatures of the outside zones. A Honeywell Model DCP-7700 Digital Control Programmer was used to drive the three heating zones through a warm up period, to a 500°, 355°, 700° C. gradient. (The phosphorus was at 500° C., the potassium at 700° C. The center zone temperature was selected as 300° C., but because the insulating characteristics of the woven tape is limited, heat spillover from the side chambers raised the center zone temperature to the 355° C. level.) This gradient was held for 80 hours, and then a 24 hour cool-down sequence was followed.

When tube 119 was cut open, under dry nitrogen conditions, using a silicon carbide saw, it was found that nozzle 122 between the potassium zone K and the center zone had become clogged with material, which looked like polyfibrous $KP_{15}$. The center zone contained thin, light red films; thicker, darker red films; and several, relatively large, monolithic boules. The two largest pieces were each about 4 cm long, by 1 cm wide, with a maximum thickness of about 4 mm. One side of each piece is relatively planer, while the other has a convex configuration, associated with growth against the inside walls of the circular reaction tube.

Wet analysis of this material showed the potassium content to be extremely low, as a bulk analysis, at less than 60 parts per million. Electron Spectroscopy for Chemical Analysis (ESCA) indicated that the potassium content of this material decreased rapidly outwardly of the tube wall on which it was first deposited. At 100 angstroms the ratio of P-K was about 50. As measured by ESCA the P-K ratio on the final surface deposited was in the order of 1000. X-ray diffraction studies showed the material to be amorphous.

EXAMPLE VII

Figure 15:
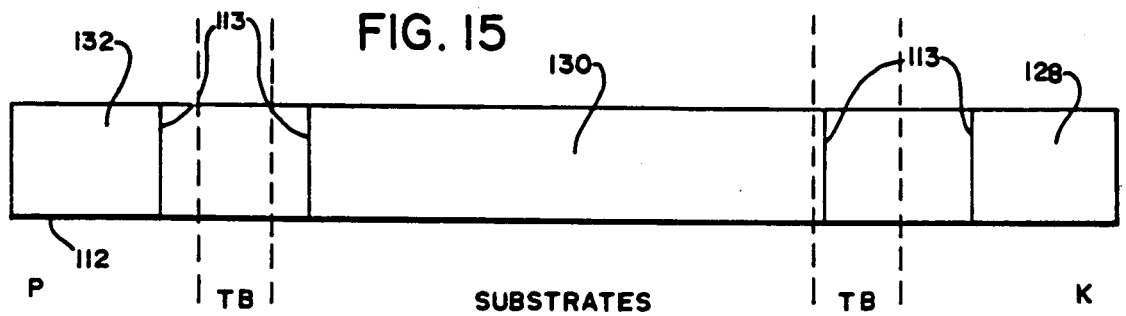
FIG. 15 is a diagram of one of the elements of the apparatus illustrated in FIG. 14.

Under dry nitrogen conditions, 0.19 g of melted potassium (99.95% purity) were transferred to one of the outermost sections 128 (5 cm long) of a pyrex boat 112 (FIG. 15). The metal was allowed to resolidify Two plain glass substrates 114 (see FIG. 14), each about. 7.5 cm long by 1 cm wide, were laid end to end, filling the 15.3 cm long center section 130. Next, 1.36 grams of phosphorus (99.999% purity obtained from Johnson Matthey) were added to the opposite outside section 132 of the boat. The phosphorus is in a mixed-size granular form which readily pours out and fills in the bottom of section 132. Pyrex dividers 113 keep the P and K and substrates from sliding in the boat 112. The 35 cm long boat 112 was then carefully slid into the 60 cm long by 2.5 cm diameter pyrex reaction chamber 134 of FIG. 14, until section 128 with the potassium abutted the round bottom, closed end of the chamber 136. A Buta-N O-ring, size 124 was then clamped into the O-ring joint 102, and the teflon Stopcock 106 (supplied by Chem-Vac, Inc) screwed down tightly. On a vacuum line, the stopcock 106 was reopened and the chamber pumped down to $8 \times 10^{-4}$ Torr. The stopcock was then reclosed, sealing the reaction chamber.

The reaction chamber is arranged in a Lindberg Model 54357-S 3-zone furnace As shown in FIG. 14, two woven-glass tapes 137 and 139, spiraled around the tube, supported the chamber at the 3unctions of zones 1 and 2, and zones 2 and 3. These tapes forming thermal barriers (TB) were set to just lie completely within the center zone. A third spiraled tape 138 was used to support and thermally insulate the point where the apparatus exits the heating chamber of the furnace. A cylindrical plug 140 of a ceramic like material was used to stem heat loss out of the furnace opening at the other end of the chamber.

This arrangement of the apparatus results in section 128 of the boat 112 containing the potassium to lie within the third heating zone, section 130 containing substrates to lie in the center, or second, heating zone and section 132 of the boat containing phosphorus to lie in the first heating zone. It also results in a large segment of the apparatus being outside the furnace, at ambient temperature.

A Honeywell Model DCP 7700 Digital Control Programmer was used to drive the three heating sections through a warm-up period in which the temperatures were brought to 100°, 150°, 100° C. in the phosphorus zone, the substrate zone, and the potassium zone, respectively. Then, as rapidly as possible (approximately 18 minutes) the gradient was driven to 500°, 300°, 400° C., where it was held for about 8 hours. The furnace was then allowed to cool at its inherent rate, to a profile of 100°, 100°, 100° C., which took about 10 hours. The furnace then was allowed to cool to room temperature.

The tube 134 was removed from the furnace. The section outside the furnace contained deposits of white, yellow, and yellow-red materials, all of which were probably phosphorus in varying stages of polymerization. The phosphorus heating zone was clear of material, while the potassium zone contained a variety of materials, ranging in color from tan, to yellow, to orange.

The latter extended slightly into the center zone, which otherwise was covered through one-half of its length, next to the potassium zone, with a dark film, which transmitted red light when a source lamp was shone through it. The remaining half of the zone was clear of material. The apparatus was opened under dry nitrogen conditions, the pyrex boat 112 withdrawn, and the glass substrates, covered with the red film, removed from the boat, and placed in a tightly sealed bottle, for later analysis. (When the remainder of the materials were exposed to ambient conditions, the phosphorus deposits in the exposed section of tube would generally burn vigorously, though those closest to the phosphorus source did not exhibit such reactivity. The materials which were in the potassium-source section of the apparatus were very reactive when exposed to moisture. They generally burned vigorously, apparently by the production of hydrogen via reduction of water.)

The technique was repeated several times. Further examples are noted in Table XII.

Analysis of materials from runs 46, 47 and 48, by Scanning Electron Microscope with electron diffraction analysis (SEM-EDAX) methodologies revealed the material to be $KP_{15}$ films, on the order of 6-7 microns in thickness, and to be of an amorphous character, with no discernible structure evident in the micrographs.

Summary of Vapor Transport Conditions

Processing features for controlling product types are: 1) Use of a three zone furnace for more uniform temperature control; 2) Extended tube length; 3) Use of thermal barriers for temperature gradient control; 4) Use of thermal plugs at ends of oven; and 5) Use of extended narrow addition tube to obtain cylindrical boules.

Ranges of conditions for one source vapor transport are:

1) Reaction zone temperatures range from 650°-550° C.; Cold zone deposition temperatures range from 450°-300° C.
2) Deposition temperature for single crystals of $KP_{15}$ were found to range plus and minus 25° C. around a center value of 465°-475° C.
3) Deposition temperature for polycrystalline films were found to range from about 455° C. down to 375° C.
4) Deposition temperature for amorphous forms of the new form of phosphorus range from about 375° C. down to at least 300° C. (No lower temperatures were investigated to date)

The range of conditions for two source vapor transport are for forming bulk $KP_{15}$ materials (FIG. 11 apparatus); Phosphorus, temperature at 450° C., Potassium at 450° C., and deposit zone at 300° C.; deposits were thick films of mixed polycrystalline and amorphous $KP_{15}$; for bulk amorphous $KP_x$ (x much greater than 15 the new form of phosphorus, FIG. 16 apparatus): Phosphorus at 500° C., Potassium at 700° C. and deposit zone

TABLE XII

| REF. No. | TEMPERATURES P °C. | TEMPERATURES CENTER °C. | TEMPERATURES K °C. | TIME HRS. | K GRAMS | P GRAMS | SUBSTRATES | DEPOSIT LENGTH cm | FURNACE |
|---|---|---|---|---|---|---|---|---|---|
| 46 | 500 | 300 | 400 | 8.0 | 0.19 | 1.47 | glass | 6.5 | A |
| 47 | 500 | 300 | 400 | 8.0 | 0.19 | 1.43 | glass and Ni on glass | 9.0 | A |
| 48 | 500 | 300 | 400 | 8.0 | 0.26 | 1.62 | Ni on glass | 5.0 | A |
| 49 | 475 | 300 | 375 | 8.0 | 0.27 | 1.82 | glass | 1.0 | A |
| 50 | 500 | 300 | 400 | 8.0 | 0.15 | 1.66 | glass | 1.0 | B |
| 51 | 500 | 300 | 400 | 8.0 | 0.20 | 1.72 | glass | 3.0 | B |
| 52 | 525 | 300 | 400 | 8.0 | 0.21 | 1.54 | glass | 6.5 | B |
| 53 | 525 | 300 | 400 | 8.0 | 0.21 | 1.56 | Ni/Au/Ni 1000 A°/700 A°/500 A° | 7.0 | B |
| 54 | 500 | 300 | 400 | 8.0 | 0.20 | 1.51 | Ni/Au/Ni 1000 A°/700 A°/1000 A° | 8.5 | A |

There exist limiting conditions for the preparation of the dark films which transmit red light. If the temperatures in the two source zones are dropped slightly, as in run number 49 of Table XII, the amount of material formed, as manifested by the length of the deposit, drops dramatically. Similarly, subtle differences between the performance characteristics of two otherwise identical Model 54357S 3-zone furnaces require that in the second furnace (B), the temperature of the phosphorus source be raised to higher temperature (see run numbers 50, 51 and 52). Raising the phosphorus source temperature to 550° C. gives a good result, raising it to 525° C. gives a better result.

at 355° C. K source became plugged, deposit was bulk amorphous $KP_x$; for thin films of amorphous KP (FIG. 14 apparatus) Phosphorus at 500° C., Potassium at 400° C., and substrate at 300° C.

For thin films of $KP_{15}$, the Phosphorus source may be raised to 525° C. and amorphous $KP_{15}$ is still produced. If the Phosphorus source temperature is dropped to 475° C., the system does not yield $KP_{15}$. If the Potassium source temperature is dropped to 375° C., the system does not yield $KP_{15}$. The substrate temperatures may be raised to 315° C. and the system will still yield $KP_{15}$, but not if they are raised to 325° C.

Preparation of Polycrystalline Metal Polyphosphides in Large Amounts Via "Condensed Phase Synthesis"

Although not formed in a physical state appropriate to the tapping of their useful semiconducting properties, alkali-metal polyphosphides of the type $MP_{15}$, $MP_7$, and $MP_{11}$, can readily be prepared in gram or more quantities by a technique we call "condensed-phase" synthesis. Before using this technique, the reactants are generally brought in intimate contact by a ball-milling procedure. Decagram or more quantities of the elements are loaded in ball-mills, under dry nitrogen conditions, in the desired metal to phosphorus, atom to atom ratio, e.g. P/M 15 to 1 for $MP_{15}$. The sealed mills are then utilized for 40 or more hours to reduce the components to a well-mixed, homogeneous, free-flowing powder. The mills are generally heated during 20 hours or so of the milling, to about 100° C. This is done to increase the fluidity of metal component during the milling.

A portion of the milled mixture, generally 10 grams or more, is transferred to a quartz ampoule, under dry nitrogen conditions. The ampoule ranges in size from 2.5 cm in diameter by 6.5 cm in length, to 2.5 cm in diameter by 25 cm in length, depending on the charge size to be processed. The tube is sealed at reduced pressure (generally less than $10^{-4}$ Torr).

The reaction is carried out by subjecting the tube to an ever increasing temperature, under isothermal conditions, until the applied temperature reaches 500° or 525° C. By isothermal conditions we mean that the whole mass of material is always as nearly as practicable at the same temperature to prevent vapor transport from hot to cold portions which would result in non-uniform products. The highest soaking temperature is held for a substantial time, during which a powdery polycrystalline or crystalline product is formed. A typical soaking time is 72 hours. The longer the reaction, or soaking time, the more crystalline the product (as manifested by grain size, sharpness of X-ray powder-diffraction lines, etc). The hot tube is also taken through a cooling period (more than 10 hours) to ambient temperature. Slow cooling is not necessary for the reaction, but prevents tube breakage due to the different thermal coefficients of the products and the quartz ampoule.

Both the heat-up and cool-down periods have been observed to best be devised as relatively long (more than 10 hours) with soaking at intermediate temperatures (e.g., 200°, 300°, 400°, 450° C.) for 4-6 hours. Failure to follow these slow heat-ups or cool-downs often resulted in explosions of the reaction tubes. However, the products of the condensed phase reactions were the same as in slow cool down except that a small quantity of residual phosphorus would be white rather than red phosphorus.

EXAMPLE VIII 19.5 grams of a ball milled mixture of reagent grade phosphorus and potassium, in a atom to atom ratio of 15 to 1, was transferred into a 6.5 cm long by 2.5 cm diameter quartz tube, which tapered to a 8 cm long by 1.0 cm diameter section. The transfer was carried out under dry nitrogen conditions. The tube was sealed at reduced pressure ($1 \times 10^{-4}$ Torr) by fusing the narrow section a centimeter or so above the wider part of the tube.

The tube was supported in the center zone of a Lindberg Model 54357 three-zone furnace by a second quartz tube, or liner, which was, in turn, supported in the radial center of the heating chamber by asbestos blocks. The 3-zone furnace heating elements were driven by a Honeywell Model DCP-7700 Digital Control Programmer which enables processing to be preprogrammed and carried out in a reproducible fashion. Using the programmer, the reaction tube was subjected to the following temperatures for the indicated lengths of time: 100° C., 1 hr; 450° C., 6 hrs.; 500° C., 18 hrs.; 525° C., 72 hrs.; 300° C., 2 hrs.; and 200° C., 4 hrs. (When all three zones are controlled at the same temperature, the center zone is highly isothermal, with a temperature variance of less than 1° C. across the zone).

After the furnace cooled to ambient temperature, at the inherent cooling-rate of the furnace, the reaction tube was removed from the furnace. Under dry nitrogen conditions, the quartz ampoule was cut open using a silicon-carbide saw, and the dark purple, polycrystalline mass removed. A sample of the material was subjected to compositional analysis. Wet analysis gave a P/K ratio of about 14.2 to 1, which is accurate to about 6% of the theoretical value of 15 to 1. Products from similar runs on $K/P_{15}$ charges fell the same range values, as shown in Table XIII.

TABLE XIII

| REF. NO. | CHARGE RATIO | PRODUCT P/M | TOTAL PRODUCT % | CHARGE SIZE GRAMS | HIGHEST TEMP. °C. | TIME AT HIGH T. HRS. | TOTAL OVEN TIME HRS. | PRESSURE TORR** |
|---|---|---|---|---|---|---|---|---|
| 55 | $K/P_{15}$ | 15.3 | 85.5 | 5.5 | 500 | 120.5 | 140 | $1 \times 10^{-5}$ |
| 56 | $K/P_{15}$ | 15.5 | 99.0 | 21.2 | 525 | 305.0 | 320 | $5 \times 10^{-4}$ |
| 57 | $K/P_{15}$ | 16.2 | 97.2 | 9.2 | 525 | 266.0 | 380 | $5 \times 10^{-3}$ |
| 58 | $K/P_{15}$ (Pure) | 14.0 | 99.3 | 8.8 | 525 | 216.0 | 292 | $5 \times 10^{-4}$ |
| 59 | $K/P_{15}$ | 14.2 | 94.0 | 19.2 | 525 | 72.0 | 120 | $1 \times 10^{-4}$ |
| 60 | $K/P_{15}$ | 13.6 | 96.5 | 17.7 | 525 | 72.0 | 120 | $1 \times 10^{-4}$ |
| 61 | $K/P_{15}$ | 14.7 | 97.8 | 16.7 | 525 | 72.0 | 120 | $6 \times 10^{-4}$ |
| 62 | $Rb/P_{15}$ | 14.9 | 99.8 | 9.4 | 525 | 216.0 | 292 | $5 \times 10^{-4}$ |
| 63 | $Rb/P_{15}$ | 12.9 | 97.05 | 16.1 | 525 | 72.0 | 120 | N.D. |
| 64 | $Cs/P_{15}$ (Pure) | 15.5 | 95.5 | 13.9 | 500 | 120.0 | 390 | $5 \times 10^{-4}$ |
| 65 | $Cs/P_{15}$ (Pure) | N.D. | N.D. | 15.9 | 500 | 260.0 | 710 | $1 \times 10^{-5}$ |
| 66 | $Na/P_{15}$ | 19.2 | 97.7 | 9.1 | 525 | 216.0 | 292 | $5 \times 10^{-4}$ |
| 67 | $Na/P_{15}$ (Pure) | 14.9 | 92.7 | 13.5 | 500 | 260.0 | 710 | $1 \times 10^{-5}$ |
| 68 | $Li/P_{15}$ | 16.35 | 96.9 | 7.8 | 525 | 144.0 | 240 | $1 \times 10^{-4}$ |
| 69 | $Rb/P_7$ (Pure) | 6.2 | 96.8 | 16.3 | 500 | 72.0 | 130 | $1 \times 10^{-5}$ |
| 70 | $Rb/P_7$ (Pure) | N.D. | N.D. | 17.2 | 500 | 72.0 | 130 | $1 \times 10^{-4}$ |
| 71 | $Cs/P_7$ (Pure) | 7.1 | 96.2 | 18.6 | 500 | 72.0 | 130 | $1 \times 10^{-5}$ |
| 72 | $Cs/P_7$ (Pure) | N.D. | N.D. | 7.9 | 500 | 172.0 | 290 | $1 \times 10^{-4}$ |
| 73 | $Na/P_7$ | 6.5 | 93.6 | 11.5 | 500 | 168.0 | 360 | $1 \times 10^{-5}$ |

TABLE XIII-continued

| | | | CONDENSED PHASE PRODUCTS | | | | | |
|---|---|---|---|---|---|---|---|---|
| REF. NO. | CHARGE RATIO | PRODUCT P/M | TOTAL PRODUCT % | CHARGE SIZE GRAMS | HIGHEST TEMP. °C. | TIME AT HIGH T. HRS. | TOTAL OVEN TIME HRS. | PRESSURE TORR** |
| 74 | K/P$_{15}$ | N.D. | N.D. | 14.7 | 525 | 72.0 | 120 | $5 \times 10^{-4}$ |
| 75 | K/P$_{15}$ (Pure) | N.D. | N.D. | 16.1 | 525 | 144.0 | 240 | $1 \times 10^{-3}$ |
| 76 | K/P$_{15}$ | N.D. | N.D. | 31.9 | 500 | 169.0 | 330 | $5 \times 10^{-4}$ |
| 77 | K/P$_{15}$ | N.D. | N.D. | 28.4 | 525 | 144.0 | 240 | $5 \times 10^{-4}$ |
| 78 | K/P$_{15}$ | N.D. | N.D. | 36.4 | 525 | 144.0 | 240 | $1 \times 10^{-4}$ |
| 79 | K/P$_{15}$ | N.D. | N.D. | 32.1 | 525 | 72.0 | 124 | $1 \times 10^{-5}$ |

*Example
N.D. Not Determined
**When tube sealed

In addition, several samples from different runs were subjected to morphological analysis. The XRD powder diffraction patterns for these materials were readily matched to those obtained from the single crystal KP$_{15}$ samples produced by the vapor-transport methods cited elsewhere.

The methodology was carried over to other metal-phosphorus systems, as is indicated in the table. Comparisons of the XRD data of these materials, both with each other and that obtained on single crystals established the analogous nature of the products, i.e. they all have basically the same all parallel pentagonal tubes of covalently bonded phosphorus.

Milling Metals with Red Phosphorus

Introduction

We have utilized ball milling to prepare homogeneous, intimately contacted mixtures of red phosphorus with Group 1a and group 5a metals.

The milled products are relatively air stable and they provide conveniently handled starting materials for the previously described condensed phase and single source vapor transport techniques. Their stability indicates that polyphosphides have formed at least in part during the milling process.

Summary

The Group 1a metals (with the exception of lithium) have proved to ball mill easily with red phosphorus. The facility of milling becomes even more pronounced with the lower melting metals, typified by rubidium and cesium. A problem arises when the Group 1a M/P ratio is varied from 1/15 down to 1/7. The increased metal content generally results in severe agglomeration of the charge onto the walls of the ball mill. Fortunately, the agglomerated products are easily scraped from the mill and crushed through a 12 mesh sieve. Lithium and arsenic are somewhat difficult to mill using the standard ball milling procedure due to their hardness and higher melting points.

Reagent Purity

The initial experimental work used reagent grade metals and reagent grade phosphorus. We now use only high purity metals and electronic grade (99.999% and 99.9999% pure) red phosphorus obtained from Johnson Matthey.

Mode of Milling

A. Standard Ball Milling (Rotation)

This was originally the method of choice for the alkali M/P systems. However, we have used more intensive grinding processes (cryogenic and vibratory milling) for the other group 5a metals.

Figure 17:
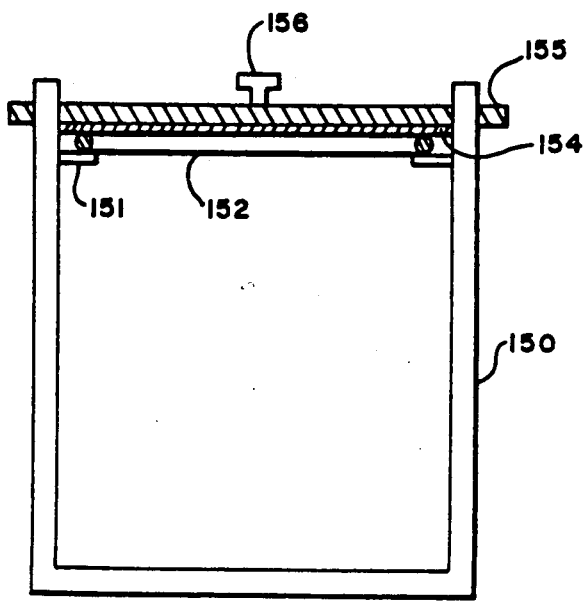
FIG. 17 is a diagrammatic view of a ball mill according to the invention.

The stainless steel ball mills were fabricated "in house" and as shown in FIG. 17 comprise a cylinder 150 with these dimensions —4.5" O.D. × 6" height × ¼" wall thickness. The top of the mill is provided with an inner flange 151 to accept a Viton O-ring 152. A stainless steel top 154 is held in place by a bar 155 tightened down with a screw 156.

One mill has smooth inside walls. The second mill was constructed with three baffles welded onto the walls from top to bottom. These act as lifters for the balls and reagents and result in more efficient grinding.

A total of less than 50–60 g reagent charge is desirable. Initial milling experiments used ¼" stainless steel balls; we have since achieved better results with a mixture of ¼" and ⅛" stainless steel balls.

Cryogenic Milling (−196° C.)

This was accomplished using the Spex freezer mill (available from Spex Industries, Metuchen, N.J.).

Due to equipment limitations, only small quantities (2–3 g) can be milled in a single operation—however, this can be done quickly at liquid nitrogen temperatures (in a matter of a few minutes). Thus, this technique finds applicability in reducing to powder form, the harder and higher melting metals such as lithium and arsenic. These can then be co-ground with red phosphorus in the rotating ball mill or vibratory mill.

Vibratory Milling

The equipment (Vibratom) is available from TEMA, Inc., Cincinnati, Ohio.

This is essentially a ball mill, but instead of using a rotating motion, circular vibrations are generated—similar to that of a paint shaker. The dimensions of the mill are 5 ¼" O.D. × 3.5" height × ⅛" wall thickness.

The mill does not contain baffles. We have used this mill for the difficult to mill elements such as As.

Time of Milling

There has been considerable variation here. Generally, the duration of hot milling is not less than 40 hrs. nor more than 100 hrs. To some extent, this has been determined by the system being milled. Less time is required for the lower melting Cs and Rb systems.

Temperature of Milling

This has either been at ambient temperature or the mills have been externally heated to approximately 100° C. with a heat lamp. Ambient temperatures are suitable for low melting point metals such as Cs (28.7° C.) and Rb (38.9° C.). External heat lamp application to 75°–100° C. for 3–4 hours was definitely beneficial for the Na (97.8° C.) and K (63.7° C.) systems. Heating to 100° C. was of no value with Li (108.5° C.). We conclude that stable products are the result of milling melted alkali metal and phosphorus.

Ball Milling of K/P$_{15}$

EXAMPLE IX (REFERENCE NO. 88, TABLE XIV)

Under nitrogen in a dry box, an unbaffled stainless steel ball mill containing 884 g of ¼" stainless steel balls was charged with 6.14 g (0.157 mole) 99.95% pure K (from United Mineral and Chem. Co.) and 72.95 g (2.36 mole) of 99.9999% pure red P (from Johnson Matthey Chemicals). The mill was sealed and rotated on a roll station for a total of 71 hours. The mill was heated to approximately 100° C. for 4 hours by playing a heat lamp on its surface. The mill contents were discharged in the dry box to a 12 mesh sieve and pan. No agglomeration of the product was observed. The steel balls were separated from the product on the sieve. A total of 76.4 g of black powder product was obtained.

Ball Milling of Cs/P$_7$

EXAMPLE X (REFERENCE NO. 115, TABLE XIV)

Under nitrogen in a dry box, a baffled stainless steel ball mill containing 450 g ¼" and 450 g ⅛" stainless steel balls was charged with 12.12 g (0.0912 mole) of 99.98% pure Cs (from Alfa/Ventron Corp.) and 19.77 g (0.638 mole) of 99.999% pure red P (from Johnson Matthey Chemicals). The mill was sealed and rotated on a roll station for 46.5 hours at ambient temperature. (no external heat source applied). Upon opening the mill in the dry box, almost total agglomeration of the product was observed on the mill walls. This material was scraped off with a spatula and discharged to a 12 mesh sieve and pan. The chunks of product were then crushed through the sieve. A total of 27.8 g of product was collected in the pan.

Table XIV summarizes the results of milling various metals with red phosphorus. As previously noted, these materials are surprisingly stable.

TABLE XIV

MILLING OF METALS WITH RED PHOSPHORUS

| REF. NO. | *MODE OF MILLING | CHARGE RATIO (ATOM) | WEIGHT AND REAGENT PURITY | | REAGENT SUPPLIER |
|---|---|---|---|---|---|
| 80 | BM(a,e) | K/P$_{125}$ | 0.15 g | K-reagent grade | J. T. Baker |
|  |  |  | 15 g | P-reagent grade | J. T. Baker |
| 81 | BM(a,e) | K/P$_{30}$ | 1.00 g | K-reagent grade | J. T. Baker |
|  |  |  | 23.8 g | P-reagent grade | J. T. Baker |
| 82 | BM(a,e) | K/P$_{15}$ | 1.69 g | K-reagent grade | J. T. Baker |
|  |  |  | 20 g | P-reagent grade | J. T. Baker |
| 83 | BM(a,e) | K/P$_{15}$ | 4.20 g | K-reagent grade | J. T. Baker |
|  |  |  | 50 g | P-reagent grade | J. T. Baker |
| 84 | BM(a,e) | K/P$_{15}$ | 4.20 g | K-reagent grade | J. T. Baker |
|  |  |  | 50 g | P-reagent grade | J. T. Baker |
| 85 | BM(a,e) | K/P$_{15}$ | 2.68 g | K-99.95% | United Min.-Chem |
|  |  |  | 31.8 g | P-99.9999% | Johnson Matthey |
| 86 | BM(a,e) | K/P$_{15}$ | 4.20 g | K-reagent grade | J. T. Baker |
|  |  |  | 50 g | P-reagent grade | J. T. Baker |
| 87 | BM(a,e) | K/P$_{15}$ | 4.20 g | K-reagent grade | J. T. Baker |
|  |  |  | 50 g | P-reagent grade | J. T. Baker |
| 88 | BM(a,e) | K/P$_{15}$ | 6.14 g | K-99.95% | United Min-Chem |
|  |  |  | 72.95 g | P-99.9999% | Johnson Matthey |
| 89 | BM(c) | K/P$_{15}$ | 6.14 g | K-reagent grade | J. T. Baker |
|  |  |  | 72.95 g | P-reagent grade | J. T. Baker |
| 90 | BM(c,d) | K/P$_{15}$ | 5 g | K-reagent grade | J. T. Baker |
|  |  |  | 59.4 g | P-reagent grade | J. T. Baker |
| 91 | BM(b,e) | K/P$_{11}$ | 4.89 g | K-99.95% | United Min-Chem |
|  |  |  | 42.61 g | P-about 99.95% | Atomergics Chemetals |
| 92 | BM(c,d) | K/P$_7$ | 5 g | K-reagent grade | J. T. Baker |
|  |  |  | 27.72 g | P-reagent grade | J. T. Baker |
| 93 | BM(b,d) | K/P$_7$ | 7 g | K-reagent grade | J. T. Baker |
|  |  |  | 38.8 g | P-reagent grade | J. T. Baker |
| 94 | BM(b,e) | K/P$_7$ | 10 g | K-reagent grade | J. T. Baker |
|  |  |  | 55.45 g | P-about 99.95% | Atomergic Chemetals |
| 95 | BM(b,d) | K/P$_7$ | 5.18 g | K-99.95% | Alfa/Ventron |
|  |  |  | 28.72 g | P-99.999% | Johnson Matthey |
| 96 | BM(b,e) | K/P$_5$ | 8 g | K-reagent grade | J. T. Baker |
|  |  |  | 31.68 g | P-approx. 99.95% | Atomergic Chemetals |
| 97 | BM(a,e) | K/As$_2$/P$_{13}$ | 2.5 g | K-reagent grade | J. T. Baker |
|  |  |  | 9.58 g | As-99.9% | Alfa/Ventron |
|  |  |  | 25.74 g | P-reagent grade | J. T. Baker |
| 98 | BM+CM+VM (b,e)(a,e) | K/As$_4$/P$_{11}$ | 3.35 g | K-99.95% | Alfa/Ventron |
|  |  |  | 25.68 g | As lump-99.9999 | Johnson Matthey |
|  |  |  | 29.19 g | P-99.999% | Johnson Matthey |
| 99 | BM(c,d) | K/As$_7$/P$_7$ | 2.5 g | K-reagent grade | J. T. Baker |
|  |  |  | 33.53 g | As powder-99.9% | Alfa/Ventron |
|  |  |  | 13.86 g | P-reagent grade | J. T. Baker |
| 100 | BM | K/Bi$_2$/P$_{13}$ | 2.16 g | K-99.95% | Alfa/Ventron |
|  |  |  | 23.08 g | Bi-99.9999% | Alfa/Ventron |
|  |  |  | 22.23 g | P-99.9999% | Johnson Matthey |

TABLE XIV-continued

| | | | | | |
|---|---|---|---|---|---|
| 101 | BM(b,d) | K/Sb$_2$/P$_{13}$ | 3.18 g | K-99.95% | Alfa/Ventron |
| | | | 19.80 g | Sb-99.9999% | Alfa/Ventron |
| | | | | | (−100 mesh) |
| | | | 32.74 g | P-99.999% | Johnson Matthey |
| 102 | BM(a,e) | Na/P$_{15}$ | 1 g | Na-reagent grade | J. T. Baker |
| | | | 20.2 g | P-reagent grade | J. T. Baker |
| 103 | BM(d) | Na/P$_{15}$ | 1.92 g | Na-99.95% | Alfa/Ventron |
| | | | 38.8 g | P-99.999% | Johnson Matthey |
| 104 | BM(b) | Na/P$_{11}$ | 5.89 g | Na-99.95% | United Min-Chem |
| | | | 87.28 g | P-approx. 99.95% | Atomergic Chemetals |
| 105 | BM(b) | Na/P$_7$ | 6.28 g | Na-99.95% | United Min-Chem |
| | | | 59.21 g | P-approx. 99.95% | Atomergic Chemetals |
| 106 | BM(a,e) | Li/P$_{19.05}$ | 0.8 g | Li-99.9% | Alfa/Ventron-rod |
| | | | 53.56 g | P-reagent grade | J. T. Baker |
| 107 | BM(b) | Li/P$_{9.65}$ | 1.6 g | Li-99.9% | Alfa/Ventron-(shot) |
| | | | 49.99 g | P-approx. 99.95% | Atomergic Chemetals |
| 108 | BM(a,e) | Rb/P$_{15}$ | 5.56 g | Rb-99.93% | Alfa/Ventron |
| | | | 30.22 g | P-reagent grade | J. T. Baker |
| 109 | BM(a,e) | Rb/P$_{15}$ | 5.74 g | Rb-99.93% | Alfa/Ventron |
| | | | 31.2 g | P-99.999% | Johnson Matthey |
| 110 | BM(b,e) | Rb/P$_7$ | 11.22 g | Rb-99.93% | Alfa/Ventron |
| | | | 28.46 g | P-99.999% | Johnson Matthey |
| 111 | BM | Cs/P$_{15}$ | 14.47 g | Cs-99.98% | Alfa/Ventron |
| | | | 50.58 g | P-99.9999% | Johnson Matthey |
| 112 | BM(b,d) | Cs/P$_{15}$ | 5.82 g | Cs-99.98% | Alfa/Ventron |
| | | | 20.34 g | P-99.999% | Johnson Matthey |
| 113 | BM(b,d) | Cs/P$_7$ | 12.30 g | Cs-99.98% | Alfa/Ventron |
| | | | 20.06 g | P-99.999% | Johnson Matthey |
| 114 | BM(b,d) | Cs/P$_7$ | 12.36 g | Cs-99.98% | Alfa/Ventron |
| | | | 20.16 g | P-99.999% | Johnson Matthey |
| 115 | BM(b,d) | Cs/P$_7$ | 12.12 g | Cs-99.98% | Alfa/Ventron |
| | | | 19.77 g | P-99.999% | Johnson Matthey |

MILLING OF METALS WITH RED PHOSPHORUS

| REF. NO. | TOTAL MILLING TIME (HRS) | TEMPERATURE | RESULTS |
|---|---|---|---|
| 80 | 42.0 | ambient | 12.6 g powder-no agglomeration |
| 81 | 50.0 | ambient | 22.7 g powder-slight agglomeration |
| 82 | 41.0 | ambient | 19.7 g powder-no agglomeration |
| 83 | 94.5 | ambient | 52.4 g powder-slight agglomeration |
| 84 | 66.0 | 98° C. (66 hrs) | 49.9 g powder-no agglomeration |
| 85 | 94.5 | 108° C. (3.5 hrs) | 28.6 g powder-1.8 g unmilled P-no agglomeration |
| 86 | 43.5 | 75° C. (43.5 hrs) | 52.6 g powder-no agglomeration |
| 87 | 88.0 | 75° C. (65.5 hrs) | 54.0 g powder-no agglomeration |
| 88 | 71.0 | 100° C. (4 hrs) | 76.4 g powder |
| 89 | 41.5 | 100° C. (3 hrs) | 154.8 g powder (0.43 g unmilled K) |
| 90 | 46.5 | 100° C. (4 hrs) | 63 g powder-no agglomeration |
| 91 | 79.0 | 100° C. (1 hr) | 44.6 g powder-no agglomeration |
| 92 | 49.0 | 100° C. (3 hrs) | 30.2 g powder crushed thru 12 mesh sieve-severe agglomeration |
| 93 | 69.0 | 100° C. (3 hrs) | 43.7 g agglomeration? |
| 94 | 48.5 | 100° C. (4 hrs) | 62.6 g crushed thru 12 mesh sieve-considerable agglomeration |
| 95 | 48.0 | 100° C. (3 hrs) | 29.7 g crushed thru 12 mesh sieve-severe agglomeration |
| 96 | 52.0 | 100° C. (3 hrs) | 36.2 g crushed thru 12 mesh sieve-severe agglomeration |
| 97 | 66.5 | 101° C. (66.5 hrs) | 36.0 g powder-no agglomeration |
| 98 | 1) 285 BM | 100° C. (2.5 hrs) | As did not mill |

TABLE XIV-continued

| | | | |
|---|---|---|---|
| | 2) 94 VM | ambient | As still did not mill |
| | 3) separated out As & cryo-milled (Spex Mill) (CM) | 4,2min.cycles at −196° C. | As finally divided |
| | 4) recombine & ball mill 50 hrs | ambient | no agglomeration |
| 99 | 68.5 | approx. 100° C. (3 hrs) | powder-no agglomeration |
| 100 | 133.0 | approx. 100° C. (3 hrs) | 46.4 g crushed thru 12 mesh sieve-considerable agglomeration |
| 101 | 115.5 | ambient | 54.4 g powder-no agglomeration-some shock sensitivity |
| 102 | 72.0 | 106° C. (23 hrs) | 19.6 g powder (no agglomeration) |
| 103 | 88.0 | approx. 100° C. (6.5 hrs) | 39.3 g powder (no agglomeration) |
| 104 | 108.5 | approx. 100° C. (4 hrs) | 91.5 g powder (no agglomeration) |
| 105 | 70.0 | ambient | 63.9 g powder (no agglomeration) |
| 106 | 67.5 | approx. 100° C. (67.5 hrs) | 52.5 g powder (0.17 g unmilled Li) |
| 107 | 70.0 | ambient | 50.36 g powder (0.44 g unmilled Li) |
| 108 | 69.0 | ambient | powder (no agglomeration) |
| 109 | 115.5 | ambient | 35.7 g powder (no agglomeration) |
| 110 | 48.0 | ambient | 36.2 g crushed thru 12 mesh sieve-almost total agglomeration |
| 111 | 47.5 | ambient | 60.2 g crushed thru 12 mesh sieve-considerable agglomeration |
| 112 | 67.0 | ambient | 23.76 g powder (no agglomeration) |
| 113 | 48.0 | ambient | 29.1 g crushed thru 12 mesh sieve-severe agglomeration |
| 114 | 88.5 | ambient | 26.5 g crushed thru 12 mesh sieve-severe agglomeration |
| 115 | 46.5 | ambient | 27.8 g crushes thru 12 mesh sieve-almost 100% agglomeration |

BM Ball Milling
CM Cryo Milling
VM Vibratory Milling

Analysis of Products

Table XV summarizes the various $MP_x$ ($X=15$ and x much greater than 15, the new form of phosphorus) materials synthesized from vapor transport with one source (1S-VT), from vapor transport with two source (2S-VT), condensed phase processes and chemical vapor deposition (CVD).

TABLE XV

| | $MP_x$ M = Li, Na, K, Rb, Cs | | |
|---|---|---|---|
| X | | X = 15 | X much greater than 15 |
| 1S-VT | single crystals | X | X |
| | poly. | | B, TF |
| | amorphous | | B |
| 2S-VT | single crystals | | |
| | poly. | TF | TF |
| | amorphous | TF | B |
| Condensed Phase | single crystals | X | |
| | poly. | B* | |
| CVD | amorphous | TF | |

X: = crystals/whiskers
B: = Bulk greater than 10 micrometers thick
TF: = Thin film less than 10 micrometers thick
B* = Powder The materials obtained from these techniques were crystals or whiskers, referred to as X; solid polycrystalline bulk, referred to as B; solid thin film, referred to as TF; solid amorphous, referred to as B and TF; and bulk powder from condensed phase synthesis referred to as B*.

The analysis of $MP_{15}$ crystalline materials was given above with reference to FIGS. 7-10. As indicated in Table XV, the polycrystalline and amorphous $MP_{15}$ materials have only been produced in the form of thin films.

Figure 18:
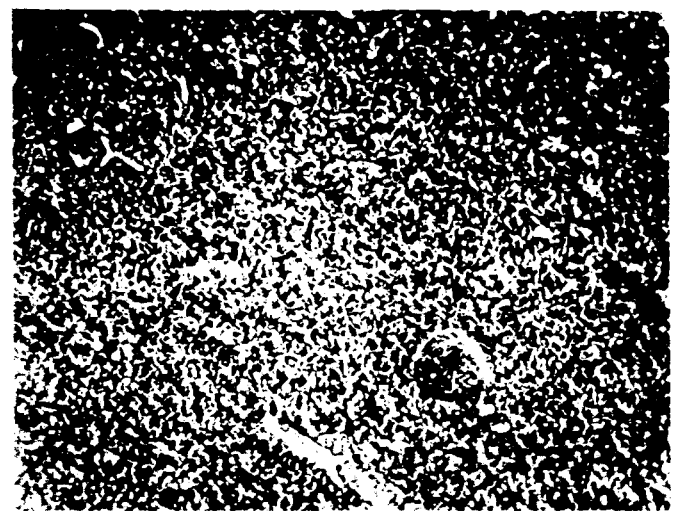
FIGS. 18, 19 and 20 are scanning electron micrographs (SEM's) of a film of a new form of phosphorus $MP_x$ where x is much greater than 15.
Figure 19:
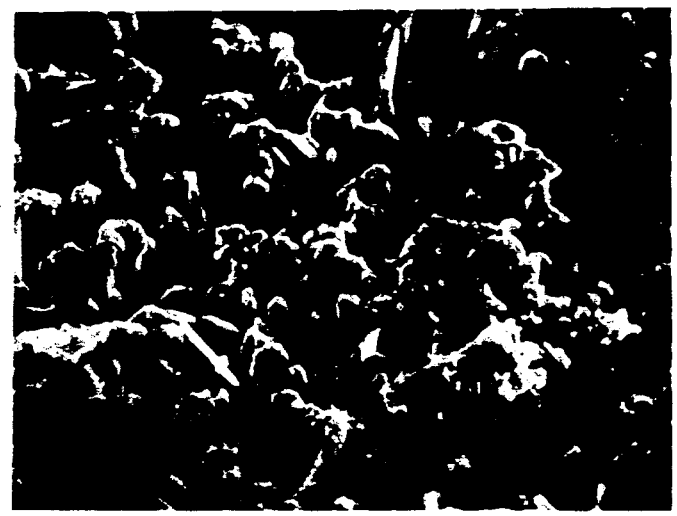
Figure 20:

Polycrystalline bulk and thin films of $KP_x$ (x much greater than 15) were obtained by vapor transport (one source and two sources). These polycrystalline thin films nucleate on a glass substrates (or glass walls) and show dense packing of parallel whiskers growing perpendicular to the substrate. SEM photomicrographs, FIGS. 18, 19, and 20 of such materials show a large physical separation between the $KP_x$ whiskers.

These polycrystalline thin films are formed at low temperatures from around 455° C. to 375° C. where the amorphous phase begins to form.

Analysis on these materials wet chemical, XRD and EDAX consistently show x to be much greater than 15 (typically greater than 1000). A typical powder XRD diagram fingerprint of crystalline $MP_x$ much greater than 15) is shown in FIG. 10.

As indicated in Table XV, amorphous $MP_x$ materials can be formed in bulk form (boules) by the vapor transport techniques. These boules are formed in the narrow end 160 of tube 32 (FIGS. 1 and 2), the narrow end 162 of tube 58 of FIG. 3, or as pieces of material in zone 2 of FIG. 16. These materials show no X-ray diffraction peaks.

XRD powder diagrams were used in our study to characterize the degree of amorphicity of the materials obtained by these techniques. These amorphous $MP_x$ materials where x is much greater than 15 can be cut, lapped and polished using conventional semiconductor techniques for wafers processing. This is even true of material containing no more than 50 to 500 parts per million of M, a new form of phosphorus.

The resulting high x, $KP_x$ amorphous wafers or substrates were shown to have useful semiconductor properties with electro-optical response almost identical with whiskers of $KP_{15}$. We therefore conclude that the local order of all $MP_x$ materials where x=15 or is very much greater than 15 (when solidified in the presence of alkali metal) exhibit the same local order substantially throughout their extent. This local order is the all parallel pentagonal phosphorus tubes.

Amorphous high x, $KP_x$ materials were prepared with mirror finish surfaces for electro-optical evaluation. Routine surface preparation of these amorphous materials includes several processing steps such as cutting, embedding, lapping polishing and chemical etching. Surface work damage induced during such processing steps are known to affect the electro-optical performance of semiconductor materials. Therefore, attention was focused on assessing techniques and processing steps leading to a "damage free" surface. The following processing steps have been found to be suitable for the preparation of high quality mirror finish surfaces.

Embedded boules of high x, $KP_x$ (about 1 to 2 cm in length) from Table VII were cut with a slow speed diamond saw using minimum pressure. Each wafer was sliced to a thickness of approximately 1 mm. The wafer was then immersed in a bromine/$HNO_3$ solution. To remove sufficient cutting damage the thickness of each wafer was reduced by this chemical etching by approximately 50 micrometers. The wafers were then washed and checked for inclusions and voids. The high x, $KP_x$ amorphous material appears to be void free.

A standard low temperature wax (melting point about 80° C.) was used to mount the high x, $KP_x$ wafers onto a polishing block. The wafers were then lapped at 50 rpm at 2 minute intervals individually with a 400 and 600 SiC grit using distilled water as a lubricant with a 50 $g/cm^2$ weight until a smooth surface was achieved.

The final polishing step was carried out for one hour at 50 rpm with 50 $g/cm^2$ weight on a Texmet cloth with 3 micrometers diamond compound and lapping oil as extender. This polishing step was followed by an additional fifteen minute polishing step at 50 rpm with 50 $g/cm^2$ weight on a microcloth with a slurry of 0.05 micrometers of gamma alumina suspension in distilled water. All procedures require scrupulous in between cleaning steps in a sonic bath with subsequent rinsing and drying.

Samples prepared by this technique have a high quality mirror finish surface. The final polishing step was performed on standard metallographic Buehler polishing equipment.

Chemical etching plays a prominent role in wafer preparation, surface treatment, pre-device preparation, metallization and device processing.

Numerous review articles are available covering the chemistry and the practical aspects of etching processes. However, most information on specific etchants is widely scattered throughout the scientific literature. An attempt was made to bring together essential information that should be useful to the selection of an etching process relevant to these amorphous high x materials. Special attention was placed on etching procedures and processes used for surface preparation. It was found that some of the etching solutions and procedures currently used for GaP and InP are applicable but with different etching rates.

The following etching solutions were selected and tested:

5-10% $Br_2$ 95-90% $CH_3OH$ for general etching and polishing

1% $Br_2$, 99% $CH_3OH$ for polishing high quality surface (approximately 1 micron/minute)

5% by weight NaOCl solution for chemical polishing

1 HCl: 2 $HNO_3$ (1% $Br_2$) for removing work damage after cutting and lapping

1 HCl: 2 $HNO_3$ for removing surface layer.

Several samples were prepared for optical absorption measurements. The above technique was used to slice and polish on both sides amorphous wafers of high x material as thin as 0.5 mm. Reference samples of GaP and GaAs crystals were also polished on both sides and used to measure the band gap by optical absorption.

Etching techniques were developed to reveal microstructures and to thin down small areas to 0.2 mm thick for optical absorption.

Several etching solutions were selected and tested. The best chemical solution was found to be a mixture of 6.0 g potassium hydroxide, 4 g red potassium ferric cyanide and 50 ml distilled water at 70° C. Application to reveal an etching pattern takes less than 60 seconds. This solution is very stable and can be used with reproducible etching rates.

After embedding, cutting and polishing, several samples of amorphous $KP_x$, (x much greater than 15) from Tables VII and VIII have been etched. Typical microstructures were revealed from this chemical etching treatment after 30 seconds.

Figure 21:
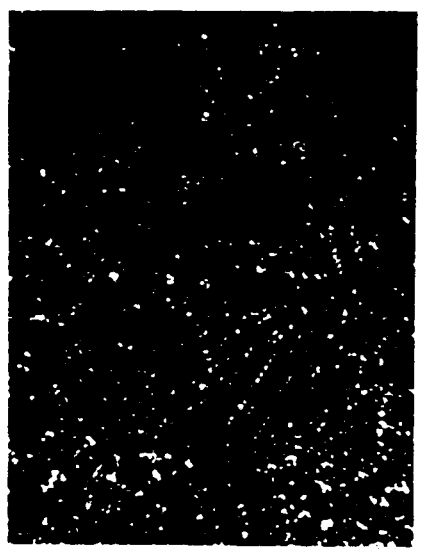
FIG. 21 is a photomicrograph of an etched amorphous surface of such high x $MP_x$ synthesized by single source vapor transport according to the invention.

FIG. 21 is a photomicrograph at 360 magnification of the etching pattern on a surface cut perpendicular to the axis of an amorphous boule of high x material grown by single source vapor transport (Reference No. 28, Table VII) showing honeycomb microstructures with well defined domains a few microns in size. These honeycomb microstructures are characteristic for an etching pattern on a material having a two dimensional atomic framework (such as parallel tubes).

Figure 22:
FIG. 22 is an photomicrograph of an etched amorphous surface of such high x $MP_x$ synthesized by two source vapor transport according to the invention.

FIG. 22 is a photomicrograph at 360 magnification of the etching pattern on a surface cut perpendicular to the axis of growth of the amorphous high x material grown by two source vapor transport in Example VI. FIG. 23 is a photomicrograph of the same etched surface as shown in FIG. 22 at 720 magnification. FIG. 24 is a photomicrograph at 360 magnification of an etched surface perpendicular to the surface shown in FIGS. 22 and 23 and shows an etching pattern characteristic of tubular packing.

Thus we conclude from the available evidence that our $MP_x$ materials where M is an alkali metal where x is much greater than 15, i.e. where the amount of alkali metal is as little as 50 parts per million all have as their local order the all parallel pentagonal phosphorus tubes either all parallel (the $MP_{15}$ form) or double alternating perpendicular layer (monoclinic phosphorus).

Electro-Optical Characterization of High Phosphorus Materials from One Source Vapor Transport The electro-optical characterization was carried out on single crystal whiskers, on polycrystalline films, and amorphous films and boules. The characterization consists of (1) optical measurements on samples with no electrical contacts (absorption edge, photoluminescence) (2) electrical measurements with simple contacts of linear behavior (conductivity, temperature dependent conductivity, photoconductivity, wavelength dependence of photoconductivity, conductivity type) (3) electrical measurements with non-linear or rectifying contacts with metals which are indicative of the semiconducting behavior.

From the above data we extracted the properties which indicate that all materials produced have electrical criteria for useful semiconductors, that is, they all have an energy band gap from 1-3 eV; conductivity between $10^{-5}$–$10^{-12}$ $(ohm-cm)^{-1}$; a photoconductivity ratio from 100 to 10,000, and chemical and physical stability under ambient operating conditions.

Measurements were carried out on the following equipment:
(1) Absorption edge - Zeiss 2 beam IR and visible spectrometer
   Photoluminescence - Low temperature (4° K.) cryostat and laser excitation
(2) Conductivity - 2 probe and 4 probe measurements
   Temperature Dependent conductivity - from 300° K. to 550° K. in an evacuated chamber
   Photoconductivity - with light source of approximately 100 mW/cm$^2$
   Wavelength dependent photoconductivity - Xe lamp light source and monochromator
   Conductivity type - thermoelectric power measurement with hot and cold probes
(3) wet silver paint was used to provide a temporary junction to materials, with a photovoltaic open voltage of 0.2 V measured under illumination.

Metallic and pressure contacts forming junctions were evaluated for their current voltage characteristics on a Tektronix curve tracer.

Data on samples from the broad class of materials under investigation is summarized in Tables XVI, XVII, XVIII and XIX.

Table XVI summarizes the basic physical, chemical and electro-optical properties of the prototype material, namely $KP_x$, x ranging from 15 to much greater than 15, in various physical forms and chemical composition.

TABLE XVI

| | Typical data on material obtained by single source vapor transport from $K/P_{15}$ starting charge | | |
|---|---|---|---|
| PROPERTIES | SINGLE CRYSTAL ($KP_{15}$) | POLYCRYSTALLINE ($KP_x$) x much greater than 15 | AMORPHOUS ($KP_x$) x much greater than 15 |
| Electro-Optical | | | |
| Conductivity $(ohm-cm)^{-1}$ | $10^{-7}$–$10^{-8}$ | $10^{-7}$–$10^{-8}$ | $10^{-8}$ |
| Photoconductivity (Light/Dark) (ratio) | $10^2$–$10^4$ | $10^2$ | $10^2$ |
| Photoconductivity Peak at | 1.4–1.8 eV | 1.4–1.8 eV | 1.4–1.8 eV |
| Activation Energy (2 Eg) from temperature dependence of conductivity | 1.2 eV | 1.4 eV | 1.6 eV |
| Absorption Edge | 1.8 eV | 1.4 eV | — |
| Luminescence, 4° K. | 1.8 eV | — | — |
| Luminescence, 300° K. | 1.7 eV | 1.7 eV | |
| Type | — | n-Type | n-Type |
| Photovoltaic (Open Circuit Voltage) | — | 0.2 eV | — |
| Thermal | | | |
| DTA Sharp endotherm | 630° C.-first heat 630° C.-second heat | 615-first heat 590-second heat | 590-first heat 590-second heat |
| TGA | 450° C. | — | — |
| Decomposition Temperature (Mass Spectrometer) | 450° C. | — | — |
| 400° C./3 hrs. | Stable up to 450° C. | Stable up to 400° C. | Stable up to 350° C. |

TABLE XVI-continued

Typical data on material obtained by single source
vapor transport from $K/P_{15}$ starting charge

| PROPERTIES | SINGLE CRYSTAL ($KP_{15}$) | POLYCRYSTALLINE ($KP_x$) x much greater than 15 | AMORPHOUS ($KP_x$) x much greater than 15 |
|---|---|---|---|
| Chemical Reagent Room Temp.-3 hrs. | | | |
| 85% $H_3PO_4$, 95% $H_2SO_4$ | Stable | Stable | Stable |
| 50% HF, 37.5% HCl, 50% NaOH | Stable | Stable | Stable |
| Boiling $H_2O$ 1 hr. | Stable | Stable | Stable |

Stability is based upon visual inspection.
DTA) Differential thermal analysis
TGA) Thermal gravimetric analysis Table XVII shows the properties of Group 1a (alkali metal) polyphosphides of various compositions and physical form. We observed that the electro-optical properties are independent of the metal whether it be Li, Na, K, Rb, Cs; physical form - crystal, polycrystal, amorphous (boule or film); and chemical composition, x = 15 or much greater than 15.

Table XVIII summarizes the properties of mixed polyphosphides and shows those formed of mixed alkali metals have no substantial changes in properties; partial substitution of As on P sites is possible and produces a reduction in resistivity and possibly in the band gap (i.e. substitutional doping).

TABLE XVIII

Mixed Polyphosphides - electro-optical properties

| MATERIAL | CHEMICAL STARTING CHARGE | X-RAY POWDER PATTERN | CONDUCTIVITY $(OHM-CM)^{-1}$ | PHOTOCONDUCTIVITY RATIO | BANDGAP eV |
|---|---|---|---|---|---|
| $K_yNa_{1-y}P_x$ | | | | | |
| crystalline | $K_{12}/Na/P_{160}$ | A | $10^{-8}-10^{-9}$ | $10^2$ | 1.8-2 |
| $K_yLi_{1-y}P_x$ | | | | | |
| crystalline | $K_6Li_2/P_{80}$ | A | $10^{-9}$ | $10^2$ | 1.8 |
| $Na_yRb_{1-y}P_x$ | | | | | |
| crystalline | $Na/Rb/P_{30}$ | A | $10^{-8}$ | $10^2$ | 1.8 |
| amorphous | $Na/Rb/P_{30}$ | amorphous | $10^{-9}$ | $10^2$ | 1.8-2 |
| $K_yAs_zP_{x-z}$ | | | | | |
| crystalline | $K/As_2/P_{13}$ | A | $10^{-9}$ | 10 | 1.8 |
| amorphous | $K/As_2/P_{13}$ | amorphous | $10^{-7}$ | $10^2$ | approx. 1.6 |
| $K_yAs_zP_{x-z}$ | | | | | |
| crystalline | $K/As_{11}/P_4$ | A | $10^{-9}$ | $10^2$ | 1.8 |

A = pattern similar to crystalline $KP_{15}$

Table XIX summarizes materials and properties obtained from different starting charge ratios. We find that the best properties are obtained with materials formed from starting charge proportions of P to K of about 15 (i.e. between 10 to 30). Below 10 the yield decreases; above 30 the physical properties of the amorphous boules begin to deteriorate.

TABLE XVII

Polyphosphide - structural and electro-optical properties
A = pattern similar to $KP_{15}$
B = pattern similar to $KP_x$ where x is much greater than 15

| MATERIALS | CHEMICAL ANALYSIS | X-RAY POWDER DIFFRACTION PATTERN | CONDUCTIVITY $(OHM-CM)^{-1}$ | PHOTO-CONDUCTIVITY RATIO | BANDGAP (eV) |
|---|---|---|---|---|---|
| M = K | | | | | |
| cyrstalline | $KP_{15}$ | A | $10^{-8}-10^{-9}$ | $10^2-10^3$ | 1.8 |
| polycrystalline | $KP_x$ x >> 15 | B | $10^{-7}-10^{-9}$ | $10^2$ | 1.8-2.0 |
| amorphous | $KP_x$ x >> 15 | amorphous | $10^{-8}-10^{-9}$ | $10^2$ | 1.8-2.0 |
| M = Na | | | | | |
| cyrstalline | $NaP_{15}$ | A | $10^{-8}$ | $10^2$ | 1.8 |
| polycrystalline | $NaP_x$ x >> 15 | B | $10^{-7}$ | $10^1-10^2$ | 1.8 |
| amorphous | $NaP_x$ x >> 15 | amorphous | $10^{-7}-10^{-9}$ | $10^3$ | 1.8 |
| M = Rb | | | | | |
| crystalline | $RbP_{15}$ | A | $10^{-7}-10^{-8}$ | $10^2$ | 1.8 |
| polycrystalline | | | | | |
| amorphous | | | | | |
| M = Cs | | | | | |
| crystalline | $CsP_{15}$ | A | $10^{-8}$ | $10^2$ | 1.8 |
| polycrystalline | | | | | |
| amorphous | | | | | |

TABLE XIX $KP_x$ from different starting charges analyzed in Tables IX, X, and XI above

| STARTING CHARGE | CHEMICAL ANALYSIS | X-RAY POWDER PATTERN | CONDUCTIVITY $(ohm-cm)^{-1}$ | PHOTO-CONDUCTIVITY RATIO |
|---|---|---|---|---|
| $K/P_{15}$ reagent | | | | |
| crystalline | $x = 15$ | A | $10^{-8}$–$10^{-9}$ | $10^2$–$10^3$ |
| polycrystalline | $x \gg 15$ | B | $10^{-7}$–$10^{-9}$ | $10^2$ |
| amorphous | $x \gg 15$ | amorphous | $10^{-8}$–$10^{-9}$ | $10^2$ |
| $K/P_{15}$ pure | | | | |
| crystalline | $x = 15$ | A | $10^{-9}$ | $10^2$ |
| polycrystalline | $x \gg 15$ | B | $10^{-8}$ | $10^2$ |
| amorphous | $x \gg 15$ | amorphous | $10^{-8}$ | $10^3$ |
| $K/P_{30}$ | | | | |
| crystalline | $x = 15$ | A | $10^{-9}$ | $10^2$ |
| polycrystalline | $x \gg 15$ | B | $10^{-9}$ | $10^2$–$10^3$ |
| amorphous | $x \gg 15$ | | | |
| $K/P_5$ | | | | |
| crystalline | $x = 15$ | A | $10^{-9}$ | 10 |
| polycrystalline | $x \gg 15$ | B | $10^{-8}$ | 10 |
| amorphous | | | | |
| $K/P_{125}$ | | | | |
| crystalline | | | | |
| polycrystalline | | | | |
| amorphous | $x \gg 15$ | | poor physical properties | |

A = pattern similar to crystalline $KP_{15}$
B = pattern similar to crystalline $KP_x$ We conclude that all these materials in whatever form have a band gap between 1 and 3 eV, more particularly in a range from 1.4 to 2.2 eV, since 1.4 eV is the lowest photoconductivity peak we measured and 2.2 eV is the estimated band gap of red phosphorus The data further indicates that the band gap of the best form of these materials is approximately 1.8 eV. Furthermore, their surprising high photoconductivity ratios of from 100 to 10,000 indicate that they are very good semiconductors.

Doping

Bulk amorphous $MP_x$ boules obtained by single source vapor transport (Tables VI, VII, X and XI above) in our three zone furnace having a composition x much greater than 15 can be processed by cutting, lapping, polishing, and etching into high quality, mirror finish wafers of about 0.5 cm diameter.

It is on these samples that we have been able to perform electrical measurements with different geometrical arrangements of electrical contacts to determine accurately the bulk conductivity of the materials. By 2 probe and 4 probe measurements, we ascertained the bulk conductivity of these materials to be $10^{-8}$ to $10^{-9}$ $(ohm-cm)^{-1}$. This conductivity is too low for the material to be able to form a sharp junction with rectifying properties. Therefore, it was our aim to find a foreign element (dopant) which would affect the conduction mechanism in the material and increase conductivity. As is typical of other amorphous semiconductors, the presence of small amounts of impurities in the material do not affect the conductivity and, above room temperature, we find intrinsic behavior with an activation energy equal to approximately half the bandgap, indicative of a midgap Fermi level. The low conductivity and large photoconductivity ratio indicate a small number of dangling bonds. This indicates that a strong perturbation of the electronic wave function of the P—P bond will be required to modify the conductivity and conductivity type.

Two approaches were taken: (1) substitute As or Bi into the P site; (2) diffuse a foreign element into the amorphous matrix.

In the first method $K/As_2P_{13}$ has As incorporated into the matrix. The conductivity is increased by 2 orders of magnitude (Table XVIII), and the material remains n type.

In the second method, after trying many conventional diffusers (e.g. Cu, Zn, Al, In, Ga, KI) in vapor, liquid and solid phase diffusion with no success, we found a surprising success with the diffusion of Ni and then Fe and Cr from the solid phase. For example, a layer of Ni was deposited by vacuum evaporation onto a well prepared surface of a high x, $KP_x$ wafer. After annealing for several hours, the Ni was found to diffuse for about 0.5 micrometers into the substrate and the conductivity increased by more than 5 orders of magnitude. The conductivity is still n type.

More specifically, 1500 angstroms of Ni was deposited onto the wafer in a Varian resistance heated vacuum evaporator under pressure of $10^{-6}$ Torr. The sample was sealed in an evacuated Pyrex tube and heated for 4 hours at 350° C. The top Ni layer was removed. The conductivity measured by the two probe method showed an increase from $10^{-8}$ to greater than $10^{-4}$. Electro spectroscopy for chemical analysis (ESCA) depth profiling of the sample showed the diffusion depth to be 0.4 micrometers and the chemical bonding of the Ni to be Ni°, i.e. free Ni in the material. The wavefunction of the Ni overlaps with electronic wavefunctions in the P—P matrix, affecting the conduction (mobility). The Ni concentration is greater than about 1 atom percent.

Evaporated gold top contacts or dry silver paint in coplanar fashion form ohmic contacts to the doped layer.

Variations in the diffusion temperature show 350° C. to be optimum for Ni diffusion.

Variation in the diffusion time follow the diffusion equation (diffusion depth is proportional to square root of time) and 1500 angstroms of Ni heated at 350° C. for 60 hours, showed diffusion depth of 1.5 micrometers as measured by ESCA. 350° C. approaches the highest temperature these amorphous materials may be subjected to.

Ni diffusion can also be accomplished from the liquid phase, such as from a Ni-Ga melt, or from the vapor phase, such as from Ni carbonyl gas.

It was further found that Fe and Cr show similar behavior under the above processing procedures.

For example, we took a cut wafer from a bulk amorphous high x boule obtained by the single source vapor transport and evaporated 500 angstroms of iron onto it and then diffused it into the wafer at 350° C. for sixteen hours. Applying two pressure probes to the doped material gave a full non-linear characteristic on the Tektronix curve tracer.

On another wafer of high x material we evaporated 300 angstroms of nickel and 200 Å of iron, then heated the wafer to 350° C. for sixteen hours. We then evaporated two 1 mm radius aluminum contacts 2000 angstroms thick and measuring the current voltage characteristic with the Tektronix curve tracer between the aluminum dots, again obtained a full non-linear characteristic.

On another wafer of high x material produced by single source vapor transport, we evaporated 500 angstroms of nichrome and then heated the wafer for diffusion at 350° C. for sixteen hours. We then evaporated two aluminum 1 mm radius dots 2000 angstroms thick onto the wafer and again measured a full non-linear characteristic between the two aluminum dots.

We thus conclude that nickel, iron and chromium are useful diffusants in these materials for lowering conductivity and that on the lower conductivity material junctions can be effected with wet silver paint, pressure contacts and aluminum contacts.

Other elements besides Ni, Fe and Cr with occupied d or f outer electronic levels that can overlap with the phosphorus levels are expected to be able to affect the conductivity in these materials such as to give p-type material and form p/n junctions for solid state devices.

Amorphous High Phosphorus Material By Two Source Vapor Transport

Two types of materials were obtained by this method and the properties of these were investigated.

1) Amorphous bulk $KP_x$, (Example VI) where x equals approximately 50 on one side and x is much greater than 15 on the other. Surface analysis supports the hypothesis of the template effect, which is very strong in this instance. The surface of a cut and polished sample is of very high quality, low number of defects and voids, uniform etching pattern.

The conductivity measured was by the two probe technique $10^{-10}$ (ohm-cm)$^{-1}$ and the photoconductivity ratio under illumination of 100 mW/cm$^2$ is greater than $10^3$. The photoconductivity peak is approximately at 1.8 eV, indicating a bandgap of that order. The data indicates that the P—P bond dominates the electrical and optical properties of this material as well as those in Tables XVI, XVII, XVIII and XIV, and its strong photoconductivity ratio is consistent with a highly reduced level of dangling bonds.

2) Amorphous thin films of $KP_{15}$, (Reference No. 47 Table XII) deposited onto glass slides which have a metal layer deposited on them for a back contact to the thin film. The success in the thin film deposition of $KP_{15}$ opens the opportunity to manufacture many types of thin film devices.

The amorphous $KP_{15}$ thin films deposited by the 2 source technique have a thickness of approximately 0.5 micrometers over an area of 3 cm$^2$. The film is uniform and the surface roughness does not exceed 2,000 angstroms. The film is chemically stable. FIG. 25 is a photomicrograph at 2000 magnification of the surface of one of these $KP_{15}$ films. The adhesion to the substrate is excellent. Quantitative analysis of the film was performed using a Scanning Electron Microscope (SEM) and an Energy Dispersive X-ray (EDAX) measurement. The composition of the film was found to be in agreement with the $KP_{15}$ nominal composition. The uniform composition, homogeneity, and pinhole free surface leads to uniform electro-optical properties across the films.

Figure 26:
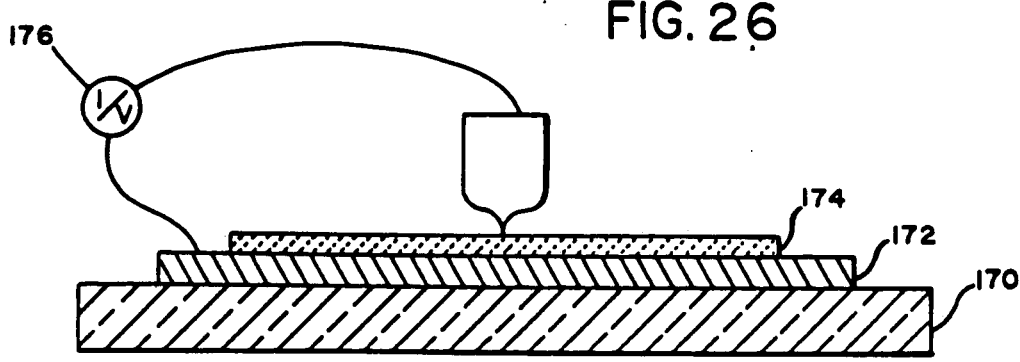
FIG. 26 is a cross sectional view partly in diagrammatic form illustrating the formation of a junction according to the invention.

In view of the diffusing capability of Ni into bulk amorphous $KP_x$, an Ni film 172 was evaporated onto the glass substrate 170 to form a back contact for the amorphous $KP_{15}$ layer 174 as shown in FIG. 26.

The Ni serves as a back contact and a diffuser. ESCA and SEM profiling shows Ni to diffuse significantly into the $KP_{15}$ film 174 at a rate of 200 angstroms per hour during the $KP_{15}$ growth process.

In more detail we deposited by vacuum evaporation 1500 angstroms of Ni 172 onto a glass slide 170 at $10^{-6}$ Torr. pressure. Part of the Ni surface is then masked with a Ta mask in order to have a material free zone for electrical contact.

Two micrometers of amorphous $KP_{15}$ 174 is deposited in our two source apparatus onto the Ni film 172. The composition of this film has been identified to be $KP_{15}$, it is amorphous and has more than 1% Ni diffused into the film.

Figure 27:
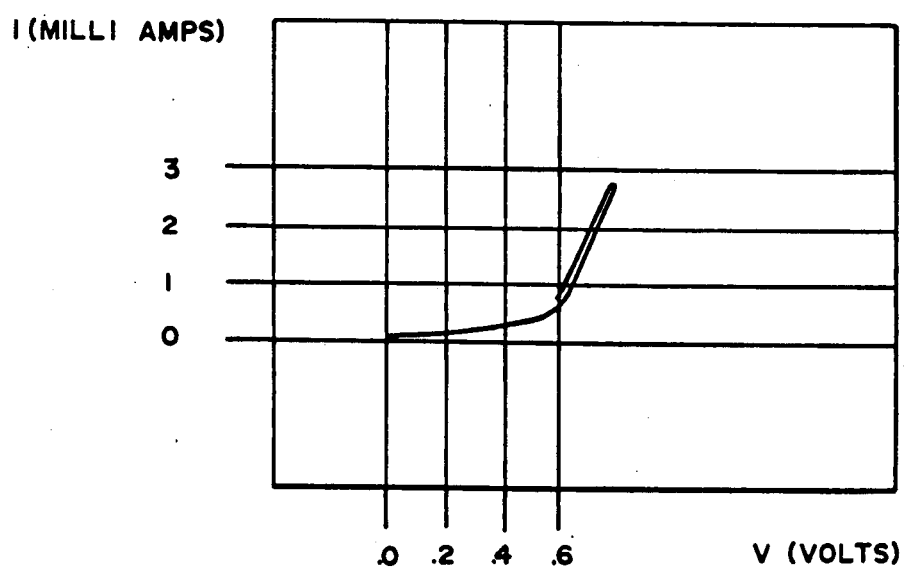
FIG. 27 is an illustration of the oscilloscope screen in the experiment illustrated in FIG. 26.

Pressure contact with an electrical probe was applied to the top of the $KP_{15}$ film. The two leads, from the back contact and the top pressure contact, were connected to a Tektronix Curve Tracer 176 to observe the current voltage characteristics. The forward characteristic of the rectifying pressure contact junction is shown in FIG. 27, which indicates a junction with a barrier height of 0.5 eV and current in the mA range.

Figure 28:
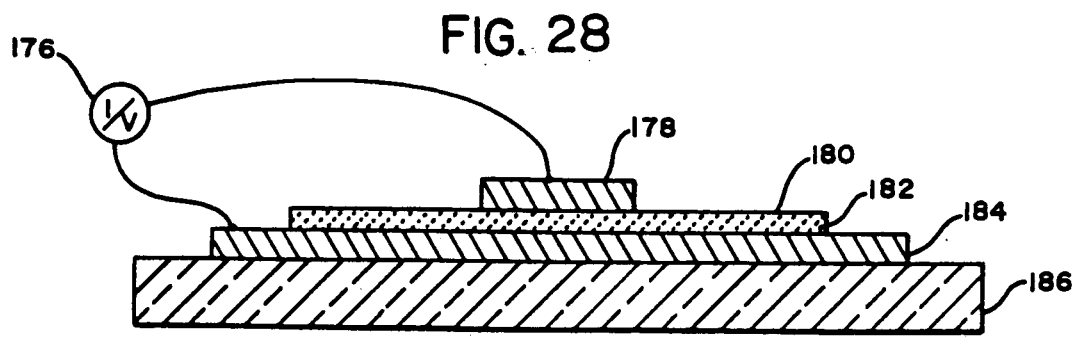
FIG. 28 is a cross sectional view partly in diagrammatic form illustrating the formation of a junction according to the invention.
Figure 29:
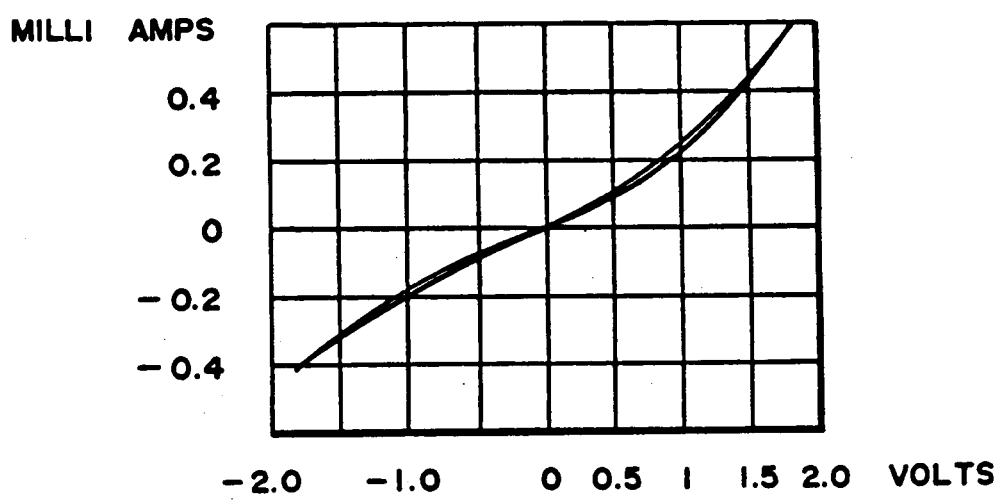
FIG. 29 is an illustration of the oscilloscope screen in the experiment illustrated in FIG. 28.

As shown in FIG. 28, we also deposited by vacuum evaporation a 2 mm radius Cu contact 178 onto the top surface 180 of a $KP_{15}$ amorphous layer 182 grown by the two source technique on a Ni layer 184 deposited on a glass substrate 186. We connected the Tektronix curve tracer 176, as shown, and measured the full forward and reverse biased junction curve shown in FIG. 29, thus indicated that Cu forms junctions with these materials.

Figure 31:
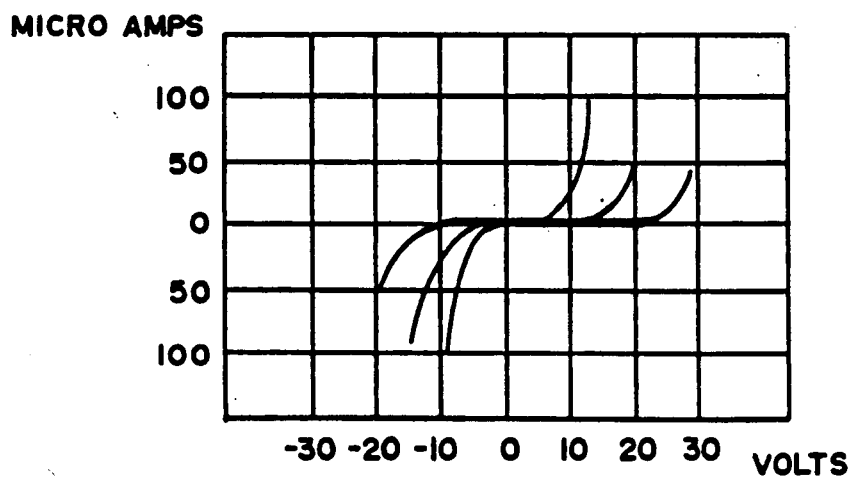
FIGS. 31, 32, and 33 are illustrations of oscilloscope screens showing junction activity in devices according to the invention.

Subsequently, smaller metal dots were deposited as top contacts in order to reduce the effect of leakage currents at the edges of the contacts. $10^{-3}$ cm$^2$ area top contacts and $10^{-5}$ cm$^2$ top contacts were deposited in the vacuum evaporator through mechanical masks. The I-V characteristics shown in FIG. 31 were observed with Cu, Au, and Al top contacts. They appear as the breakdown voltages of two back to back diodes in each instance. Similar curves were obtained with Ni, Ti, Mg, and Ag as the top contacts.

Figure 32:
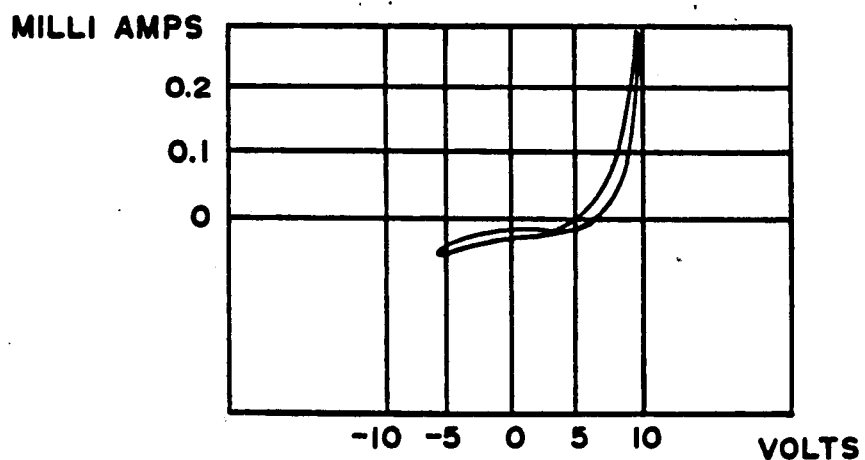
Figure 33:
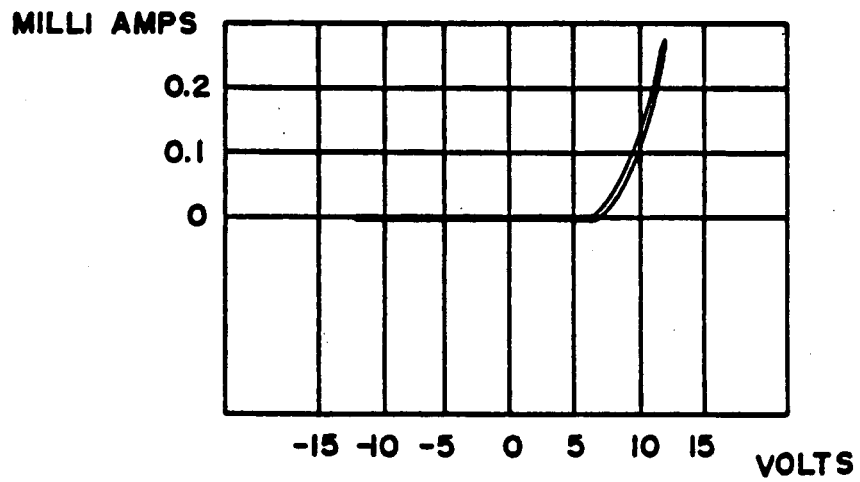

The most significant difference appears in the fact that Au contacts change the I-V characteristic after applying 10 V to the device. The I-V characteristic become asymmetric, as shown in FIG. 32, and a more ohmic contact is formed at the Au interface after this "forming" process. The "forming" is consistently observed with Au, and intermittently observed with Ag and Cu top contacts. The "forming" does not permanently affect the device, but it reappears every time a voltage is applied. Heating the device at 300° C. does not affect the phenomenon. Cooling the device to −20° C. results in very sharp I-V characteristics (FIG. 33).

Figure 34:
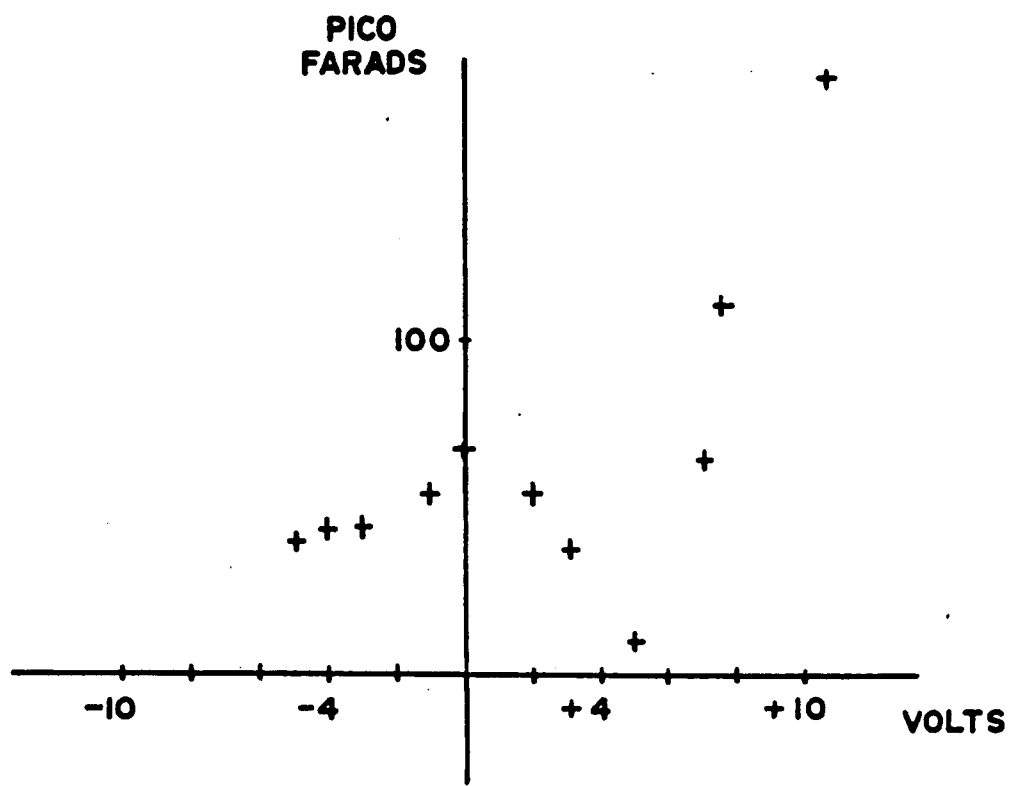
FIGS. 34, 35 and 36 are plots of capacitance versus applied electrical potential in junction devices according to the invention.
Figure 35:
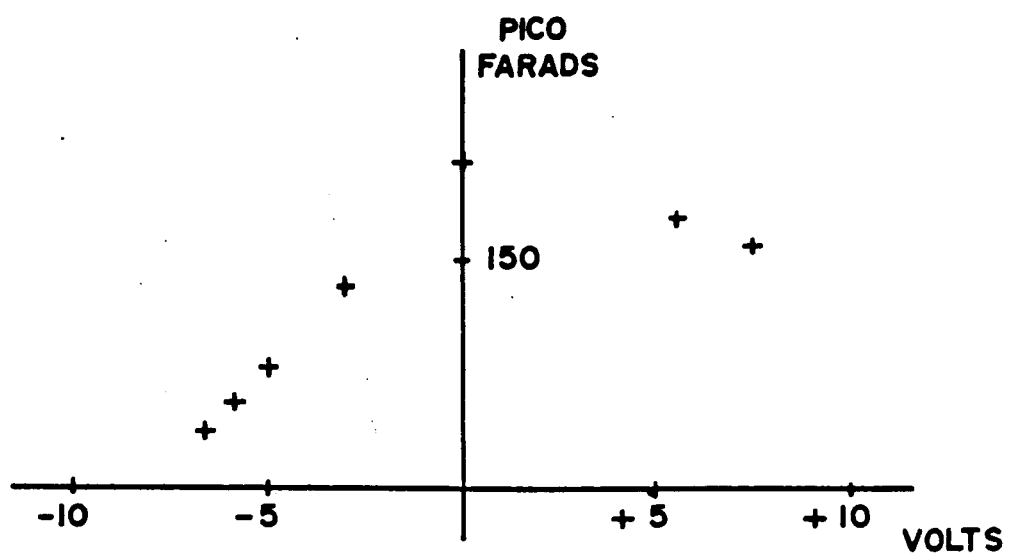
Figure 36:
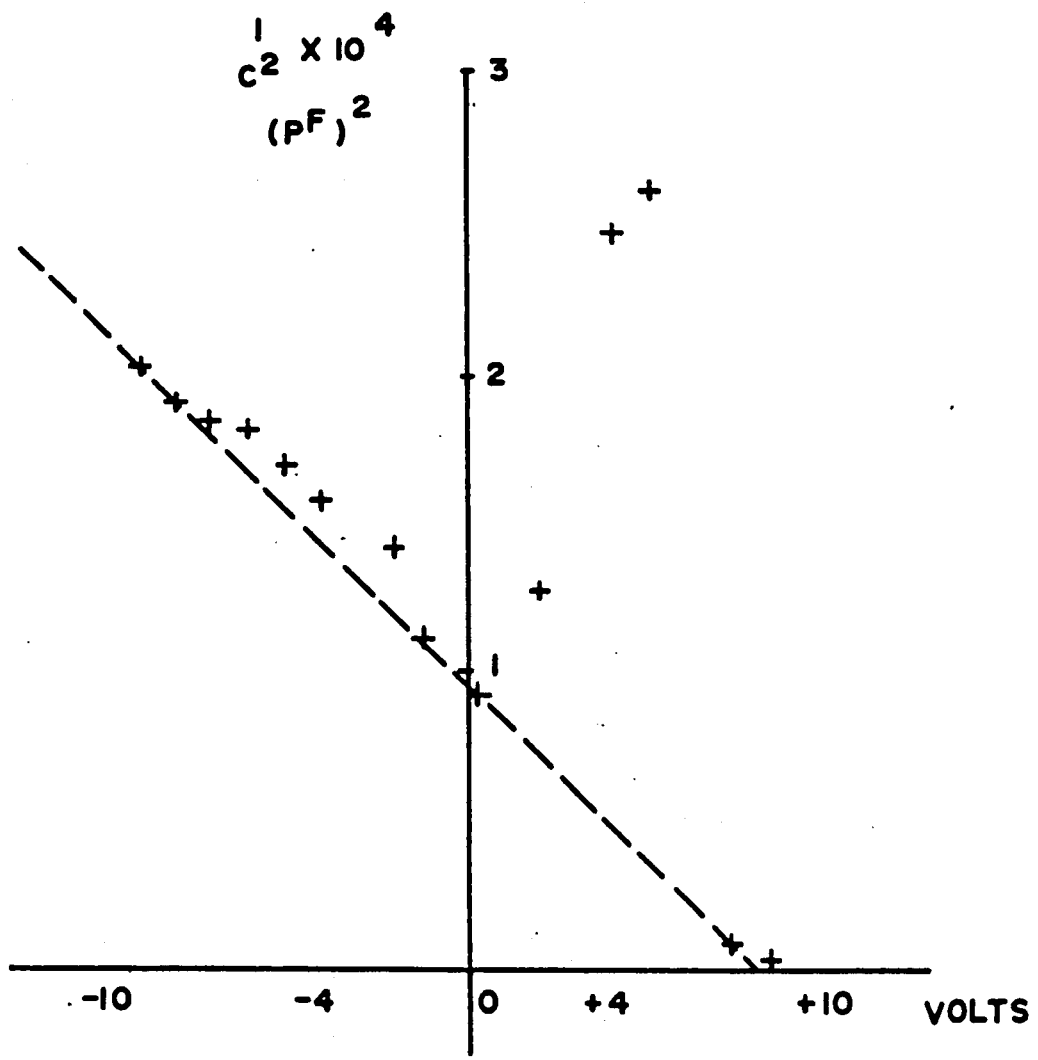
Figure 37:
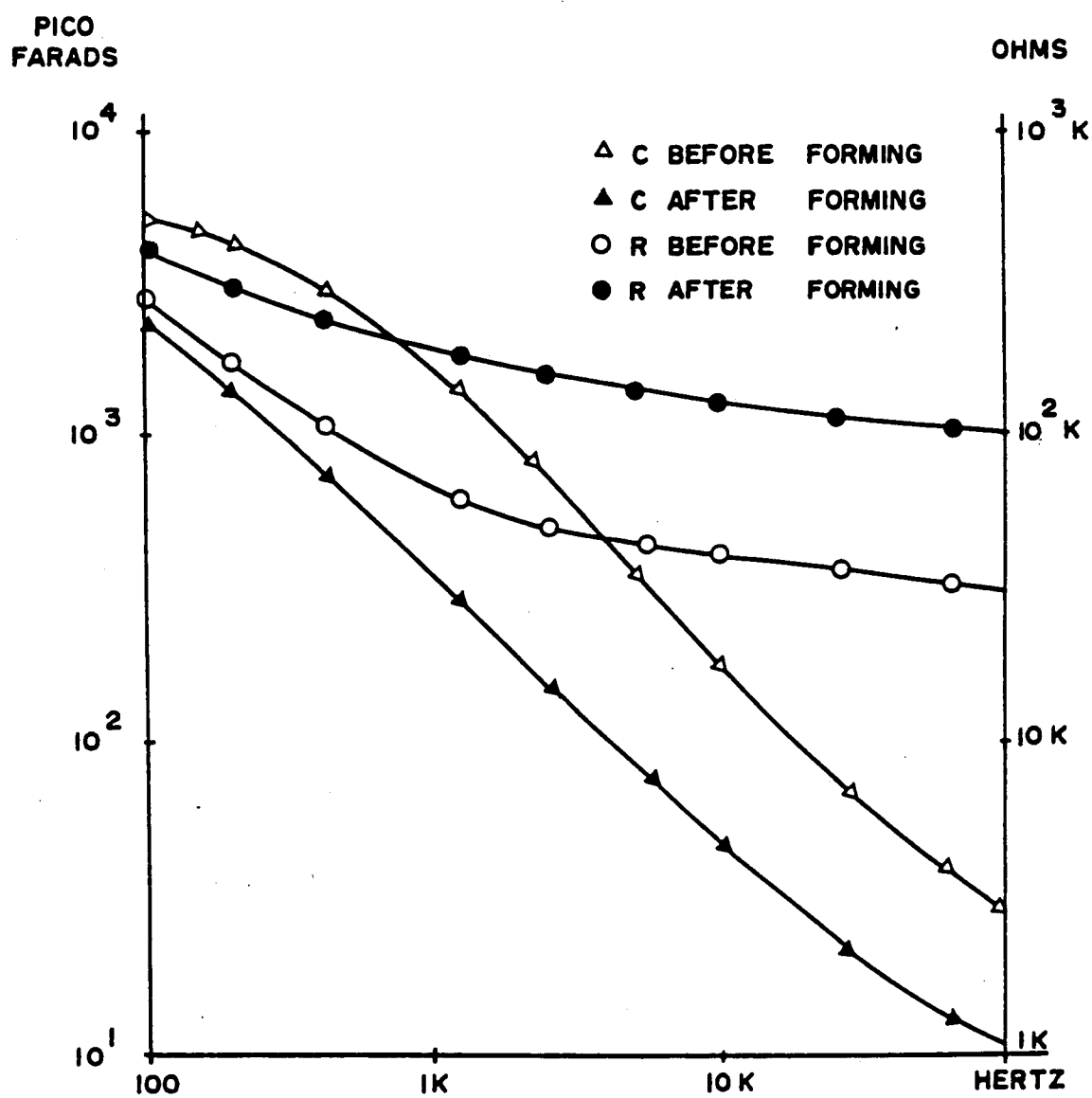
FIG. 37 is a plot of capacitance and resistance as a function of frequency of applied potential of devices according to the invention.

It appears as if the "forming" may be a breakdown of a high resistance layer remaining between the diffused part of the device and the top contact. Capacitance - voltage (C-V) characteristics shown in FIGS. 34, 35, and 36 point in the same direction. Al and Au top contacts have C-V characteristics of double diodes, but convert into single diode behavior in the case of Au contacts. If we assume a dielectric constant of approximately 10, we can extract a carrier concentration of approximately $10^{16}$ carriers per cm$^3$ near the junction and a carrier mobility of approximately $10^{-2}$ to 1 cm$^2$/volt second. Frequency dependence of the capacitance and resistance in FIG. 37 can be used to model the multiple junctions that can form in such a structure with a graded diffusion profile in the active material. In addition, poor bulk material quality (low density) and rough surface morphology could contribute to the complex observations. Nonetheless, junction formation capability on amorphous 2 source thin film KP$_{15}$ has been demonstrated.

Some of the above phenomena, such as "forming" with Au top contacts was also observed with flash evaporated thin films deposited on Ni. This film is not pure KP$_{15}$, but has excellent quality. No C-V dependence was seen in this case. The device, which was very thin, had a good response to light and a small ($10^{-6}$ amps) current was drawn from it under short circuit conditions when illuminated with visible light.

We expect that KP$_{15}$ thin films made by CVD technique will result in similar behavior when the films are sufficiently thick. At the moment they have been too thin and have been found to short out.

The formation of junctions with these materials indicates that they may be utilized to form pn junctions, Schottky diodes, or Metal Oxide Semiconductor (MOS) devices.

We expect that by utilizing the above noted classes of dopants, that the materials can be converted to p-type conductivity and thus will be useful in the entire range of semiconductors.

The photoconductivity ratio was obtained in all these by forming a semiconductor device comprising our material and means attached to the material for electrically communicating with it. This means comprised two single electrodes 80 and 82 attached to the material illustrated in FIG. 30.

More specifically, for a single crystal of MP$_{15}$, two copper strips 80 and 82 were adhesively attached to a glass substrate 84. A sample of KP$_{15}$ 86, made according to the above teachings, was bridged across strips 80 and 82 at one end thereof and attached hereto by silver paint 88. An electrometer attached to the opposite ends of strips 80, 82 introduces an electrical potential to the KP$_{15}$, and thereby permits measurement of the resistivity of the KP$_{15}$.

Figure 30:
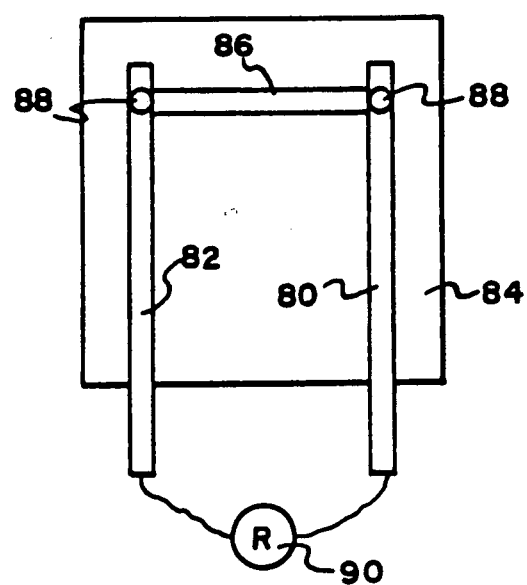
FIG. 30 is a diagram of a photosensitive resistor according to the invention.

The resultant device of FIG. 30 and similar devices using our other materials established that our high phosphorus materials can in fact be used to control the flow of electrical current, at least as a photosensitive resistor.

In addition, our materials show luminescence characteristics with an emission peak at 1.8 eV at temperatures of four degrees K, and luminescence at ambient temperatures.

Preparation of Large Crystal Monoclinic P

Rubidium

We have found that the RbP$_{15}$ can be utilized to produce large crystal monoclinic phosphorus.

A 0.62 g sample of RbP$_{15}$ encapsulated, in vacuo, in a 10 mm O.D.×6 mm I.D.×5.0 cm quartz tube was vertically positioned in a crucible furnace and subjected to a temperature gradient such that the RbP$_{15}$ charge was maintained at 552° C. while the top of the tube was maintained at 539° C. After heating for approximately 22 hours, the tube was opened and single crystals of monoclinic phosphorus, as large as 3.0 mm on edge, in the form of truncated pyramids were found in the upper (cooler) region of the tube.

We found that large crystal monoclinic phosphorus can also be prepared from mixtures of Rb and P in the atom ratio of 1 to 15 (RbP$_{15}$).

Cesium and Sodium

Large single crystals of monoclinic phosphorus were also grown via vapor transport using either CsP$_{15}$ or NaP$_{15}$ charges formed in our condensed phase process. In each run approximately 0.5 g of the appropriate alkali metal polyphosphide was sealed in vacuo in a quartz tube (10 mm O.D.×6 mm I.D.) of length 8.9 cm. The tubes were then subjected to a temperature gradient such that the alkali metal polyphosphide charges were maintained at 558° C. while the tops of the tubes were maintained at 514° C. After 48 hours, large deep-red crystalline stacked square platelets of monoclinic phosphorus formed from the CsP$_{15}$ charges.

The morphologies of the monoclinic phosphorus crystals grown from CsP$_{15}$ and NaP$_{15}$ condensed phase charges appear to be very similar, that is, stacked square platelets. This is in contrast to the truncated pyramidal habit of the monoclinic phosphorus crystals grown from a RbP$_{15}$ charge.

We found that large crystal monoclinic phosphorus can also be prepare from Cs/P$_{11}$, and Cs/P$_{11}$ and Cs/P$_{15}$ mixtures maintained at high temperatures.

Potassium

Using similar processes we have also produced monoclinic phosphorus crystals from condensed phase KP$_{15}$, and from mixtures of K/P$_{30}$ and K/P$_{125}$.

Lithium

No experiments have been conducted with lithium/phosphorus charges. However, we expect that large crystal monoclinic phosphorus can be prepared from the materials under similar conditions.

Effect of Temperature

While the nature of the alkali metal present seems not to be important, the temperature at which the charge is maintained is apparently very important to the crystal growth process. In the case of the Cs/P$_{11}$ ball milled system, large crystals were produced in experiments where the charge was maintained at 555° C. and 554° C. However, in experiments where the charge was held at 565° C. and 545° C., no large monoclinic crystals were produced.

Figure 38:
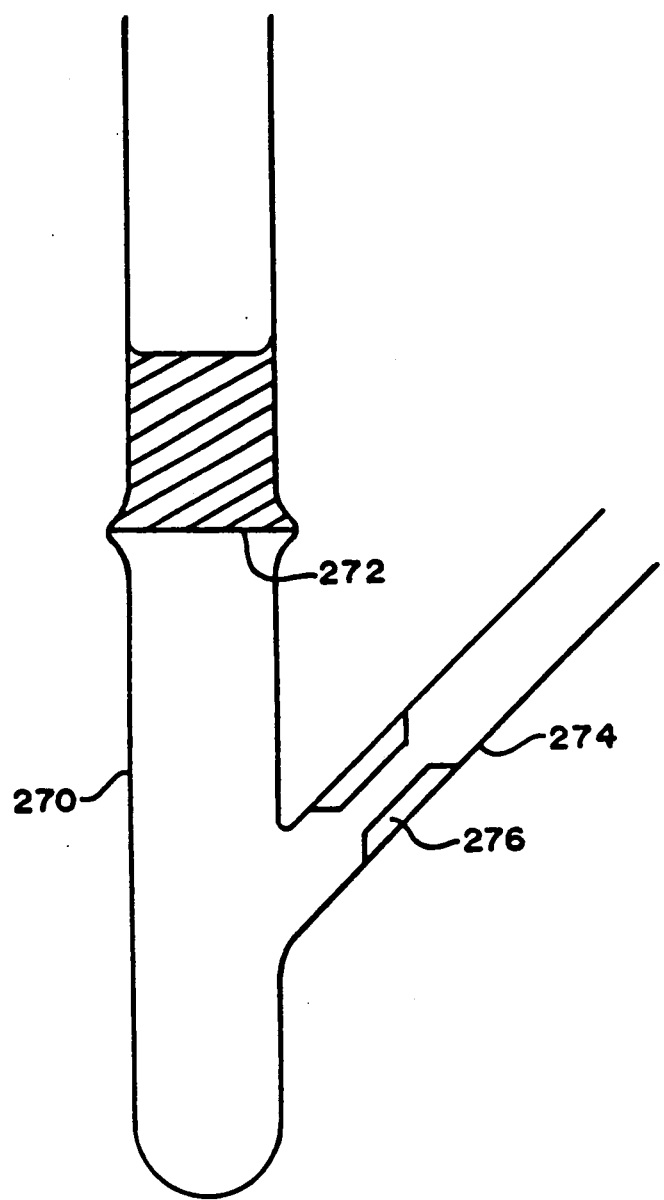
FIG. 38 is a diagram of a preferred form of sealed ampoule utilized to form monoclinic phosphorus according to the invention.

Referring to FIG. 38, using our preferred apparatus, we sealed a 0.6 gm sample of RbP$_{15}$ prepared by our condensed phase process in vacuo in a 12 mm O.D.×6 mm I.D.×8 cm long glass tube 270. The top was sealed with a 16 mm diameter flat glass surface 272. Fill tube 274 is provided with a constriction 276 at which it is sealed after charging and evacuation.

The tube was subjected to a temperature gradient such that the flat surface 272 at the top of the tube was maintained at 462° C., while the charge at the bottom of the tube was maintained at 550° C. After heating for 140 hours approximately half of the original charge had been transported to the flat surface.

Figure 44:
FIG. 44 and 45 are SEM photomicrographs of another new form of phosphorus according to the invention.
Figure 45:

The resulting button-like boule was cleaved and examined. It was made up entirely of uniform light-red fibers—not the desired large crystal monoclinic phosphorus. FIGS. 44 and 45 are SEM photomicrographs of this product at 200 and 1000× magnification respectively.

The SEM photomicrographs of FIGS. 44 and 45 proved to be a surprise. The individual "fibers" consist of bundles of long platelets which are attached such that they appear to be star-shaped rods when viewed from the end. This material is thus quite different in appearance from the "twisted tube" fibrous phosphorus produced via vapor transport from a 99.9999% red phosphorus charge (see below).

We conclude that the condensing temperature to form large crystal monoclinic phosphorus should be in the range of 500° to 560° C. Further experiments indicate that the preferred condensing temperature is about 539° C.

The charge must be heated to a temperature above 545° C. and below 565° C. as previously indicated. Our preferred range is 550° to 560° C. with about 555° C. giving the best results.

Effect of Composition

We have produced monoclinic phosphorus from charge ratios of P to alkali metal of 11 to 125. However a ratio of about 15 seems to work best.

Figure 39:
FIG. 39 is a photomicrograph of a crystal of monoclinic phosphorus according to the invention.

Characteristics of Monoclinic Phosphorus Condensed from Vapor in the Presence of an Alkali Metal FIG. 39 is a photomicrograph at 50× magnification showing a pyramidally shaped monoclinic crystal of phosphorus prepared from a $RbP_{15}$ charge. These crystals are hard to cleave. Similar crystals are produced from charges utilizing sodium as the alkali metal. We have produced crystals as large as 4×3×2 mm.

Figure 40:
FIG. 40 is a photomicrograph of a crystal of monoclinic phosphorus according to the invention.

FIG. 40 is a photomicrograph, at 80× magnification, of a crystal of monoclinic phosphorus produced from a ball milled mixture of $Cs/P_{11}$. These platelets are easy to cleave into mica-like sheets. Similar crystals can be produced from a charge of $K/P_{15}$. We have produced crystals in this habit as large as 4 mm on a side and 2 mm thick.

We have determined that the crystals are birefringent. When placed between crossed polarizers in a polarizing microscope, they rotate the light and allow some of it to pass through. Thus they may be utilized as birefringent devices such as optical rotators in the red and infra-red portion of the spectrum.

Chemical analysis indicates that they contain anywhere from 500 to 2000 parts per million of an alkali metal. They are made in a process which takes as little as 22 hours versus the 11 days employed in the process of the prior art to produce Hittorf's phosphorus.

The powdered X-ray diffraction pattern of these crystals is consistent with that of the prior art Hittorf's phosphorus.

Figure 41:
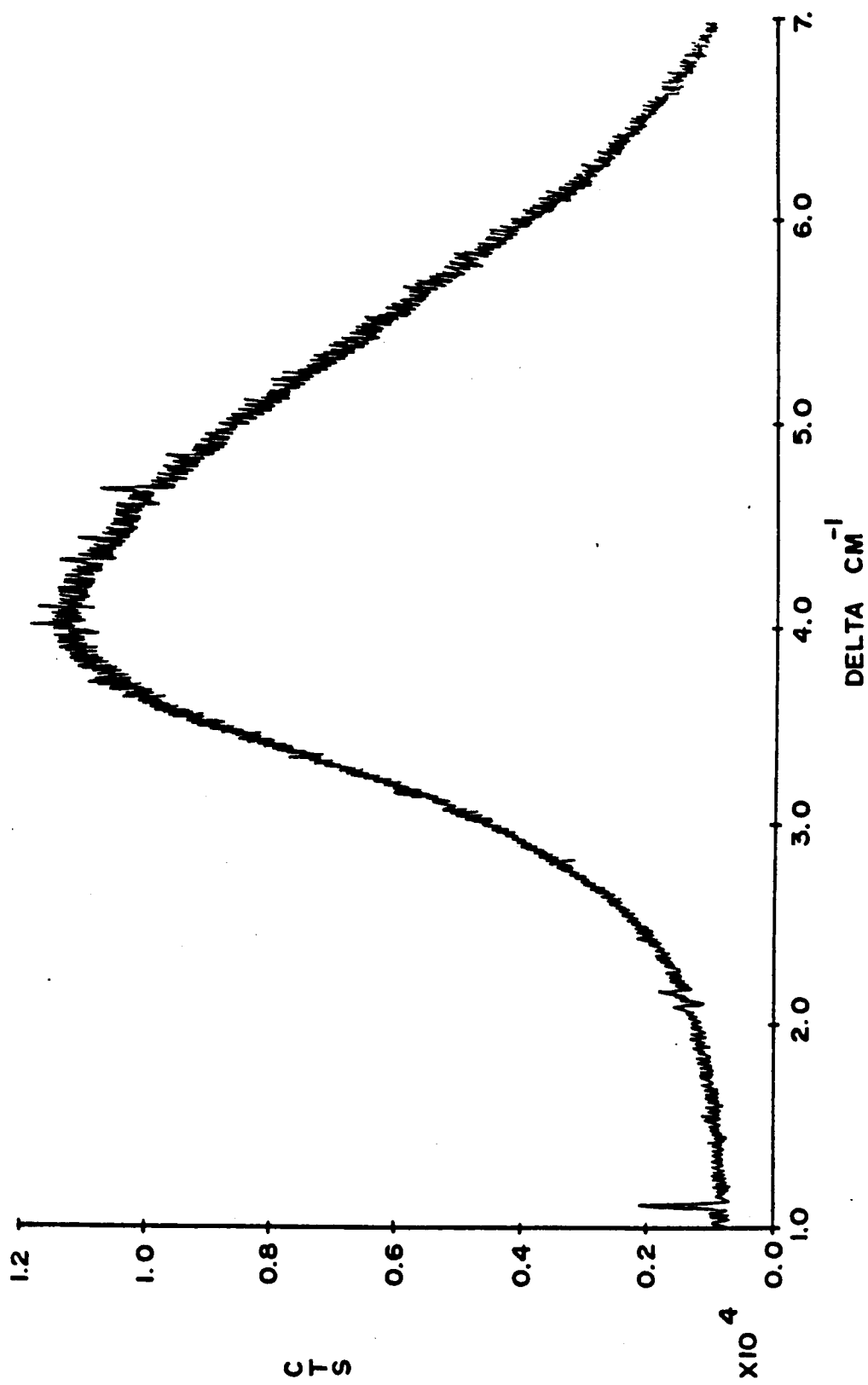
FIG. 41 is a diagram of the photoluminescence response of a crystal of monoclinic phosphorus according to the invention.
Figure 42:
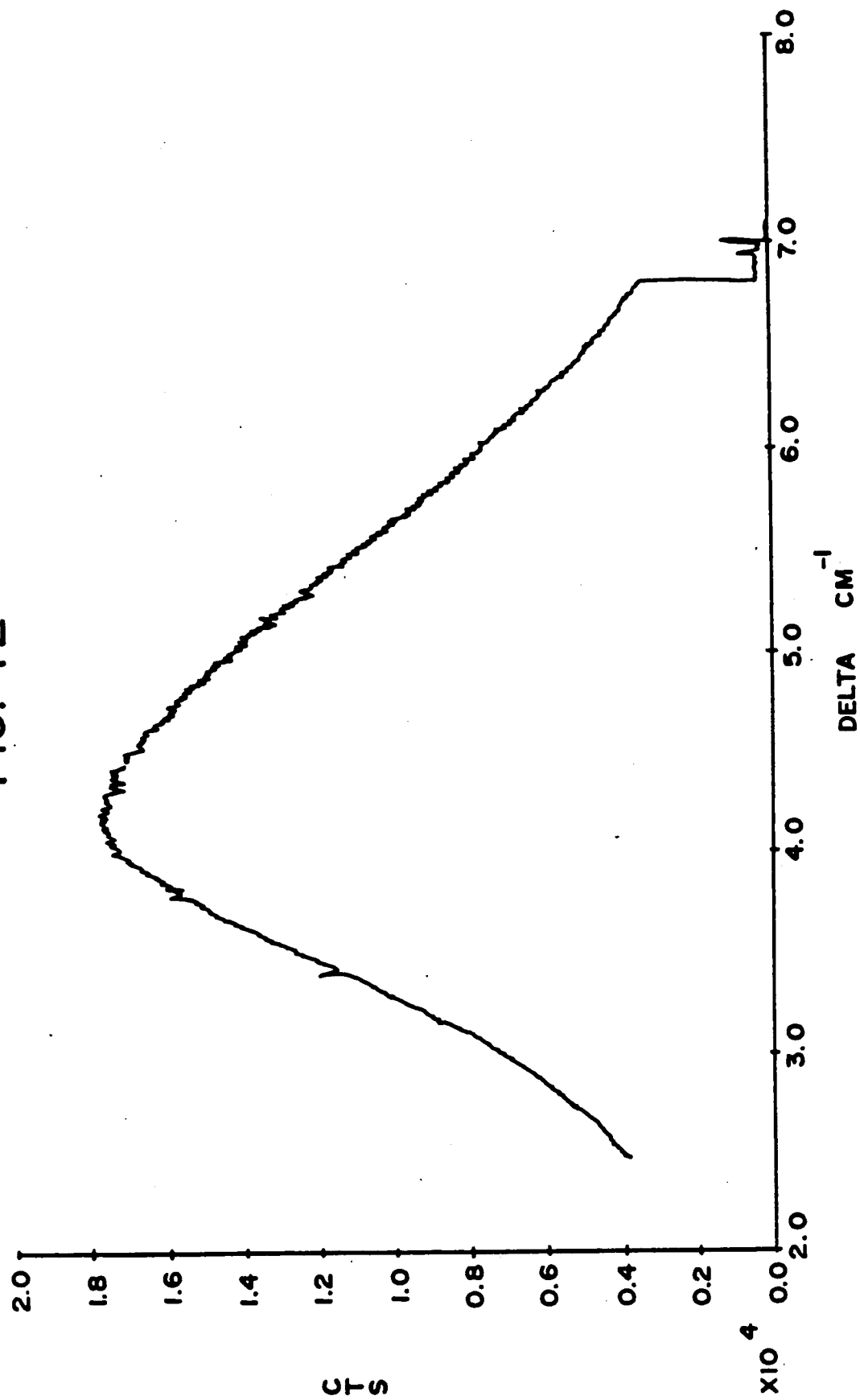
FIG. 42 is a diagram similar to FIG. 6 of the photoluminescent response of a crystal of monoclinic phosphorus according to the invention.

The photoluminescence spectra shown in FIGS. 41 and 42 were taken with an Argon laser Raman spectrometer. A broad peak at 1.91 eV is clearly observed with a half width of about 0.29 eV. This indicates a band gap of about 2.0 eV at room temperature.

The FIG. 41 spectrum was taken utilizing a monoclinic crystal of phosphorus prepared in the presence of cesium while the FIG. 42 spectrum was taken using monoclinic phosphorus condensed in the presence of rubidium.

Figure 43:
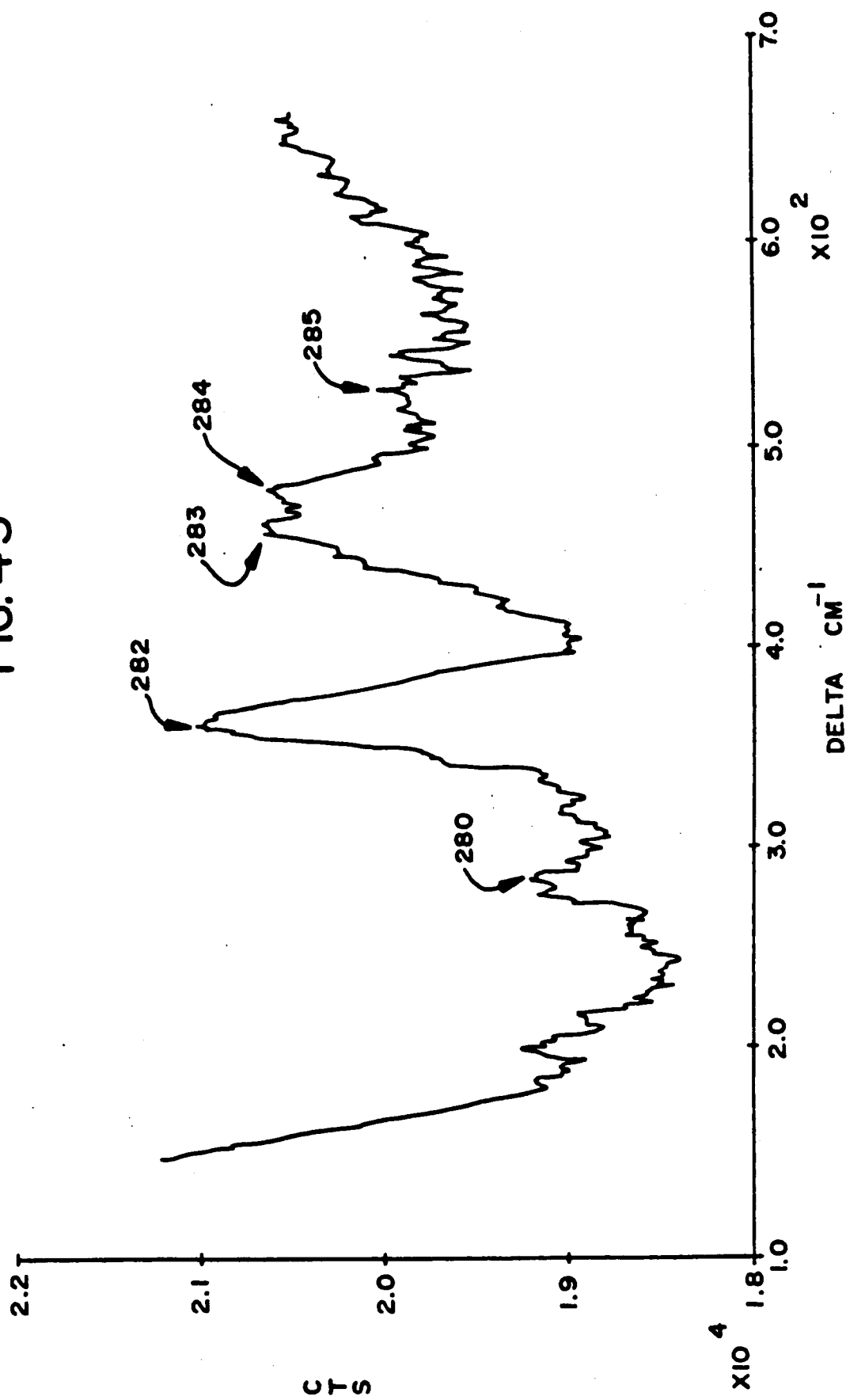
FIG. 43 is a Raman spectrum of monoclinic phosphorus according to the invention.

The Raman spectrum of FIG. 43 was taken utilizing a monoclinic phosphorus crystal formed in the presence of Rubidium. The peaks 280, 282, 283, 284, and 285 are at wave numbers 285, 367, 465, 483, and 529.

Evaporated dots about 25 micrometers in diameter were deposited on large crystals of monoclinic phosphorus (from a $Rb/P_{15}$ source) for electrical measurements. The resistance of the crystals was found to be $10^6$ ohm to $10^7$ ohm and practically independent of the geometry of the crystal and the size of the contacts. This reflects surface resistance.

These crystals may be utilized as the substrate for depositing 3-5 materials such as Indium Phosphide or Gallium Phosphide. They may be utilized as phosphors in luminescent displays, semiconductors, lasers, and as starting materials for other semiconducting devices.

Twisted Fiber Phosphorus

The presence of the alkali metal in the charge appears to be critical to the production of large crystal monoclinic phosphorus. We attempted to produce large single crystals of monoclinic phosphorus from 99.9999% pure red phosphorus by mimicking the conditions used successfully with the various alkali metal/phosphorus systems. This attempt failed. No monoclinic phosphorus was produced. For example, a 0.6 g sample of 99.9999% pure red phosphorus was heated at 552° C. in a sealed evacuated tube in a vertically positioned 10 mm outside diameter × 6 mm inside diameter quartz tube. The temperature gradient between the bottom and top of the two and three-quarter inches long tube was 43° C. After heating for 24 hours, more than half of the charge had been transported to the top third of the tube where a boule had formed.

Surprisingly, the boule was found to consist entirely of a red fibrous material Several long (approximately 1.5 mm) fibers were found in the vapor space at the bottom of the boule. Microscopic examination of the deep red fibers revealed that they are twisted.

Figure 46:
FIG. 46 is an SEM photomicrograph of still another new form of phosphorus according to the invention.

XRD data secured on the fibrous material was found to match that secured earlier on polycrystalline $KP_x$ where x is much greater than 15. FIG. 46 is an SEM photomicrograph at 500 magnification of these fibers.

Differential thermal analytical data was found to be similar to that secured on polycrystalline high x material. For two DTA determinations, the first heat plot consists of a single endotherm at 622° C. (average). The second heat plot consists of a single endotherm in both cases—at 599° C. The DTA data secured earlier on polycrystalline high x material consists of a first heat single endotherm—at 614° C. and a second heat single endotherm—at 590° C. Thus, we observed substantial similarities between the fibrous phosphorus prepared from 99.9999% red phosphorus and polycrystalline high x material.

Flash Evaporation

We have succeeded in forming stable thin film amorphous coatings on glass and nickel coated glass substrates using a flash evaporation process. The flash evaporation apparatus is generally indicated at 302 in FIG. 47. It comprises a glass cylinder 304 connected to a vacuum system (not shown) through tubing 306. Argon is supplied at inlet 308 of supply tube 310. Reservoir 312 is filled with powdered $KP_{15}$ formed by the Condensed Phase method. It is agitated by means of a vibrator generally indicated at 314 and picked up by the flow of Argon gas through the venturi generally indicated at 316. It then flows into the reactor 304, passing through tube 317 into a steel susceptor 318. The susceptor is heated by means of a RF coil 319 to a temperature of at least 900° C. which causes the $KP_{15}$ to vaporize. At the end of tube 316, as shown in FIG. 40, a nozzle is formed by incorporating a plurality of small tubes generally indicated at 320 in FIG. 41, having a plurality of small orifices 321. Tubes 317 and 320 are alumina and tubes 320 are held within the end of tube 317 by means of magnesium oxide cement 322.

The $KP_{15}$ on vaporization dissociates into its constituents and the vapor is carried by the Argon gas through the orifices 321. The film is deposited on a cooler substrate 324. The substrate may be heated by means of hot wire 326 fed by electrical connections 328.

Alumina tube 317 has a one-quarter inch outside diameter and one-eighth inch inside diameter. Tubes 320 have a one-sixteenth inch outside diameter, are one-quarter inch long and have four one-sixteenth inch diameter holes that are through.

The apparatus is operated under a vacuum of 0.1 to 0.5 mm Hg. Amorphous films of up to 1 micron thick may be formed in runs of up to fifteen minutes. At the end of a run, the substrate 324 reaches a temperature of 200°-300° C., depending on whether it starts out at room temperature or is initially preheated to 200° C.

Chemical Vapor Deposition

We have prepared thin films of $KP_{15}$ by means of Chemical Vapor Deposition.

Figure 50:
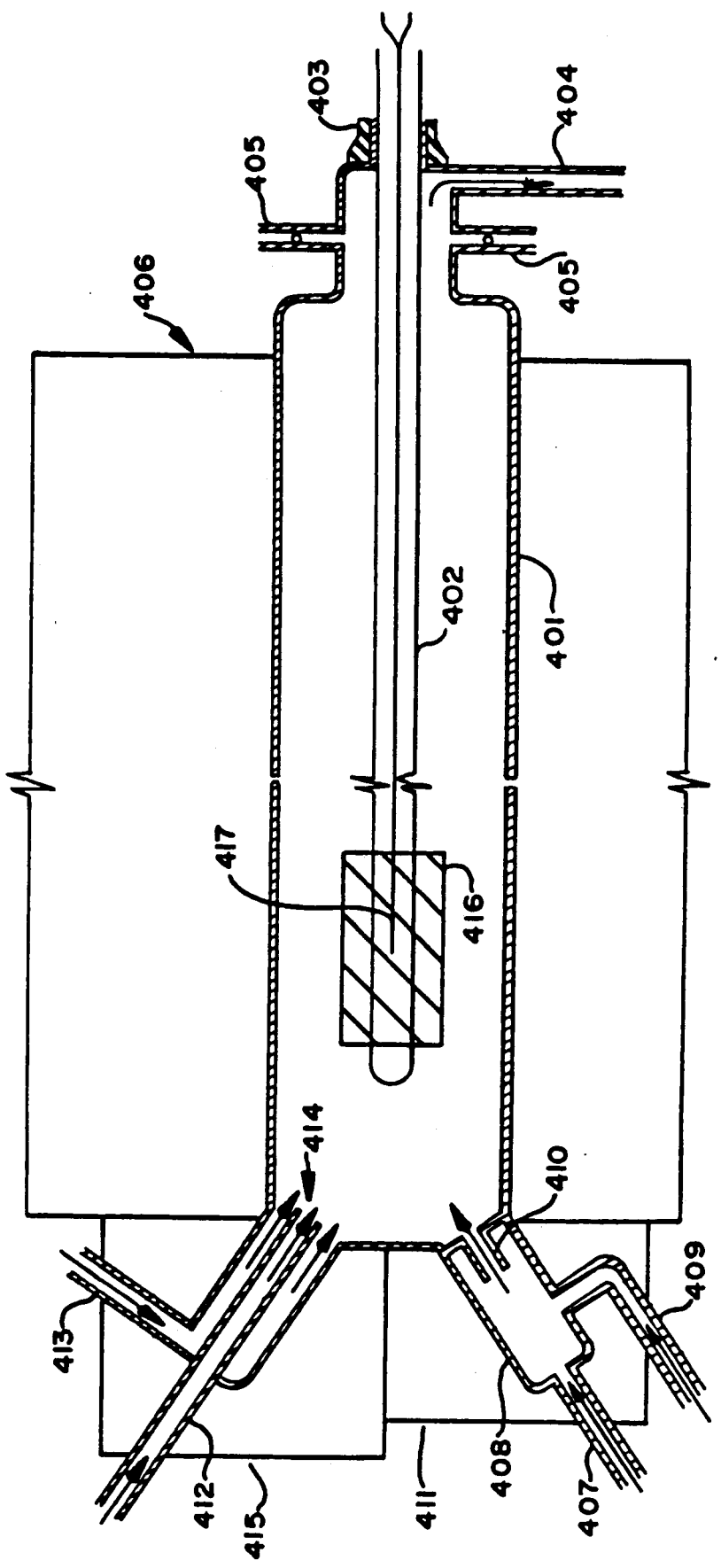
FIG. 50 is a diagram of chemical vapor deposition apparatus, according to the invention.

A typical chemical vapor deposition reactor is shown in FIG. 50. It is constructed of Pyrex. The reactor chamber 401 is a 26 mm I.D.×27.0 cm long tube in the center of which is positioned a 6.0 mm I.D.×30.0 cm long tube 402 which serves as both a thermowell and substrate holder. The thermowell is held in position by an adjustable O-ring collar 403. The vent tube 404 allows for the continuous removal of the gaseous exhaust stream. It is attached to a trap (not shown) which removes the unreacted phosphorus before venting of the stream to air. The vent tube 404 and O-ring collar 403 are attached to the reactor chamber 401 through a 2.0 cm I.D. O ring joint 405. The reactor chamber 401 is located in a resistance furnace generally indicated at 406.

Molten phosphorus is metered by a piston pump (not shown) through a 1.0 mm I.D. capillary tube 407 into a vaporization chamber 408. The molten phosphorus is evaporated in the vaporization chamber 408 by a stream of argon which is injected into the vaporization chamber 408 through the 6.0 mm I.D. inlet tube 409. The gaseous phosphorus/argon stream enters the reactor chamber through nozzle 410. The nozzle 410 has an opening of 4.0 mm. The evaporation chamber 408 is located in a resistance oven generally indicated at 411.

A gaseous mixture of potassium and argon is metered into the reactor chamber 401 through inlet tube 412 which has a 6.0 mm I.D. Neat argon, which acts as a shroud for the potassium/argon stream, enters the system through 6.0 mm I.D. tube 413. Both the potassium/argon stream and neat argon stream enter the reaction chamber 401 at 414. The potassium/argon and neat argon lines (412, 413) are located in a resistance oven generally indicated at 415.

The substrate 416 is positioned on the thermowell 402. The temperature of the substrate 416 is determined by a thermocouple 417 positioned directly below the substrate 416 on the thermowell 402.

During operation, ovens 406, 411, and 415 are maintained at appropriate temperatures. The gaseous reactant streams enter the reactor chamber at 410 and 414. The exhaust gas mixture leaves the reaction chamber through the vent tube 404. The desired film forms on the substrate 416.

The substrates are maintained at a temperature of 310°-350° C., the temperature being maintained constant to plus or minus 2° C.

In a typical run 1.24 g of white phosphorus and 0.13 g of potassium are delivered into the reactor over a two hour period. The total Argon flow rate is maintained at 250 ml per minute during the run.

A number of experiments were conducted in which phosphorus/argon and potassium/argon were fed simultaneously into the reactor. The phosphorus/argon stream was maintained at approximately 290° C. and the potassium/argon stream at approximately 410° C. The calculated atom ratio of reactants in the reactor was P/K approximately 15. The reactor was maintained at 300°-310° C. In a typical experiment the liquid phosphorus feed rate was 0.34 ml per hour.

Amorphous $KP_{15}$ films were prepared using nickel-on-glass substrates. The films are about 0.3 millimeters thick.

With a run time of 1.0 hour, the films produced were found to have nominal $KP_{15}$ composition. The thickness of the film was dependent on the position of the particular substrate in the reactor. Examination of the films using SEM showed them to be quite uniform.

Purification of Phosphorus 50 grams of Atomergic phosphorus, "99.95% pure", was subjected to a 450°-300° C. gradient for 75 days. After this admittedly very long time, 21% of the material remained behind and 60% of the charge ended up as amorphous, bulk deposits.

Previous analysis showed the Atomergic phosphorus to be less than 99.90% pure, probably closer to 99.80%, with aluminum, calcium, iron, magnesium, sodium, and silicon as major impurities (all greater than 0.01%, and some greater than 0.05%). This material costs about $220 per kilogram. In comparison, "99%" P from Alpha Ventron is $17/lb., or $37.5/Kilo.

Table XX summarizes the results of flame emission spectroscopy on three materials generated by the aforementioned treatment.

TABLE XX

| | IMPURITY LEVELS BY FES* | | | |
|---|---|---|---|---|
| Element | Atomergic "99.95" | Material A | Material B | Material C |
| Al | 0.03–0.3% | 0.02–0.2% | 20–200 | less than 1 |
| Ba | 3–60 | 40–400 | 2–20 | |
| Ca | 30–600 | 6–60 | 3–30 | less than 2 |

TABLE XX-continued

| | IMPURITY LEVELS BY FES* | | | |
|---|---|---|---|---|
| Element | Atomergic "99.95" | Material A | Material B | Material C |
| Cu | .4–4 | 20–200 | less than 1 | less than 1 |
| Fe | 40–400 | 0.03–0.3% | 4–40 | less than 1 |
| Pb | .6–6 | 3–30 | | |
| Mg | 0.01–.1% | 6–60 | 3–30 | less than 1 |
| Mn | 6–60 | 3–30 | less than 2 | |
| Mb | | .6–6 | | |
| Ni | | 3–30 | | |
| Na | 0.4–4% | MC | 30–300 | less than 20 |
| Si | 0.04–0.4% | 0.3–3% | 0.20–0.2% | less than 1 |
| Sn | 6–60 | MC | 3–30 | |
| Ti | 1–10 | 1–10 | | |
| V | | 0.6–6 | | |

*Flame Emission Spectroscopy
All values in ppm, except where noted
0.1% = 1000 ppm
MC = major component measured at greater than 1%

Material A was a residue, dark brown in color, throughout the charge zone, which did not undergo vapor transport. Material designated Material B was a hard boule of material, light in color, which did not vaporize, primarily because its position in the charge zone results in it being at a slightly lower temperature than 450° C. Material C was an amorphous boule in the cold zone.

Clearly, most of the impurities of the charge remain in Material A at fairly concentrated amounts. The high impurity levels would be expected to give rise to a lower vapor pressure of phosphorus at a given temperature. The impurity level of the material pretty well reflects the values for the initial charge material. The boule, Material C, is a pretty pure material, with the sodium content being the major observed contaminant. Taking the sum of contaminants, at their maximum indicated levels, this material has a purity level of 99.997%, at worst. The comparable material, obtainable from commercial sources, as 99.999% P, costs about $1,800/kilogram.

Clearly, we have illustrated a cost effective method for purifying red phosphorus to a high degree.

Reinforced Materials

The use of phosphorus compounds as fire retardant additives is well known. Because of the highly stable nature of the alkali metal containing phosphorus materials disclosed herein, they may be utilized for such purposes.

The fibrous and plate-like forms of the materials disclosed herein, for example, fibrous $KP_{15}$ and $KP_x$ where x is much greater than 15, the plate-like monoclinic phosphorus habit, the twisted tube form of phosphorus, and the star-shaped material of FIGS. 44 and 45, all show promise as reinforcing additives for plastics and glass. The twisted tube fibers and star-shaped fibers should be of particular value due to their ability to mechanically interlock with the matrix of a composite material. Their fire retardant qualities should also prove useful in such materials.

Coatings

As previously discussed, many of the materials disclosed herein form high stable amorphous coatings, with good adhesion to metal and glass. The $MP_{15}$ amorphous films are particularly stable and provide good adhesion to metal and glass. Thus they may be utilized as corrosion inhibiting coatings on metals and as optical coatings on glass.

A coating of approximately 1000 angstroms on an appropriate infrared optical component such as germanium, will provide a window transparent to infrared but showing absorption in the visible. Such coatings when combined with coatings of other materials of differing optical index, can be utilized to provide anti-reflection coatings on infrared optics.

Our experiments show that $MP_x$ material can be deposited as films with good adhesion on steel, aluminum, and molybdenum. The films are ductile, non-porous, polymeric, and non-brittle.

Thus the materials shown herein should find wide application as coatings and thin films.

INDUSTRIAL APPLICATION

Thus we have disclosed an entirely new class of high phosphorus semiconductor materials. These semiconductors comprise catenated covalent atoms where the catenated covalent bonds serve as the primary conduction paths in the materials. The catenated atoms form parallel columns as the predominant local order. Preferably the atoms are trivalent and have bonding angles that permit tubular, spiral or channel-like columns. The columns may be joined by atoms of one or more different elements bonded to two or more of the catenated columns.

We have disclosed in particular high phosphorus and mixed pnictide semiconductor materials of this class. These include high phosphorus polyphosphides of the formula $MP_x$ where x ranges from 7 to 15 and entirely new materials where x is very much greater than 15— for all practical purposes pure phosphorus.

These materials can be characterized as containing groups of seven or more atoms organized into pentagonal tubes. They may be characterized as having the formula $MP_x$ where x is greater than 6 and they may be characterized as comprised of phosphorus in a molar ratio of phosphorus to any other atomic constituent greater than 6; they may be characterized as high phosphorus materials where the phosphorus atoms thereof in substantially all local orders comprise phosphorus atoms joined together by multiple covalent p—p bonds organized into layers of all parallel pentagonal tubes. They may be characterized as polyphosphides containing alkali metal atoms wherein the number of consecutive covalent phosphorus-to-phosphorus bonds is sufficiently greater than the number of non-phosphorus-to-phosphorus bonds to render the material semiconducting. They may be characterized as having a skeleton of at least seven covalently bonded phosphorus atoms having associated therewith at least one alkali metal atom, conductively bridging the phosphorus skeleton of one unit with the phosphorus skeleton of another unit; they may be characterized as a polyphosphide having the formula $MP_x$ where M is an alkali metal and x is at least 7.

These materials may be further characterized by having a band gap greater than 1 eV; from 1.4 to 2.2 eV and for the best materials we have discovered approximately 1.8 eV. They may be characterized by having a photoconductivity ratio greater than 5; more particularly, within the range of 100 and 10,000.

These materials may be further characterized by their trivalent dominant atomic species; the homatomic bonds formed by the dominant species; the covalent nature of these bonds; the materials' coordination number of slightly less than 3; the materials' polymer nature; their formation in the presence of an alkali metal or metals mimicking the bonding of alkali metals with the dominant species; in the crystalline form, their pentagonal parallel tubes either all parallel in $KP_{15}$-like materials, paired parallel crossed layers in monoclinic phosphorus, or all parallel twisted tubes in twisted fiber phosphorus; their ability to form amorphous films and boules retaining their electronic qualities; and by their methods of manufacture; and other qualities made apparent in the preceding description.

The amorphous materials we have discovered maintain the electronic qualities of the $KP_{15}$ all parallel pentagonal tube structure and in theory, at least, it appears that that structure is maintained in the local scale in our amorphous materials. However, we do not wish to be bound by any particular theory in this matter. In particular, the claims appearing below should be interpreted broadly to cover all aspects of our invention, regardless of later acquired knowledge that might be said to conflict with the theories and hypothesis we have put forth, both explicitly and implicitly.

We have disclosed junction devices, photoconductive (resistive) devices, photovoltaic devices and phosphors made from these materials.

We have disclosed resistance lowering dopants, namely Nickel, Chromium and Iron, leading to the conclusion that substantially the entire group of atomic species having occupied d or f outer electronic levels may be utilized if of the appropriate atomic size.

We have disclosed resistance lowering substitutional doping with Arsenic which indicates that all Group 5a metals may be utilized.

We have disclosed junction devices having a back contact of Ni, Ni diffused therefrom, and top contacts of Cu, Al, Mg, Ni, Au, Ag, and Ti.

We have disclosed new forms of phosphorus wherein the local orders are all substantially parallel pentagonal tubes, twisted fiber phosphorus and monoclinic phosphorus. We have formed these new forms of phosphorus by vapor deposition. The all parallel and monoclinic form require the presence of an alkali metal during deposition.

We have disclosed both amorphous and polycrystalline films of $MP_{15}$ where M is an alkali metal. We have constructed various semiconductor devices from all of the all parallel pentagonal tube materials, including wafers of $NP_x$ where x is much greater than 15, including a new form of phosphorus, amorphous thin films of $KP_{15}$ and amorphous thin films of $KP_x$.

We have disclosed methods of making metal polyphosphides and two new forms of phosphorus by controlled two temperature single source techniques.

We have disclosed methods of making our high phosphorus materials by two source vapor transport.

We have disclosed a method of making high purity phosphorus.

We have disclosed methods of making crystalline and amorphous forms of $MP_x$ where x ranges from 7 to 15 by condensed phase methods.

We have disclosed chemical vapor deposition, flash evaporation and molecular flow deposition methods.

Industrial applications of the semiconductor materials and devices we have discovered are mainfest, they run the whole gamut of semiconductor applications. The crystalline materials may be used as reinforcing fibers and flakes for plastics, glasses and other materials. The materials of our invention may be used as coatings on metals, glass, and other materials. The coatings may protect a substrate from fire, oxidation, or chemical attack. The coatings may be employed for their infrared transmitting, visable light absorbing qualities. They may be employed with other materials as antireflection coatings on infrared optics. The materials may be used as fire retardant fillers and coatings. Monoclinic phosphorus may be used an an optical rotator.

It will thus be seen that the objects set forth above among those made apparent from the preceding description are efficiently attained and that certain changes may be made in carrying out the above methods, processes and in the above articles, apparatus and products without departing from the scope of the invention. It is intended that all matter contained in the above description shall be interpreted as illustrative and not in a limiting sense.

It should be understood that we have used crystalline to mean single crystals or polycrystalline material unless otherwise stated. Amorphous as distinct from single crystal or polycrystalline, means amorphous to X-ray diffraction. All periodic table references are to the table printed on the inside front cover of the 60th edition of the Handbook of Chemistry and Physics published by the CRC Press Inc., Boca Raton, Fla. Alkali metals are identified thereon and herein in Group 1a and pnictides in Group 5a. All ranges stated herein are inclusive of their limits.

By semiconductor device we mean any device or apparatus utilizing a semiconductor material. In particular, semiconductor device includes Xerographic surfaces and phosphors regardless of how they are excited, as well as photoconductors, photovoltaics, junctions, transistors, integrated circuits and the like.

It is also to be understood that the following claims are intended to cover all of the generic and specific features of the invention and discovery herein described and all statements of the scope thereof which as a matter of language might be said to fall therebetween.

Particularly it is to be understood that in said claims, ingredients or compounds recited in the singular are intended to include compatible mixtures of such ingredients whenever the sense permits.

Having described our inventions and discoveries what we claim as new and desire to secure by Letters Patent is:

We claim:

1. A high phosphorus thin film formed on a substrate as the deposition product of vapor transport from separated heated sources of phosphorus vapor and the vapor of one or more metals.

2. A polycrystalline high phosphorus thin film formed as defined in claim 1.

3. An amorphous high phosphorus thin film formed as defined in claim 1.

4. A high phosphorus thin film formed as defined in claim 1 wherein said product is deposited in a deposition zone located between said sources.

5. Films produced by the method of chemical vapor deposition of high phosphorus polyphosphides comprising flowing separate gas streams of vaporized phosphorus and an alkali metal over a condensing substrate.

6. High phosphorus polyphosphide films formed by chemical vapor deposition.

7. A protective coating comprising a high pnictide polypnictide.

8. A coating as defined in claim 7 on a glass substrate.

9. A coating as defined in claim 7 on a metal substrate.

10. A coating as defined in claim 7 wherein said pnictide is phosphorus.

11. A coating as defined in claim 7 wherein said coating is amorphous.

12. An optical coating comprising a high pnictide polypnictide.

13. A coating as defined in claim 12 on a glass substrate.

14. A coating as defined in claim 12 on a metal substrate.

15. A coating as defined in claim 12 wherein said pnictide is phosphorus.

16. A coating as defined in claim 12 wherein said coating is amorphous.

17. An antireflection coating comprising at least one layer of a high pnictide polypnictide.

18. A coating as defined in claim 17 on a glass substrate.

19. A coating as defined in claim 17 on a metal substrate.

20. A coating as defined in claim 17 wherein said pnictide is phosphorus.

21. A coating as defined in claim 17 wherein said coating is amorphous.

* * * * *